US012757580B2

(12) United States Patent
Kim et al.

(10) Patent No.: US 12,757,580 B2
(45) Date of Patent: Oct. 6, 2026

(54) DISPLAY PANEL AND MANUFACTURING METHOD OF THE SAME

(71) Applicant: Samsung Display Co., Ltd., Yongin-si (KR)

(72) Inventors: Youngrok Kim, Yongin-si (KR); Kyu-Soon Park, Yongin-si (KR); Jong-Hyun Choung, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 351 days.

(21) Appl. No.: 18/465,922

(22) Filed: Sep. 12, 2023

(65) Prior Publication Data

US 2024/0196660 A1 Jun. 13, 2024

(30) Foreign Application Priority Data

Dec. 13, 2022 (KR) ........................ 10-2022-0174087

(51) Int. Cl.

| | |
|---|---|
| ***G02F 1/1333*** | (2006.01) |
| ***H10K 59/12*** | (2023.01) |
| ***H10K 59/122*** | (2023.01) |
| ***H10K 59/80*** | (2023.01) |
| ***H10K 59/88*** | (2023.01) |
| *H10K 59/35* | (2023.01) |

(52) U.S. Cl.

CPC ....... *H10K 59/122* (2023.02); *H10K 59/1201* (2023.02); *H10K 59/80521* (2023.02); *H10K 59/88* (2023.02); *H10K 59/35* (2023.02)

(58) Field of Classification Search

CPC ............. H10K 59/122; H10K 59/1201; H10K 59/80521

See application file for complete search history.

(56) References Cited

U.S. PATENT DOCUMENTS

| | | | |
|---|---|---|---|
| 11,056,674 | B2 | 7/2021 | Choung et al. |
| 11,348,983 | B1 | 5/2022 | Choung et al. |
| 11,563,074 | B2 | 1/2023 | Cho et al. |

(Continued)

FOREIGN PATENT DOCUMENTS

| | | |
|---|---|---|
| CN | 113471384 | 10/2021 |
| EP | 4 351 299 | 4/2024 |

(Continued)

*Primary Examiner* — Nathan T Leong

(74) *Attorney, Agent, or Firm* — Innovation Counsel LLP

(57) ABSTRACT

A display panel includes a pixel defining layer including first and second light-emitting openings, a conductive partition disposed on the pixel defining layer and including first and second partition openings and respectively corresponding to the first and second light-emitting openings, a first light-emitting element disposed in the first partition opening, a second light-emitting element disposed in the second partition opening, and a conductive pattern disposed on the conductive partition. The first light-emitting element includes a first anode, a first organic layer, and a first cathode contacting the conductive partition, and the second light-emitting element includes a second anode, a second organic layer, and a second cathode contacting the conductive partition. A conductive pattern opening corresponding to the second light-emitting opening is included in the conductive pattern.

22 Claims, 44 Drawing Sheets

(56) References Cited

U.S. PATENT DOCUMENTS

| | | | | |
|---|---|---|---|---|
| 2010/0149476 | A1* | 6/2010 | Kim .................. | G02F 1/136286 349/122 |
| 2022/0077252 | A1* | 3/2022 | Choung ............... | H10K 59/173 |
| 2022/0344417 | A1 | 10/2022 | Choung et al. | |

FOREIGN PATENT DOCUMENTS

| | | |
|---|---|---|
| KR | 10-1788397 | 11/2017 |
| KR | 10-2017-0142231 | 12/2017 |
| KR | 10-2021-0086869 | 7/2021 |

* cited by examiner

DISPLAY PANEL AND MANUFACTURING METHOD OF THE SAME

CROSS-REFERENCE TO RELATED APPLICATIONS

This application claims priority to and benefits of Korean Patent Application No. 10-2022-0174087 under 35 U.S.C. § 119, filed on Dec. 13, 2022 in the Korean Intellectual Property Office, the entire contents of which are incorporated herein by reference.

BACKGROUND

1. Technical Field

The disclosure herein relates to a display panel and a method for manufacturing the same, and, to a display panel with improved process reliability and a method of manufacturing the same.

2. Description of the Related Art

A display device is activated according to an electrical signal. The display device may include a display panel to display an image. Regarding the display panel, an organic light-emitting display panel has low power consumption, a high luminance, and a high response speed.

Among display panels, the organic light-emitting display panel may include an anode, a cathode, and a light-emitting pattern. The light-emitting pattern is separated for each light-emitting region and the cathode provides a common voltage to each of light-emitting regions.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display panel including a light-emitting element which is formed without using a metal mask.

The disclosure also provides a light-emitting element with improved process reliability and a display panel including the same.

The technical objectives to be achieved by the disclosure are not limited to those described herein, and other technical objectives that are not mentioned herein would be clearly understood by a person skilled in the art from the description of the disclosure.

An embodiment provides a display panel that may include a pixel defining layer disposed above a base layer and including a first light-emitting opening and a second light-emitting opening; a conductive partition disposed on the pixel defining layer and including a first partition opening and a second partition opening and respectively corresponding to the first light-emitting opening and the second light-emitting opening; a first light-emitting element including a first anode at least partially exposed by the first light-emitting opening, a first organic layer, and a first cathode at least partially disposed in the first partition opening and contacting the conductive partition; a second light-emitting element including a second anode at least partially exposed by the second light-emitting opening, a second organic layer, and a second cathode at least partially disposed in the second partition opening and contacting the conductive partition; and a conductive pattern disposed on the conductive partition and including a conductive pattern opening and corresponding to the second light-emitting opening.

In an embodiment, the conductive pattern may surround the second light-emitting opening and have a substantially closed-line shape.

In an embodiment, the display panel may further include a first dummy pattern disposed on the conductive partition, containing a same material as the first organic layer, and including a first dummy opening and corresponding to the first light-emitting opening; and a second dummy pattern spaced apart from the first dummy pattern, containing a same material as the second organic layer, and including a second dummy opening and corresponding to the second light-emitting opening, wherein the conductive pattern may be disposed between the conductive partition and the second dummy pattern.

In an embodiment, an outer side surface of the conductive pattern may be disposed closer to a center of the second anode than an outer side surface of the second dummy pattern.

In an embodiment, the display panel may further include a first lower inorganic encapsulation pattern overlapping the first light-emitting opening in a plan view and disposed on the first light-emitting element and the first dummy pattern; and a second lower inorganic encapsulation pattern overlapping the second light-emitting opening in a plan view, spaced apart from the first lower inorganic encapsulation pattern, and disposed on the second light-emitting element and the second dummy pattern.

In an embodiment, the conductive pattern may contain a transparent conductive oxide.

In an embodiment, the display panel may further include a third light-emitting element including a third anode, a third organic layer, and a third cathode electrically contacting the conductive partition; a third light-emitting opening spaced apart from the first light-emitting opening and the second light-emitting opening and exposing at least a portion of the third anode in the pixel defining layer; a third partition opening spaced apart from the first partition opening and the second partition opening and including the third cathode in the conductive partition; and, the conductive pattern may not overlap the third light-emitting opening in a plan view and may surround only the second light-emitting opening in a plan view.

In an embodiment, the conductive partition may have a substantially undercut shape, the first cathode may electrically contact an inner side surface of the conductive partition including the first partition opening, and the second cathode may electrically contact an inner side surface of the conductive partition including the second partition opening.

In an embodiment, a method for manufacturing a display panel may include providing a preliminary display panel including a base layer, a first anode disposed above the base layer, a pixel defining layer disposed above the base layer and including a first light-emitting opening and exposing a portion of the first anode, and a conductive partition disposed on the pixel defining layer and including a first partition opening and corresponding to the first light-emitting opening; depositing a first organic material to form a first light-emitting pattern at least partially disposed in the first light-emitting opening and the first partition opening and a first dummy layer spaced apart from the first light-emitting pattern and disposed on the conductive partition; depositing a first conductive material to form a first cathode at least partially disposed in the first partition opening; forming a first mask pattern, overlapping the first light-emitting opening in a plan view and contains a second conductive material, on the conductive partition; patterning the first dummy layer by the first mask pattern to form a first dummy pattern from the first dummy layer; and depositing the second conductive material to form a first conductive layer from the first mask pattern, wherein, in the depositing of the second conductive material, the first conductive layer may cover an outer side surface of the first dummy pattern.

In an embodiment, the method may further include forming a first photoresist layer overlapping the first light-emitting opening in a plan view after the depositing of the first conductive material to form the first cathode and before the forming of the first mask pattern; and removing the first photoresist layer after the forming of the first mask pattern and before the etching of the first dummy layer, wherein the forming of the first mask pattern may be performed through etching of the first photoresist layer.

In an embodiment, the method may further include forming a preliminary first lower inorganic encapsulation layer on the first cathode and the conductive partition after the depositing of the first conductive material and before the forming of the first mask pattern; and patterning the preliminary first lower inorganic encapsulation layer by the first mask pattern to form a first lower inorganic encapsulation pattern, overlapping the first light-emitting opening in a plan view, from the preliminary first lower inorganic encapsulation layer after the forming of the first mask pattern and before the etching of the first dummy layer.

In an embodiment, after the depositing of the second conductive material to form the first conductive layer, the method may further include forming a first conductive opening in the first conductive layer; forming a second partition opening corresponding to the first conductive opening in the conductive partition; forming a second light-emitting opening corresponding to the second partition opening in the pixel defining layer; depositing a second organic material to form a second light-emitting pattern at least partially disposed in the second light-emitting opening and the second partition opening and a second dummy layer spaced apart from the second light-emitting pattern and disposed on the conductive partition; depositing the first conductive material to form a second cathode at least partially disposed in the second partition opening; forming a second mask pattern, overlapping the second light-emitting opening in a plan view and may include the second conductive material, on the conductive partition; patterning the second dummy layer by the second mask pattern to form a second dummy pattern from the second dummy layer; and depositing the second conductive material to form a second conductive layer from the first conductive layer and the second mask pattern, wherein in the providing of the preliminary display panel, the preliminary display panel may further include a second anode spaced apart from the first anode; in the forming of the first conductive opening, the first conductive opening may overlap the second anode in a plan view; and in the depositing of the second conductive material to form the second conductive layer, the second conductive layer may cover the outer side surface of the second dummy pattern.

In an embodiment, the forming of the second partition opening in the conductive partition may include etching the conductive partition by dry etching to form a preliminary second partition opening overlapping the second anode in a plan view; and etching the conductive partition by wet etching method to form the second partition opening from the preliminary second partition opening.

In an embodiment, in the providing of the preliminary display panel, a preliminary second partition opening overlapping the second anode in a plan view may be further included in the preliminary conductive partition, and in the forming of the second partition opening in the conductive partition, the conductive partition may be etched by wet etching.

In an embodiment, the second mask pattern may overlap the first conductive layer in a plan view.

In an embodiment, the second conductive layer may include a first portion disposed on the second dummy pattern; a second portion disposed between the conductive partition and the second dummy pattern; and a third portion connecting the first portion to the second portion and covering the outer side surface of the second dummy pattern.

In an embodiment, the second mask pattern may not overlap the first conductive layer in a plan view, and the second dummy pattern may be entirely contact an upper surface of the conductive partition.

In an embodiment, in the providing of the preliminary display panel, the preliminary display panel may further include a first sacrificial pattern disposed on the first anode and including a first sacrificial opening and a second sacrificial pattern disposed on the second anode, and the method may further include forming a second photoresist layer, including a first photoresist opening and overlapping the second anode in a plan view, on the first conductive layer after the depositing of the second conductive material to form the first conductive layer and before the forming of the first conductive opening in the first conductive layer; forming a second sacrificial opening corresponding to the second light-emitting opening in the second sacrificial pattern after the forming of the second light-emitting opening in the pixel defining layer and before the depositing of the second organic material; and removing the second photoresist layer after the forming of the second sacrificial opening and before the depositing of the second organic material.

In an embodiment, the method may include forming a third photoresist layer overlapping the second light-emitting opening in a plan view after the depositing of the first conductive material to form the second cathode and before the forming of the second mask pattern; and removing the third photoresist layer after the forming of the second mask pattern and before the patterning of the second dummy layer, wherein the forming of the second mask pattern may be performed through etching by the third photoresist layer.

In an embodiment, after the depositing of the second conductive material to form the second conductive layer, the method may further include forming a second conductive opening in the second conductive layer; forming a third partition opening corresponding to the second conductive opening in the conductive partition; forming a third light-emitting opening corresponding to the third partition opening in the pixel defining layer; etching the second conductive layer; depositing a third organic material to form a third light-emitting pattern at least partially disposed in the third light-emitting opening and the third partition opening and a third dummy layer spaced apart from the third light-emitting pattern and disposed on the conductive partition; depositing the first conductive material to form a third cathode at least partially disposed in the third partition opening; forming a third mask pattern, which overlaps the third light-emitting opening and may include the second conductive material, on the conductive partition; patterning the third dummy layer by the third mask pattern to form a third dummy pattern from the third dummy layer; and removing the third mask pattern, wherein, in the providing of the preliminary display panel, the preliminary display panel may further include a third anode spaced apart from the first anode and the second anode, and in the forming of the second conductive opening, the second conductive opening may overlap the third anode in a plan view.

In an embodiment, in the depositing of the second conductive material to form the second conductive layer, the second conductive layer may include a first portion disposed on the second dummy pattern; a second portion disposed between the conductive partition and the second dummy pattern; and a third portion connecting the first portion to the second portion and covering the outer side surface of the second dummy pattern, and in the etching of the second conductive layer, the second portion and the third portion may be removed, and a conductive pattern may be formed from a remaining first portion.

In an embodiment, the conductive pattern may surround the second light-emitting opening and have a substantially closed-line shape in a plan view.

In an embodiment, a portion of the conductive pattern may be removed together in the removing of the third mask pattern, the outer side surface of the conductive pattern may be disposed closer to a center of the second anode than the outer side surface of the second dummy pattern.

In an embodiment, in the etching of the second conductive layer, the second conductive layer may be entirely removed.

In an embodiment, in the providing of the preliminary display panel, the preliminary display panel may further include a third sacrificial pattern disposed on the third anode, and in the etching of the second conductive layer, a third sacrificial opening corresponding to the third light-emitting opening may be formed in the third sacrificial pattern.

In an embodiment, the method may further include forming a fourth photoresist layer including a second photoresist opening and overlapping the third anode in a plan view after the depositing of the second conductive material and before the forming of a second conductive opening in the second conductive layer; and removing the fourth photoresist layer after the forming of the third light-emitting opening in the pixel defining layer and before the etching of the second conductive layer.

In an embodiment, the method may further include forming a fifth photoresist layer overlapping the third light-emitting opening in a plan view after the depositing of the first conductive material to form the third cathode and before the forming of the third mask pattern; and removing the fifth photoresist layer after the forming of the third mask pattern and before the etching of the third dummy layer, wherein the forming of the third mask pattern may be performed through etching by the fifth photoresist layer.

In an embodiment, prior to the providing of the preliminary display panel, the method may further include forming a preliminary first partition opening in the preliminary conductive partition layer by dry-etching a preliminary conductive partition layer including sequentially stacked a first layer and a second layer; and forming the first partition opening from the preliminary first partition opening by wet-etching the first layer and the second layer to form the conductive partition from the preliminary conductive partition layer, wherein an inner side surface of the second layer defining the second region of the first partition opening may be closer to a center of the first anode than an inner side surface of the first layer defining the first region of the first partition opening.

In an embodiment, the preliminary display panel may further include a second anode disposed above the base layer, and in the forming of the preliminary first partition opening in the preliminary conductive partition layer, a preliminary second partition opening overlapping the second anode in a plan view may be formed together in the preliminary conductive partition layer.

In an embodiment, the second conductive material may include a transparent conductive oxide.

BRIEF DESCRIPTION OF THE DRAWINGS

The accompanying drawings are included to provide a further understanding, and are incorporated in and constitute a part of this specification. The drawings illustrate embodiments and, together with the description, serve to explain the principles of the disclosure. In the drawings.

DETAILED DESCRIPTION OF THE EMBODIMENTS

Figure 1A:
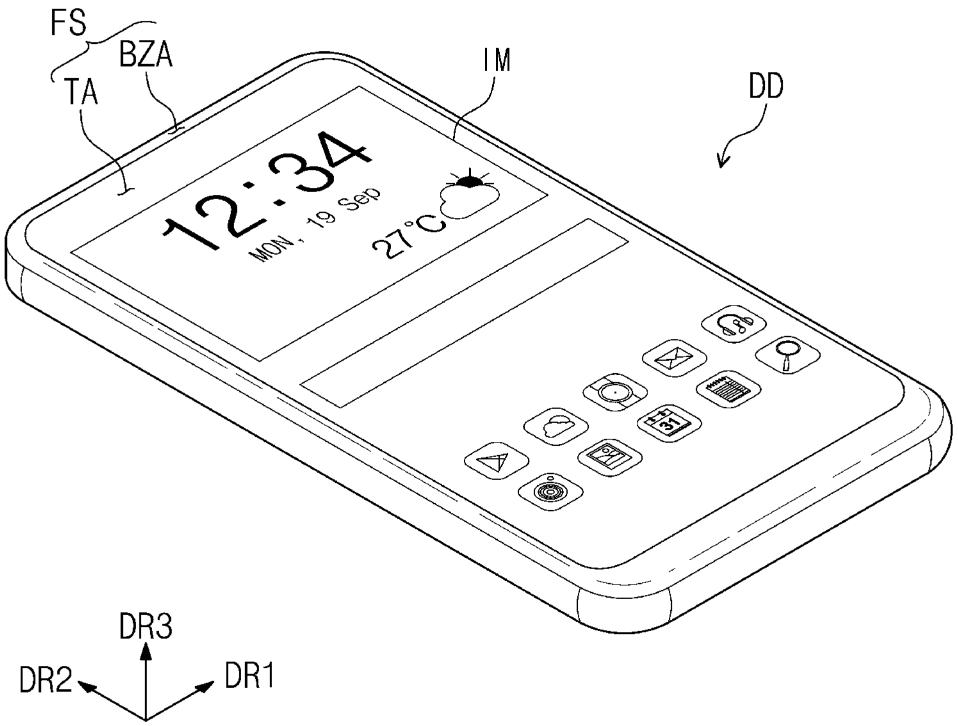
FIG. 1A is a schematic perspective view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, it will be understood that when an element (or region, layer, portion, etc.) is referred to as being "on", "connected to" or "coupled to" another element, it can be directly on, connected or coupled to the other element, or intervening elements may be present.

Like reference numerals refer to like elements throughout. In the drawings, the thicknesses, ratios, and dimensions of elements are exaggerated for effective description of the technical contents.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

As used herein, the singular forms, "a," "an," and "the" are intended to include the plural forms as well, unless the context clearly indicates otherwise.

It will be understood that, although the terms first, second, etc. may be used herein to describe various elements, these elements should not be limited by these terms. These terms are only used to distinguish one element from another element. For example, a first element could be termed a second element without departing from the scope of the disclosure. Similarly, the second element may also be referred to as the first element.

In addition, terms, such as "below", "lower", "above", "upper" and the like, are used herein for ease of description to describe one element's relation to another element(s) as illustrated in the figures. The above terms are relative concepts and are described based on the directions indicated in the drawings.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. The term "overlap" or "overlapped" means that a first object may be above or below or to a side of a second object, and vice versa.

Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

Figure 1B:
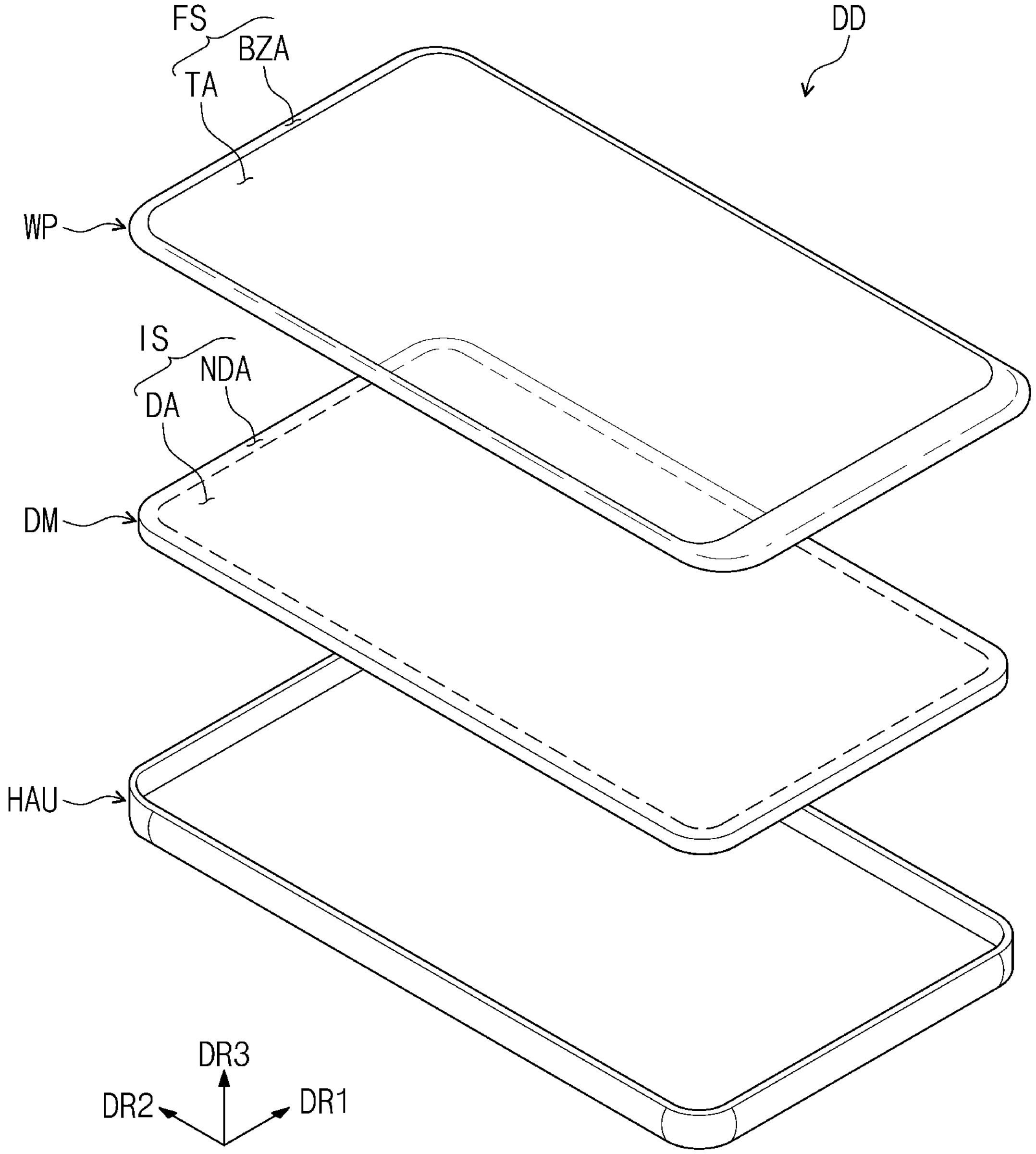
FIG. 1B is an exploded schematic perspective view of the display device according to an embodiment.
Figure 2:
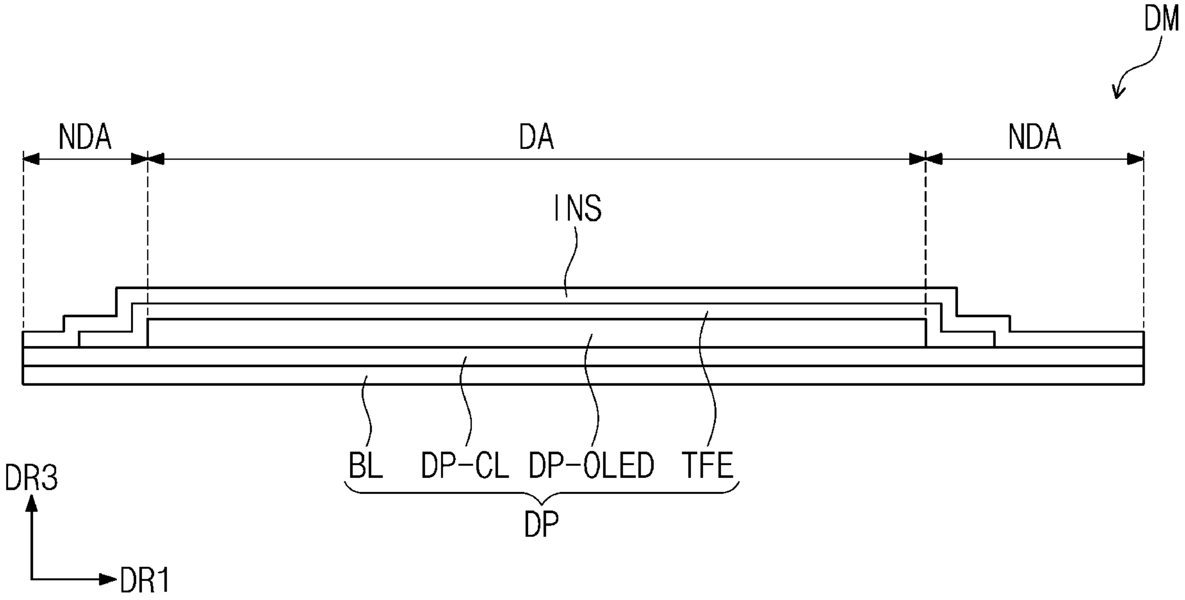
FIG. 2 is a schematic cross-sectional view of a display panel according to an embodiment.

FIG. 1A is a perspective view of a display device according to an embodiment. FIG. 1B is an exploded perspective view of the display device according to an embodiment. FIG. 2 is a schematic cross-sectional view of a display panel according to an embodiment.

In an embodiment, the display device DD may be a large electronic device such as a television, a monitor, or an external billboard. The display device DD may be a small or medium-sized electronic device such as a personal computer, a notebook computer, a personal digital terminal, a car navigation unit, a game machine, a smart phone, a tablet, or a camera. These are presented only as examples and the display device DD may be employed as other display devices within the spirit and the scope of the disclosure. In this embodiment, a smart phone is illustrated as an example of the display device DD.

Referring to FIGS. 1A, 1B, and 2, the display device DD may display an image IM toward a third direction DR3 on a display surface FS parallel to each of a first direction DR1 and a second direction DR2. The image IM may include a still image as well as a dynamic image. FIG. 1A illustrates a watch window and icons as an example of the image IM. The display surface FS on which the image IM is displayed may correspond to the front surface of the display device DD.

In this embodiment, the front surface (or upper surface) and the rear surface (or lower surface) of each member are defined based on a direction in which the image IM is displayed. The front surface and the rear surface may face each other in the third direction DR3, and a normal direction of each of the front surface and the rear surface may be parallel to the third direction DR3. Directions indicated by the first to third directions DR1, DR2, and DR3 are relative concepts and may be converted into other directions. In this specification, the expression "on a plane" may mean a state when viewed in the third direction DR3.

As illustrated in FIG. 1B, the display device DD according to this embodiment may include a window WP, a display module DM, and a housing HAU. The window WP and the housing HAU may be coupled (or connected) to each other to form the exterior of the display device DD.

The window WP may contain an optically transparent insulating material. For example, the window WP may contain glass or plastic. The front surface of the window WP may define the display surface FS of the display device DD. The display surface FS may include a transmission region TA and a bezel region BZA. The transmission region TA may be an optically transparent region. For example, the transmission region TA may have a visible light transmittance of about 90% or more.

The bezel region BZA may have a relatively low light transmittance, compared to the transmission region TA. The bezel region BZA may define the shape of the transmission region TA. The bezel region BZA may be adjacent to and surround the transmission region TA. This is illustrated as an example, and in the window WP according to an embodiment, the bezel region BZA may be omitted. The window WP may include at least any one functional layer among an anti-fingerprint layer, a hard coating layer, or an anti-reflection layer, and the disclosure is not limited to any one embodiment.

The display module DM may be disposed below the window WP. The display module DM may be a component that substantially generates an image IM. The image IM generated by the display module DM is displayed on the display surface IS of the display module DM and is visually recognized by a user from the outside through the transmission region TA.

The display module DM may include a display region DA and a non-display region NDA. The display region DA may be activated according to an electrical signal. The non-display region NDA is adjacent to the display region DA. The non-display region NDA may surround the display region DA. The non-display region NDA may be covered by the bezel region BZA and may not be visible from the outside.

As illustrated in FIG. 2, the display module DM according to this embodiment may include a display panel DP and an input sensor INS. Although not separately illustrated, the display device DD according to an embodiment may further include a protective member disposed on the lower surface of the display panel DP or an anti-reflection member and/or a window member disposed on the upper surface of the input sensor INS.

The display panel DP may be a light-emitting display panel and is not particularly limited thereto. For example, the display panel DP may be an organic light-emitting display panel or an inorganic light-emitting display panel. A light-emitting layer in the organic light-emitting display panel contains an organic light-emitting material. A light-emitting layer in the inorganic light-emitting display panel contains quantum dots, quantum rods, or micro LEDs. Hereinafter, the display panel DP will be described as an organic light-emitting display panel.

The display panel DP may include a base layer BL, a circuit element layer DP-CL disposed on the base layer BL, a display element layer DP-OLED, and a thin film encapsulation layer TFE. The input sensor INS may be disposed directly on the thin film encapsulation layer TFE. In this specification, the expression “component A is disposed directly on component B” means that no adhesive layer is disposed between component A and component B.

The base layer BL may include at least one plastic film. The base layer BL may be a flexible substrate and include a plastic substrate, a glass substrate, a metal substrate, or an organic/inorganic composite material substrate. In this specification, it may be considered that the display region DA and the non-display region NDA are defined in the base layer BL. It may be considered that components disposed on the base layer BL are disposed to overlap the display region DA or the non-display region NDA.

The circuit element layer DP-CL may include at least one insulating layer and a circuit element. The insulating layer may include at least one inorganic layer and at least one organic layer. The circuit element may include signal lines, a pixel driving circuit, and the like within the spirit and the scope of the disclosure.

The display element layer DP-OLED may include a conductive partition and a light-emitting element. The light-emitting element may include an anode, a light-emitting pattern, and a cathode, and the light-emitting pattern may include at least a light-emitting layer.

The thin film encapsulation layer TFE may include thin films. Some or a number of thin films are disposed to improve optical efficiency, and some or a number of thin films are disposed to protect organic light-emitting diodes.

The input sensor INS acquires the coordinate information of an external input. The input sensor INS may have a multi-layered structure. The input sensor INS may include a single-layered or multi-layered conductive layer. The input sensor INS may include a single-layered or multi-layered insulating layer. The input sensor INS may sense an external input, for example, in a capacitive manner. In the disclosure, the operation manner of the input sensor INS is not particularly limited, and in an embodiment, the input sensor INS may sense an external input in an electromagnetic induction manner or a pressure-sensing manner. In an embodiment, the input sensor INS may be omitted.

As illustrated in FIG. 1B, the housing HAU may be coupled (or connected) to the window WP. The housing HAU may be coupled (or connected) to the window WP to provide a selectable internal space. The display module DM may be accommodated in the internal space.

The housing HAU may contain a material having relatively high rigidity. For example, the housing HAU may include frames and/or plates composed of glass, plastic, or metal, or a combination thereof. The housing HAU may stably protect the components of the display device DD, which are accommodated in the internal space, from an external impact.

Figure 3:
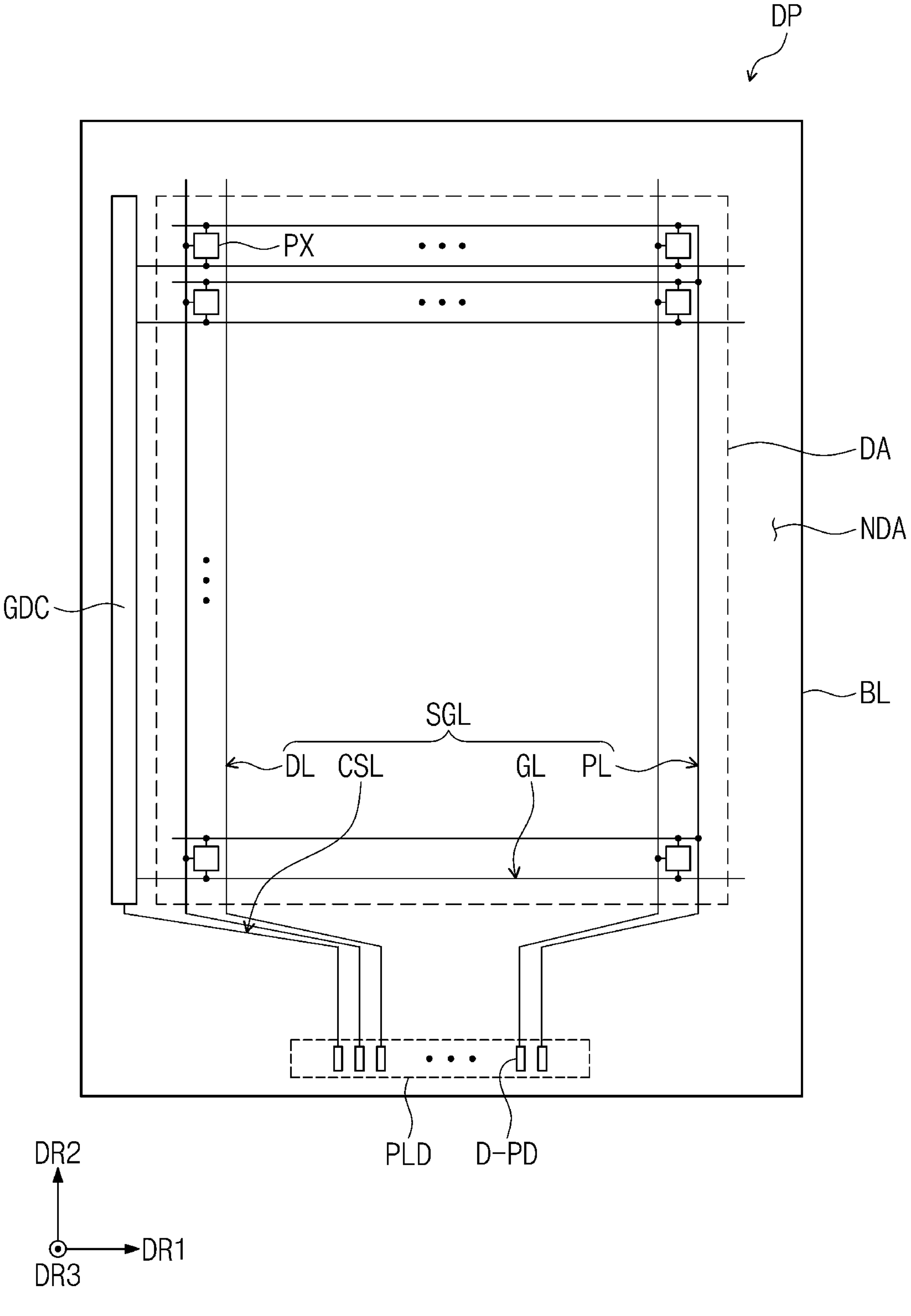
FIG. 3 is a schematic plan view of the display panel according to an embodiment.

FIG. 3 is a schematic plan view of the display panel according to an embodiment.

Referring to FIG. 3, the display panel DP may include a base layer BL divided into a display region DA and a non-display region NDA which are described with reference to FIG. 2.

The display panel DP may include pixels PX disposed in the display region DA and signal lines SGL electrically connected to the pixels PX. The display panel DP may include a driving circuit GDC and a pad portion PLD disposed in the non-display region NDA.

The pixels PX may be arranged (or disposed) in the first and second directions DR1 and DR2. The pixels PX may include pixel rows extending in the first direction DR1 and arranged in the second direction DR2 and pixel columns extending in the second direction DR2 and arranged in the first direction DR1.

The signal lines SGL may include gate lines GL, data lines DL, a power line PL, and a control signal line CSL. Each of the gate lines GL may be connected to a corresponding pixel of the pixels PX, and each of the data lines DL may be connected to a corresponding pixel of the pixels PX. The power line PL may be electrically connected to the pixels PX. The control signal line CSL may be connected to the driving circuit GDC to provide control signals thereto.

The driving circuit GDC may include a gate driving circuit. The gate driving circuit may generate gate signals and sequentially output the generated gate signals to the gate lines GL. The gate driving circuit may further output another control signal to the pixel driving circuit.

The pad portion PLD may be a portion to which a flexible circuit board is connected. The pad portion PLD may include pixel pads D-PD, and the pixel pads D-PD may be pads for connecting the flexible circuit board to the display panel DP. Each of the pixel pads D-PD may be connected to a corresponding signal line among the signal lines SGL. The pixel pads D-PD may be connected to corresponding pixels PX through the signal lines SGL. Any one of the pixel pads D-PD may be connected to the driving circuit GDC.

The pad portion PLD may further include input pads. The input pads may be pads for connecting the flexible circuit board to the input sensor INS (see FIG. 2). Without being limited thereto, however, the input pads may be disposed in the input sensor INS (see FIG. 2) and connected to the pixel pads D-PD and a separate circuit board. By way of example, the input sensor INS (see FIG. 2) may be omitted and may not further include the input pads.

Figure 4:
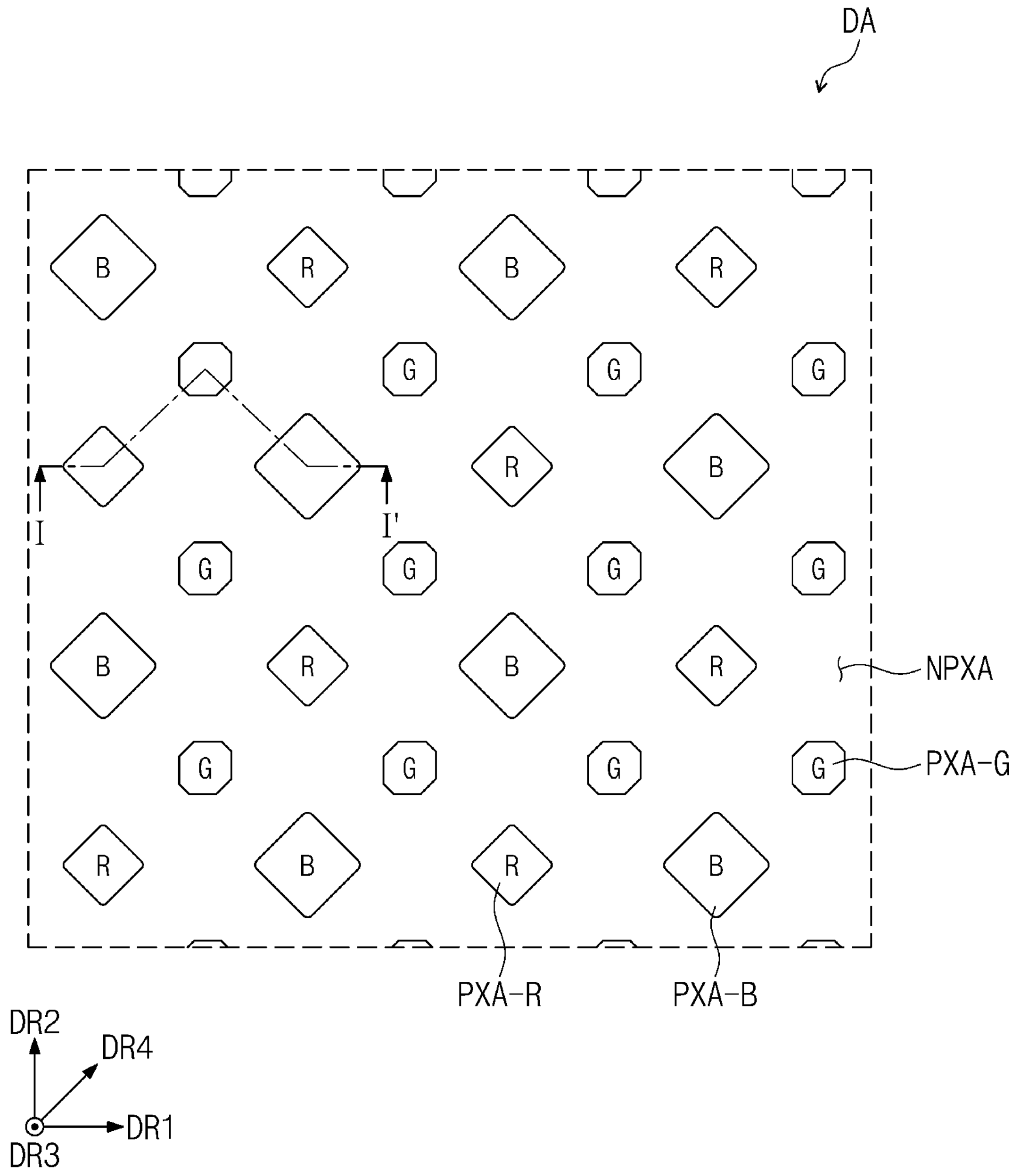
FIG. 4 is an enlarged schematic plan view of a portion of a display region of the display panel according to an embodiment.

FIG. 4 is an enlarged schematic plan view of a portion of a display region of the display panel according to an embodiment. FIG. 4 illustrates a plane of the display module DM (see FIG. 2) viewed from the display surface IS (see FIG. 2) of the display module DM (see FIG. 2), and an arrangement of light-emitting regions PXA-R, PXA-G, and PXA-B.

Referring to FIG. 4, the display region DA may include first to third light-emitting regions PXA-R, PXA-G and PXA-B and a peripheral region NPXA surrounding the first to third light-emitting regions PXA-R and PXA-G, and PXA-B. The first to third light-emitting regions PXA-R, PXA-G, and PXA-B may respectively correspond to regions from which light provided from light-emitting elements ED1, ED2, and ED3 (see FIG. 5B) is emitted. The first to third light-emitting regions PXA-R, PXA-G, and PXA-B may be classified according to the color of light emitted toward the outside of the display module DM (see FIG. 2).

The first to third light-emitting regions PXA-R, PXA-G, and PXA-B may respectively provide first to third color lights having different colors. For example, the first color light may be red light (R), the second color light may be green light (G), and the third color light may be blue light (B). However, the first to third color lights are not necessarily limited to the above examples.

Each of the first to third light-emitting regions PXA-R, PXA-G, and PXA-B may be defined as a region in which an upper surface of the anode is exposed by a light-emitting opening to be described later. The peripheral region NPXA may determine boundaries between the first to third light-emitting regions PXA-R, PXA-G, and PXA-B, and prevent color-mixing between the first to third light-emitting regions PXA-R, PXA-G, and PXA-B.

Each of the first to third light-emitting regions PXA-R, PXA-G, and PXA-B may be provided in plurality and the plurality thereof may be repeatedly arranged in a selectable arrangement form in the display region DA. For example, the first and third light-emitting regions PXA-R and PXA-B may be alternately arranged along the first direction DR1 to form a 'first group'. The second light-emitting regions PXA-G may be arranged along the first direction DR1 to form a 'second group'. Each of the 'first group' and the 'second group' may be provided in plurality, and the 'first groups' and the 'second groups' may be alternately arranged along the second direction DR2.

One second light-emitting region PXA-G may be disposed to be spaced apart from one first light-emitting region PXA-R or one third light-emitting region PXA-B in a fourth direction DR4. The fourth direction DR4 may be defined as a direction between the first and second directions DR1 and DR2.

FIG. 4 illustrates an arrangement of the first to third light-emitting regions PXA-R, PXA-G, and PXA-B, but the embodiment is not limited thereto, and the first to third light-emitting regions PXA-R, PXA-G, and PXA-B may be arranged in various forms. In an embodiment, the first to third light-emitting regions PXA-R, PXA-G, and PXA-B may have a PENTILE™ arrangement form as illustrated in FIG. 4. By way of example, the first to third light-emitting regions PXA-R, PXA-G, and PXA-B may have a stripe arrangement form or a Diamond Pixel™ arrangement form.

The first to third light-emitting regions PXA-R, PXA-G, and PXA-B may have various shapes on a plane. For example, the first to third light-emitting regions PXA-R, PXA-G, and PXA-B may have a polygonal shape, a circular shape, or an elliptical shape. FIG. 4 illustrates, on a plane, the first and third light-emitting regions PXA-R and PXA-B having a quadrangular shape (or a diamond shape) and the second light-emitting region PXA-G having an octagonal shape.

On a plane, the first to third light-emitting regions PXA-R, PXA-G, and PXA-B may have the same shape as each other, or at least some or a number of them may have different shapes. FIG. 4 illustrates, on a plane, the first and third light-emitting regions PXA-R and PXA-B having the same shape as each other and the second light-emitting region PXA-G having a shape different from those of the first and third light-emitting regions PXA-R and PXA-B.

At least some or a number of the first to third light-emitting regions PXA-R, PXA-G, and PXA-B may have areas different from each other on a plane. In an embodiment, the area of the first light-emitting region PXA-R that emits red light may be larger than the area of the second light-emitting region PXA-G that emits green light and smaller than the area of the third light-emitting region PXA-B that emits blue light. However, the size relationship between the areas of the first to third light-emitting regions PXA-R, PXA-G, and PXA-B according to the color of emitted light is not limited thereto and may vary depending on the design of the display module DM (see FIG. 2). The embodiment is not limited thereto, and the first to third light-emitting regions PXA-R, PXA-G, and PXA-B may have the same area as each other on a plane.

The shape, area, and arrangement of the first to third light-emitting regions PXA-R, PXA-G, and PXA-B of the display module DM (see FIG. 2) according to the disclosure may be designed in various ways according to the color of emitted light or the size and configuration of the display module DM (see FIG. 2) and are not limited to the embodiment illustrated in FIG. 4.

Figure 5:
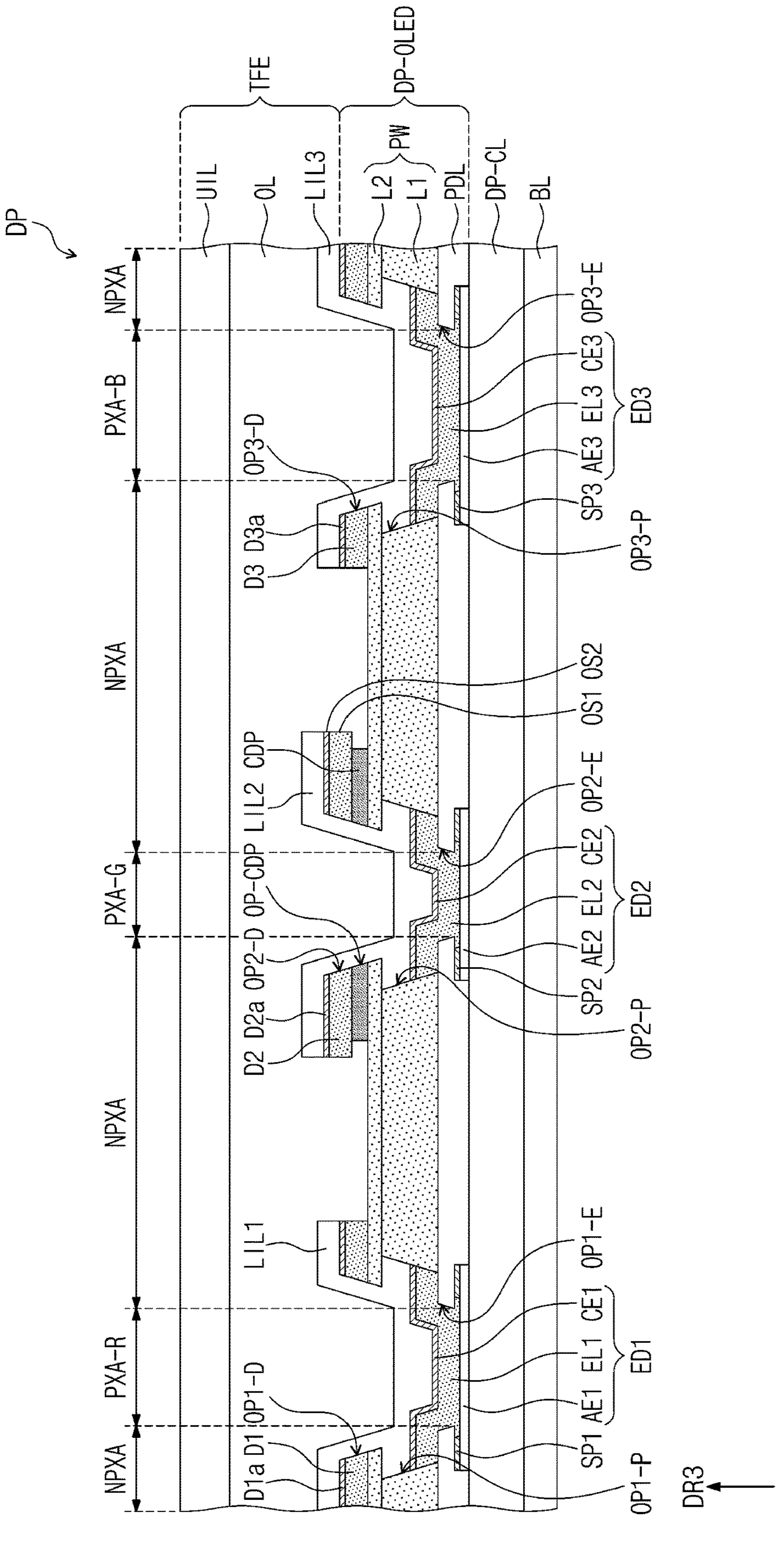
FIG. 5 is a schematic cross-sectional view of the display panel according to an embodiment, which is taken along line I-I' of FIG. 4.
Figure 6:
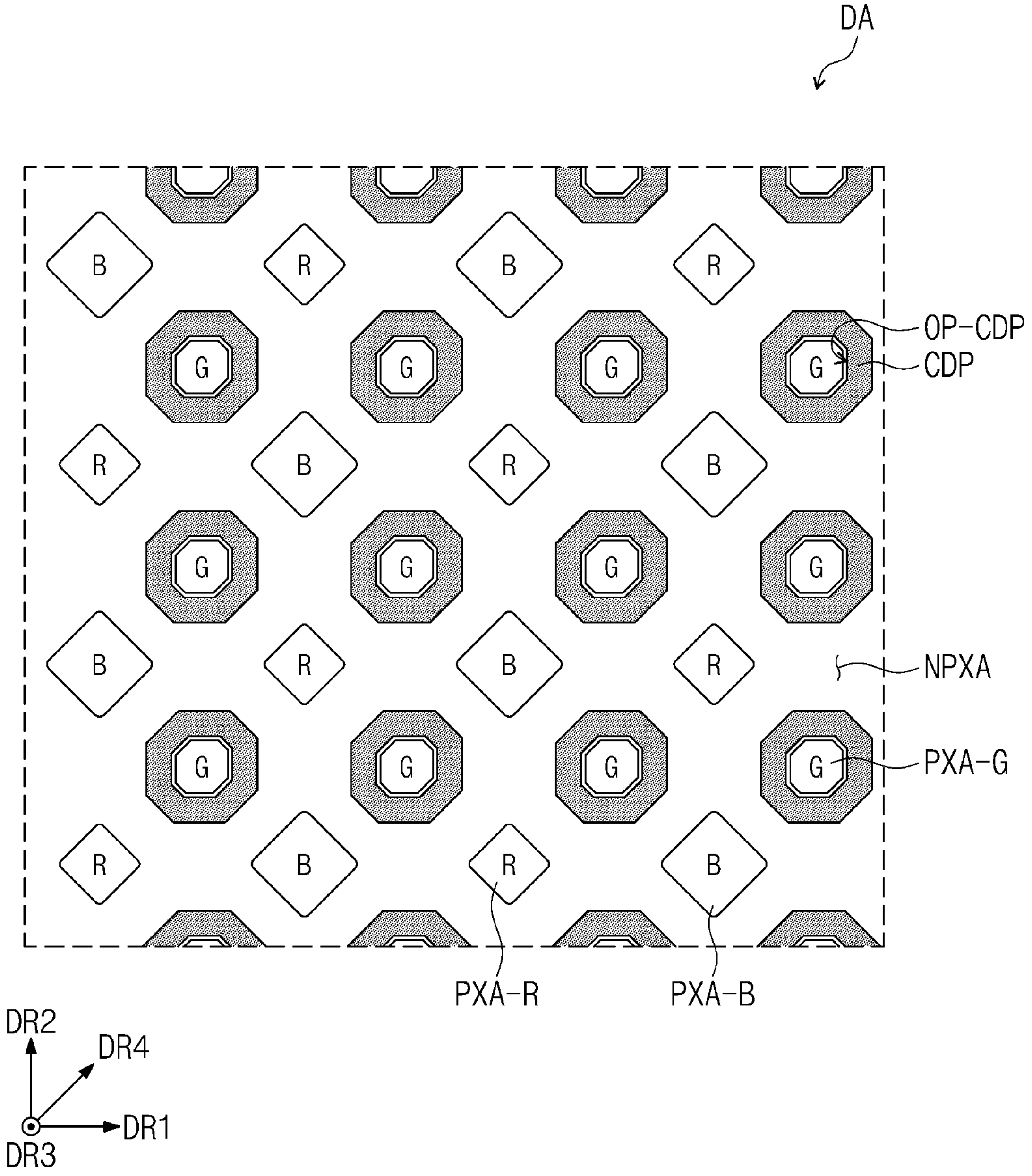
FIG. 6 is an enlarged schematic plan view of a configuration of the display panel according to an embodiment.

FIG. 5 is a schematic cross-sectional view of the display panel according to an embodiment taken along line I-I' of FIG. 4. FIG. 6 is an enlarged schematic plan view of a configuration of the display panel according to an embodiment.

Referring to FIGS. 5 and 6, the display panel DP according to this embodiment may include a base layer BL, a circuit element layer DP-CL, a display element layer DP-OLED, and a thin film encapsulation layer TFE.

The display panel DP may include insulating layers, semiconductor patterns, conductive patterns, signal lines, and the like within the spirit and the scope of the disclosure. An insulating layer, a semiconductor layer, and a conductive layer are formed by coating, deposition, or the like within the spirit and the scope of the disclosure. Hereafter, the insulating layer, the semiconductor layer, and the conductive layer may be selectively patterned by photolithography and etching processes. In this way, the semiconductor patterns, the conductive patterns, the signal lines, and the like included in the circuit element layer DP-CL and the display element layer DP-OLED are formed.

The circuit element layer DP-CL is illustrated as a single layer, but this is for example, and the circuit element layer DP-CL may include an insulating layer, a semiconductor pattern, a conductive pattern, and the like for forming various elements.

The pixel driving circuit in the circuit element layer DP-CL may be provided in plurality, and the pixel driving circuits may be respectively connected to and independently control the light-emitting elements ED1, ED2, and ED3. Each of the pixel driving circuits may include transistors to drive the connected light-emitting elements, at least one capacitor, and signal lines to connect them.

The display element layer DP-OLED may be disposed on the circuit element layer DP-CL. According to this embodiment, the display element layer DP-OLED may include light-emitting elements ED1, ED2, and ED3, a pixel defining layer PDL, a conductive partition PW, dummy patterns D1, D2, and D3, additional dummy patterns D1*a*, D2*a*, and D3*a*, and a conductive pattern CDP.

The light-emitting elements ED1, ED2, and ED3 include a first light-emitting element ED1, a second light-emitting element ED2, and a third light-emitting element ED3, and each of the first to third light-emitting elements ED1 ED2 and ED3 may include an anode (or first electrode), a cathode (or second electrode), and a light-emitting pattern disposed between the anode and the cathode. The first light-emitting element ED1 may include a first anode AE1, a first cathode CE1, and a first light-emitting pattern EL1, the second light-emitting element ED2 may include a second anode AE2, a second cathode CE2, and a second light-emitting pattern EL2, and the third light-emitting element ED3 may include a third anode AE3, a third cathode CE3, and a third light-emitting pattern EL3.

The first to third anodes AE1, AE2, and AE3 (or 1-1st, 1-2nd, and 1-3th electrodes) may be provided in patterns. The first to third anodes AE1, AE2, and AE3 may have conductivity. For example, each of the anodes AE1, AE2, and AE3 may be formed of various materials, such as a metal, a transparent conductive oxide (TCO), or a conductive polymer material, as long as they have conductivity. For example, the metal may include gold (Au), silver (Ag), aluminum (Al), magnesium (Mg), lithium (Li), molybdenum (Mo), copper (Cu), or an alloy. The transparent conductive oxide may include an indium tin oxide (ITO), an indium zinc oxide (IZO), a zinc oxide, an indium oxide, an indium gallium oxide, or an aluminum zinc oxide.

Each of the first to third anodes AE1, AE2, and AE3 is illustrated as a single layer, but this is an example, and each of the first to third anodes AE1, AE2, and AE3 may have a multi-layered structure. Any one of the first to third anodes AE1, AE2, and AE3 may have a single-layered structure, and one of them may have a multi-layered structure, and the disclosure is not limited to any one embodiment.

The first to third light-emitting patterns EL1, EL2, and EL3 may be respectively disposed on the first to third anodes AE1, AE2, and AE3. The first to third light-emitting patterns EL1, EL2, and EL3 may be patterned by a tip portion defined in the conductive partition PW, which will be described later.

In an embodiment, the first light-emitting pattern EL1 may provide red light, the second light-emitting pattern EL2 may provide green light, and the third light-emitting pattern EL3 may provide blue light.

Each of the first to third light-emitting patterns EL1, EL2, and EL3 may include a light-emitting layer containing a light-emitting material. Each of the first to third light-emitting patterns EL1, EL2, and EL3 may further include a hole injection layer (HIL) and a hole transport layer (HTL) which are disposed between a corresponding anode among the first to third anodes AE1, AE2, and AE3 and the light-emitting layer and may further include an electron transport layer (ETL) and an electron injection layer (EIL) which are disposed on the light-emitting layer. The first to third light-emitting patterns EL1, EL2, and EL3 may be respectively referred to as 'first to third organic layers' or 'first to third intermediate layers'.

The first to third cathodes CE1, CE2, CE3 (or 2-1st, 2-2nd, and 2-3rd electrodes) may be disposed on a corresponding light-emitting pattern among the first to third light-emitting patterns EL1, EL2, and EL3. The first to third cathodes CE1, CE2, and CE3 may have conductivity. For example, each of the cathodes CE1, CE2, and CE3 may be formed of various materials, such as a metal, a transparent conductive oxide (TCO), or a conductive polymer material, as long as they have conductivity. The first to third cathodes CE1, CE2, and CE3 may be patterned by a tip portion defined in the conductive partition PW, which will be described later.

The pixel defining layer PDL may be disposed on an insulating layer disposed on the uppermost side of the circuit element layer DP-CL. First to third light-emitting openings OP1-E, OP2-E, and OP3-E may be defined in the pixel defining layer PDL. The first to third light-emitting openings OP1-E, OP2-E, and OP3-E may respectively overlap the first to third anodes AE1, AE2, and AE3. The pixel defining layer PDL may expose at least a portion of each of the anodes AE1, AE2, and AE3 through the light-emitting openings OP1-E, OP2-E, and OP3-E.

The first light-emitting region PXA-R is defined as a region of the upper surface of the first anode AE1 exposed by the first light-emitting opening OP1-E, the second light-emitting region PXA-G is defined as a region of the upper surface of the second anode AE2 exposed by the second light-emitting opening OP2-E, and the third light-emitting region PXA-B is defined as a region of the upper surface of the third anode AE3 exposed by the third light-emitting opening OP3-E.

The pixel defining layer PDL may be an inorganic insulating film. For example, the pixel defining layer PDL may contain a silicon oxide, a silicon nitride, or a combination thereof. For example, the pixel defining layer PDL may have a two-layer structure in which a silicon oxide layer and a silicon nitride layer may be sequentially stacked each other. However, this is described as an example, and as long as the pixel defining layer PDL can be an inorganic insulating layer, the material and structure of the pixel defining layer PDL, whether it is single-layered or multi-layered, may be variously changed, and the disclosure is not limited to any one embodiment.

According to an embodiment, the display panel DP may further include first to third sacrificial patterns SP1, SP2, and SP3. The first to third sacrificial patterns SP1, SP2, and SP3 may be respectively disposed on the upper surfaces of the first to third anodes AE1, AE2, and AE3. The sacrificial patterns SP1, SP2, and SP3 may be covered by the pixel defining layer PDL. Each of the sacrificial patterns SP1, SP2, and SP3 exposes at least a portion of a corresponding anode AE1, AE2, or AE3. The sacrificial patterns SP1, SP2, and SP3 may be respectively disposed at positions that do not overlap the light-emitting openings OP1-E, OP2-E, and OP3-E.

In case that the display panel DP further may include the sacrificial patterns SP1, SP2, and SP3, the upper surfaces of the anodes AE1, AE2, and AE3 may be spaced apart from the pixel defining layer PDL on a cross section with the corresponding sacrificial patterns SP1, SP2, and SP3 interposed therebetween. Accordingly, it is possible to protect the anodes AE1, AE2, and AE3 from being damaged in the process of forming the light-emitting openings OP1-E, OP2-E and OP3-E.

In an embodiment, sacrificial openings OP1-S, OP2-S, OP3-S respectively corresponding to the light-emitting openings OP1-E, OP2-E, and OP3-E may be defined in the sacrificial patterns SP1, SP2, and SP3. Each of the sacrificial openings OP1-S, OP2-S, and OP3-S may have a larger area than a corresponding light-emitting opening OP1-E, OP2-E, or OP3-E. Without being limited thereto, however, the inner side surfaces of the sacrificial patterns SP1, SP2, and SP3 defining the sacrificial openings OP1-S, OP2-S, and OP3-S may be substantially aligned with the inner side surface of the pixel defining layer PDL defining the corresponding light-emitting openings OP1-E, OP2-E, and OP3-E. Each of the light-emitting regions PXA-R, PXA-G, and PXA-B may be considered to be a region of an anode AE1, AE2, or AE3 exposed from a corresponding sacrificial opening OP1-S, OP2-S, or OP3-S.

The conductive partition PW is disposed on the pixel defining layer PDL. First to third partition openings OP1-P, OP2-P, and OP3-P may be defined in the conductive partition PW. The first to third partition openings OP1-P, OP2-P, and OP3-P may respectively correspond to the first to third light-emitting openings OP1-E, OP2-E, and OP3-E. Each of the partition openings OP1-P, OP2-P, and OP3-P may expose at least a portion of a corresponding anode AE1, AE2, or AE3.

The conductive partition PW may have an undercut shape on a cross section. Each of the side surfaces defining the partition openings OP1-P, OP2-P, and OP3-P of the conductive partition PW may have an undercut shape on a cross section. The conductive partition PW may include layers sequentially stacked each other, and at least one layer of the layers may be recessed compared to adjacent stacked layers. Accordingly, the conductive partition PW may include a tip portion.

The light-emitting patterns EL1, EL2, and EL3 may be separated by the tip portion of the conductive partition PW, and each thereof may be formed in each of the light-emitting openings OP1-E, OP2-E, and OP3-E and the partition openings OP1-P and OP2-P, and OP3-P. For example, at least a portion of the first light-emitting pattern EL1 may be disposed in the first light-emitting opening OP1-E and the first partition opening OP1-P, at least a portion of the second light-emitting pattern EL2 may be disposed in the second light-emitting opening OP2-E and the second partition opening OP2-P, and at least a portion of the third light-emitting pattern EL3 may be disposed in the third light-emitting opening OP3-E and the third partition opening OP3-P. In an embodiment including the first to third sacrificial patterns SP1, SP2, and SP3, portions of the first to third light-emitting patterns EL1, EL2, and EL3 may be respectively disposed in the first to third sacrificial openings OP1-S, OP2-S, and OP3-S.

The cathodes CE1, CE2, and CE3 may be separated by the tip portion of the conductive partition PW and formed in the partition openings OP1-P, OP2-P, and OP3-P. For example, at least a portion of the first cathode CE1 may be disposed in the first partition opening OP1-P, at least a portion of the second cathode CE2 may be disposed in the second partition opening OP2-P, and at least a portion of the third cathode CE3 may be disposed in the third partition opening OP3-P. In an embodiment, according to the thickness of the first to third light-emitting patterns EL1, EL2, and EL3 or the thickness of the pixel defining layer PDL, portions of the first to third cathodes CE1, CE2, and CE3 may be respectively disposed in the first to third light-emitting openings OP1-E, OP2-E, and OP3-E.

According to this embodiment, the conductive partition PW may include a first layer L1 and a second layer L2 disposed on the first layer L1. The first layer L1 may be disposed on the pixel defining layer PDL. The first layer L1 may be relatively recessed compared to the second layer L2 with respect to the light-emitting regions PXA. For example, the first layer L1 may be formed by undercutting the second layer L2.

Figure 7A:
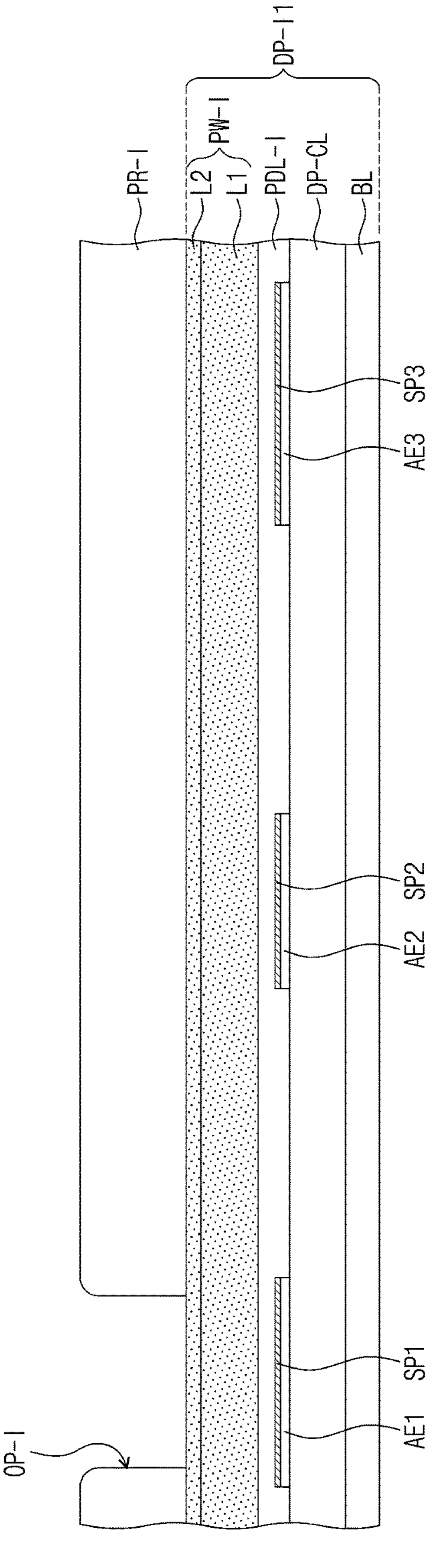
FIGS. 7A to 7J are schematic cross-sectional views illustrating steps of a method of manufacturing a display panel according to an embodiment.
Figure 7B:
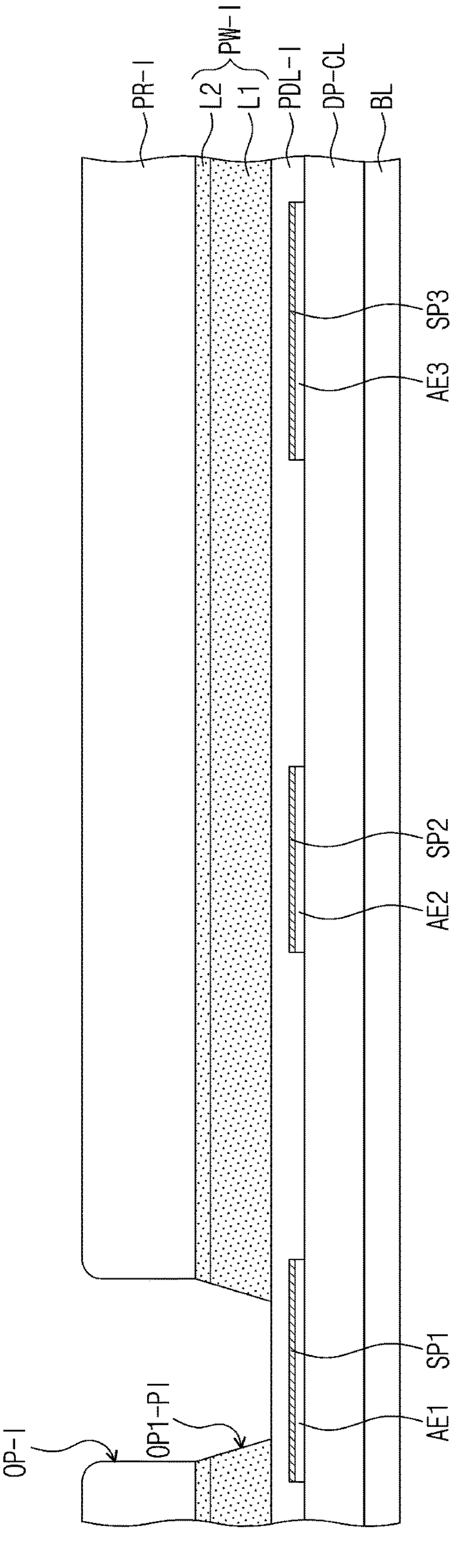
Figure 7C:
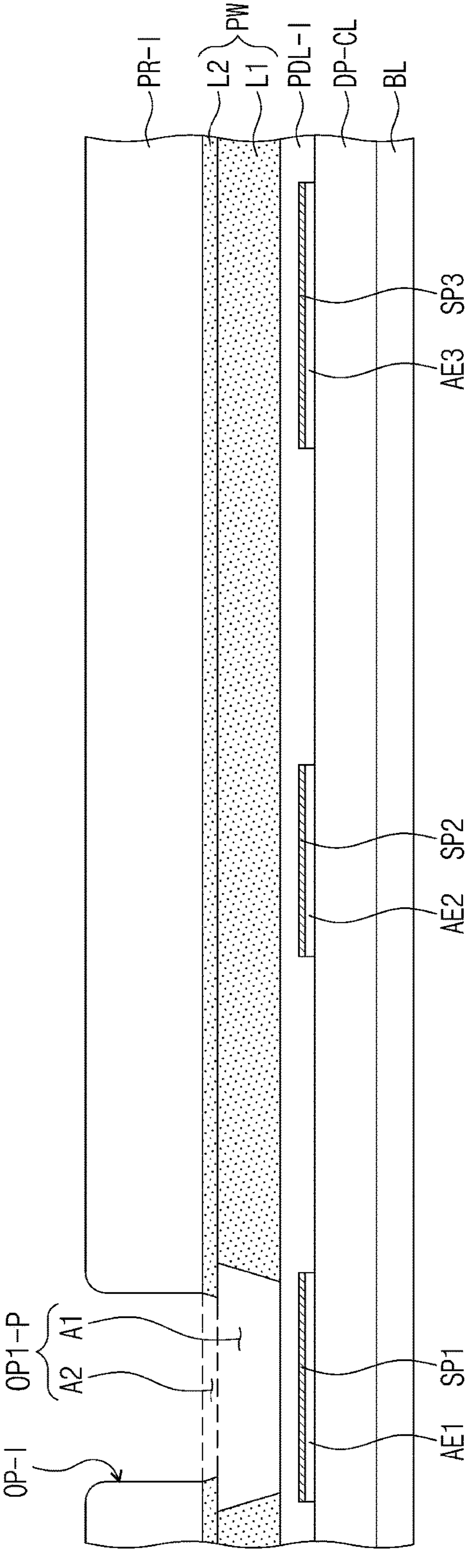

In this embodiment, each of the partition openings OP1-P, OP2-P, and OP3-P defined in the conductive partition PW may include a first region A1 (see FIG. 7C) and a second region A2 (see FIG. 7C). The first layer L1 may include inner side surfaces defining the first region A1 (see FIG. 7C) of each of the partition openings OP1-P, OP2-P, and OP3-P, and the second layer L2 may include inner side surfaces defining the second region A2 (see FIG. 7C) of each of the partition openings OP1-P, OP2-P, and OP3-P.

Each of the inner side surfaces of the first layer L1 may be recessed relatively more inward than the inner side surface of the second layer L2 with respect to a corresponding light-emitting region PXA-R, PXA-G, or PXA-B. For example, the inner side surface of the first layer L1 may be formed by undercutting the inner side surface of the second layer L2. A portion of the second layer L2 protruding from the first layer L1 toward each of the light-emitting regions PXA-R, PXA-G, and PXA-B may define a tip portion.

In an embodiment, the first layer L1 may contain a conductive material. The conductive material may include a metal, a transparent conductive oxide (TCO), or a combination thereof. For example, the metal may include gold (Au), silver (Ag), aluminum (Al), magnesium (Mg), lithium (Li), molybdenum (Mo), titanium (Ti), copper (Cu), or an alloy. The transparent conductive oxide may include an indium tin oxide (ITO), an indium zinc oxide (IZO), a zinc oxide, an indium oxide, an indium gallium oxide, an indium Gallium zinc oxide (IGZO), or an aluminum zinc oxide.

In an embodiment, the second layer L2 may include a metal or non-metal. For example, the metal may include gold (Au), silver (Ag), aluminum (Al), magnesium (Mg), lithium (Li), molybdenum (Mo), titanium (Ti), copper (Cu), or an alloy. The non-metal may include silicon (Si), a silicon oxide ($SiO_x$), a silicon nitride ($SiN_x$), a silicon oxynitride (SiON), a metal oxide, a metal nitride, or a combination thereof, wherein the metal oxide may include a transparent conductive oxide (TCO).

According to an embodiment, the conductive partition PW may include layers disposed below the first layer L1, above the second layer L2, or between the first layer L1 and the second layer L2. The additionally disposed layers may contain at least one of a conductive material or an inorganic material.

The conductive partition PW may receive a bias voltage. As the cathodes CE1, CE2, and CE3 are in direct contact with the conductive partition PW, they may be electrically connected to each other and receive the bias voltage from the conductive partition PW.

In this embodiment, the first layer L1 may have a relatively greater thickness than the second layer L2. The first layer L1 may be in direct contact with the first to third cathodes CE, CE2, and CE3. As the first to third cathodes CE, CE2, and CE3 are physically separated by the second layer L2 forming a tip portion, formed in the respective light-emitting openings OP1-E, OP2-E, and OP3-E, and in contact with the first layer L1, they may be electrically connected to each other and receive a common voltage. Since the first layer L1 has a relatively higher electrical conductivity and a larger thickness than the second layer L2, the contact resistance of the first to third cathodes CE1, CE2, and CE3 may be reduced. Accordingly, a common cathode voltage may be uniformly provided to the light-emitting regions PXA-R, PXA-G, and PXA-B.

According to the disclosure, first light-emitting patterns EL1 may be patterned and deposited in pixel units by tip portions defined in the conductive partition PW. For example, the first light-emitting patterns EL1 are commonly formed by using an open mask, but may be readily divided into the pixel units by the conductive partitions PW.

On the other hand, in case that the first light-emitting patterns are patterned by using a fine metal mask (FMM), a support spacer protruding from the conductive partition should be provided to support the fine metal mask. Since the fine metal mask is spaced apart from a base surface, on which patterning is performed, by the height of the partition and the spacer, there may be limitation in implementing high resolution. As the fine metal mask is in contact with the spacer, foreign substances may remain on the spacer after a patterning process of the first light-emitting patterns EL1, or the spacer may be damaged by being stabbed by the fine metal mask. Accordingly, a defective display panel may be formed. The description thereabout may be identically applied to the case of making the second emission patterns EP2 subject to patterning and the case of making the third emission patterns EP3 subject to patterning.

According to this embodiment, since the display panel may include the conductive partition PW, physical separation between the light-emitting elements ED1, ED2, and ED3 may be readily achieved. Accordingly, it is possible not only to prevent a current leakage or a driving error between adjacent light-emitting regions PXA-R, PXA-G, and PXA-B, but also to drive each of the light-emitting elements ED1, ED2, and ED3 independently.

By way of example, by patterning the first light-emitting patterns EL1 without a mask in contact with an internal component in the display region DA (see FIG. 2), a defect rate may be reduced, thus making it possible to provide the display panel DP having improved process reliability. The description thereabout may be identically applied to the case of making the second emission patterns EP2 subject to patterning and the case of making the third emission patterns EP3 subject to patterning. Since patterning is possible even in case that a separate support spacer protruding from the conductive partition PW is not provided, the areas of the light-emitting regions PXA-R, PXA-G, and PXA-B may be minimized and therefore, it is possible to provide the display panel DP capable of readily achieving high resolution.

In manufacturing the display panel DP having a large area, a process cost may be reduced by omitting the manufacture of a mask having a large area, and by not being affected by a defect occurring in the large-area mask, the display panel DP having improved process reliability may be provided.

Although FIG. 5 illustrates that the light-emitting patterns EL1, EL2, and EL3 are also in direct contact with the second layer L2, they may not be in contact with the second layer L2.

According to an embodiment, the display panel DP may further include capping patterns. The capping patterns may be respectively disposed in the partition openings OP1-P, OP2-P, and OP3-P and disposed on the cathodes CE1, CE2, and CE3. The capping patterns may be patterned by a tip portion formed in the conductive partition PW.

Dummy patterns D1, D2, and D3 may be disposed on the conductive partition PW. The dummy patterns D1, D2, and D3 may include a first dummy pattern D1, a second dummy pattern D2, and a third dummy pattern D3.

Each of the dummy patterns D1, D2, and D3 may contain an organic material. For example, the first to third dummy patterns D1, D2, and D3 may contain the same material as the first to third light-emitting patterns EL1, EL2, and EL3, respectively. One dummy pattern may be formed simultaneously with a corresponding light-emitting pattern through one process and may be formed separately from the corresponding light-emitting pattern by the undercut shape of the conductive partition PW.

First to third dummy openings OP1-D, OP2-D, and OP3-D may be defined in the first to third dummy patterns D1, D2, and D3, respectively. The first to third dummy openings OP1-D, OP2-D, and OP3-D may correspond to the first to third light-emitting openings OP1-E, OP2-E, and OP3-E, respectively. On a plane, the first to third dummy patterns D1, D2, and D3 may surround the first to third light-emitting regions PXA-R, PXA-G, and PXA-B, respectively, and each of the dummy patterns D1, D2, and D3 may have a closed-line shape.

FIG. 5 illustrates that the inner side surface of the first dummy pattern D1 defining the first dummy opening OP1-D is aligned with the inner side surface of the second layer L2 defining the second region A2 (see FIG. 7C) of the first partition opening OP1-P, but the embodiment is not limited thereto, and the first dummy pattern D1 may cover the inner side surface of the second layer L2. This description may be similarly applied to the second and third dummy patterns D2 and D3.

Additional dummy patterns D1*a*, D2*a*, and D3*a* may be disposed on the dummy patterns D1, D2, and D3. The additional dummy patterns D1*a*, D2*a*, and D3*a* may include a first additional dummy pattern D1*a*, a second additional dummy pattern D2*a*, and a third additional dummy pattern D3*a*.

Each of the additional dummy patterns D1*a*, D2*a*, and D3*a* may contain a conductive material. For example, the first to third additional dummy patterns D1*a*, D2*a*, and D3*a* may contain the same material as the first to third cathodes CE1, CE2, and CE3, respectively. One additional dummy pattern may be formed simultaneously with a corresponding cathode through one process and may be formed separately from the corresponding cathode by the undercut shape of the conductive partition PW.

Openings corresponding to the first to third light-emitting openings OP1-E, OP2-E, and OP3-E may be respectively defined in the first to third additional dummy patterns D1*a*, D2*a*, and D3*a*. The first to third additional dummy patterns D1*a*, D2*a*, and D3*a* may surround the first to third light-emitting regions PXA-R, PXA-B, and PXA-G, respectively.

The conductive pattern CDP may be disposed on the conductive partition PW. In this embodiment, the conductive pattern CDP may be disposed between the conductive partition PW and the second dummy pattern D2. A conductive pattern opening OP-CDP corresponding to the second partition opening OP2-P may be defined in the conductive pattern CDP.

Although FIG. 5 illustrates that an inner side surface of the conductive pattern CDP and an inner side surface of the second dummy pattern D2 are aligned with each other, the second dummy pattern D2 may cover the inner side surface of the conductive pattern CDP.

An outer side surface OS1 of the conductive pattern CDP may be recessed inward toward the second light-emitting region PXA-G, compared to an outer side surface OS2 of the second dummy pattern D2. In an etching process of one component, a portion of the conductive pattern CDP may be removed along with the component and therefore, the conductive pattern CDP may be recessed inward, which will be described in detail later.

FIG. 6 is a schematic plan view illustrating the conductive pattern CDP provided in plurality, and for the convenience of description, the first to third light-emitting regions PXA-R, PXA-G, and PXA-B are illustrated together. As illustrated in FIG. 6, the conductive patterns CDP may surround the second light-emitting regions PXA-G on a plane. Each of the conductive patterns CDP may have a closed-line shape. In this embodiment, the conductive patterns CDP may not overlap the first and third light-emitting regions PXA-R and PXA-B and may be disposed only around the second light-emitting regions PXA-G. Without being limited thereto, however, the conductive patterns CDP may be disposed only around the first light-emitting regions PXA-R or only around the third light-emitting regions PXA-B.

According to the disclosure, the conductive pattern CDP may be formed from a conductive layer provided to cover an organic pattern (for example, first and second dummy patterns D1 and D2) having a side surface exposed in a manufacturing process of the display panel DP. After etching processes performed after the forming of the conductive layer, a portion of the conductive layer may remain in a final product without being etched, and the conductive pattern CDP may correspond to a residue of the conductive layer.

According to the disclosure, as the side surface of the exposed organic pattern is covered, damage may be prevented in a subsequent process, and thus the display panel DP with improved process reliability may be provided. A detailed description of this will be given later.

According to an embodiment, the conductive pattern CDP may not be formed depending on a manufacturing process. A detailed description of this will be given later.

The thin film encapsulation layer TFE may be disposed on the display element layer DP-OLED. The thin film encapsulation layer TFE may include a first lower inorganic encapsulation pattern LIL1, a second lower inorganic encapsulation pattern LIL2, a third lower inorganic encapsulation pattern LIL3, an organic encapsulation layer OL, and an upper inorganic encapsulation layer UIL.

The first lower inorganic encapsulation pattern LIL1 may be disposed to overlap the first light-emitting opening OP1-E. The first lower inorganic encapsulation pattern LIL1 may cover the first light-emitting element ED1 and the first dummy pattern D1, and a portion thereof may be disposed inside the first partition opening OP1-P. According to an embodiment, the first lower inorganic encapsulation pattern LIL1 may be in contact with the inner side surface of the first layer L1 defining the first region A1 (see FIG. 7C) of the first partition opening OP1-P.

The second lower inorganic encapsulation pattern LIL2 may be disposed to overlap the second light-emitting opening OP2-E. The second lower inorganic encapsulation pattern LIL2 may cover the second light-emitting element ED2 and the second dummy pattern D2, and a portion thereof may be disposed inside the second partition opening OP2-P. According to an embodiment, the second lower inorganic encapsulation pattern LIL2 may be in contact with the inner side surface of the first layer L1 defining the first region of the second partition opening OP2-P.

The third lower inorganic encapsulation pattern LIL3 may be disposed to overlap the third light-emitting opening OP3-E. The third lower inorganic encapsulation pattern LIL3 may cover the third light-emitting element ED3 and the third dummy pattern D3, and a portion thereof may be disposed inside the third partition opening OP3-P. According to an embodiment, the third lower inorganic encapsulation pattern LIL3 may be in contact with the inner side surface of the first layer L1 defining the first region of the third partition opening OP3-P.

The organic encapsulation layer OL may cover the first to third lower inorganic encapsulation patterns LIL1, LIL2, and LIL3 and provide a flat upper surface. The upper inorganic encapsulation layer UIL may be disposed on the organic encapsulation layer OL.

The first to third lower inorganic encapsulation patterns LIL1, LIL2, and LIL3 and the upper inorganic encapsulation layer UIL may protect the display element layer DP-OLED from moisture/oxygen, and the organic encapsulation layer OL may protect the display element layer DP-OLED from foreign substances such as dust particles.

FIGS. 7A to 7J are schematic cross-sectional views illustrating steps of a method of manufacturing a display panel according to an embodiment. FIGS. 8A to 8J are schematic cross-sectional views illustrating steps of the method of manufacturing the display panel according to an embodiment. FIGS. 9A to 9J are schematic cross-sectional views illustrating steps of the method of manufacturing the display panel according to an embodiment. In the description with reference to FIGS. 7A to 9J, same/similar reference numerals will be used for the same/similar components as those described in FIGS. 1A to 5, and duplicate descriptions may be omitted.

The method of manufacturing the display panel according to the disclosure may include: providing a preliminary display panel including a base layer, a first anode disposed above the base layer, a pixel defining layer disposed above the base layer and having a first light-emitting opening defined therein and exposing a portion of the first anode, and a conductive partition disposed on the pixel defining layer and having a first partition opening defined therein and corresponding to the first light-emitting opening; depositing a first organic material so as to form a first light-emitting pattern at least partially disposed in the first light-emitting opening and the first partition opening and a first dummy layer spaced apart from the first light-emitting pattern and disposed on the conductive partition; depositing a first conductive material so as to form a first cathode at least partially disposed in the first partition opening; forming a first mask pattern, which overlaps the first light-emitting opening and contains a second conductive material, on the conductive partition; patterning the first dummy layer by using the first mask pattern so as to form a first dummy pattern from the first dummy layer; and depositing the second conductive material so as to form a first conductive layer from the first mask pattern.

The method of manufacturing the display panel according to the disclosure may include a first group process, a second group process, a third group process, and a fourth group process. The first to third group processes may respectively form components of the first to third light-emitting elements ED1, ED2, and ED3 (see FIG. 9I) and the thin film encapsulation layer TFE (see FIG. 9I). The fourth group process may be a process of completing the display panel DP (see FIG. 9J) by forming the remaining components of the thin film encapsulation layer TFE (see FIG. 9J).

In this embodiment, the first light-emitting element ED1 (see FIG. 7J) and the first lower inorganic encapsulation pattern LIL1 (see FIG. 7J) covering the first light-emitting element ED1 (see FIG. 7J) may be formed through the first group process. Hereinafter, the first group process will be described with reference to FIGS. 7A to 7J.

Referring to FIG. 7A, the first group process according to this embodiment may include forming an initial photoresist layer PR-I on a preliminary first display panel DP-I1.

The preliminary first display panel DP-I1 provided in this embodiment may include a base layer BL, a circuit element layer DP-CL, first to third anodes AE1, AE2, and AE3, first to third sacrificial patterns SP1, SP2, and SP3, a preliminary pixel defining layer PDL-I, and a preliminary conductive partition layer PW-I.

The circuit element layer DP-CL may be formed through a process of manufacturing a selectable circuit element. In the process, an insulating layer, a semiconductor layer, and a conductive layer may be formed by a method such as coating or deposition, and the insulating layer, the semiconductor layer, and the conductive layer may be selectively patterned through photolithography and etching processes to form semiconductor patterns, conductive patterns, signal lines, and the like within the spirit and the scope of the disclosure.

The anodes AE1, AE2, and AE3 and the sacrificial patterns SP1, SP2, and SP3 may be formed through a same patterning process. The preliminary pixel defining layer PDL-I may cover all of the anodes AE1, AE2, and AE3 and the sacrificial patterns SP1, SP2, and SP3.

The preliminary conductive partition layer PW-I may include a first layer L1 and a second layer L2 disposed on the first layer L1. The first layer L1 may have a first conductivity and a first thickness, and the second layer L2 may have a second conductivity lower than the second conductivity and a second thickness smaller than the first thickness.

The initial photoresist layer PR-I may be formed by forming a preliminary photoresist layer on the preliminary conductive partition layer PW-I and patterning the preliminary photoresist layer by using a photo mask. Through the patterning process, an initial opening OP-I overlapping the first anode AE1 may be formed in the initial photoresist layer PR-I.

Hereafter, referring to FIGS. 7B and 7C, the first group process according to this embodiment may include forming a conductive partition, in which a first partition opening is defined, from the preliminary conductive partition layer through a first etching process.

First, as illustrated in FIG. 7B, the first etching process may include forming a preliminary first partition opening OP1-PI in the preliminary conductive partition layer PW-I by using the initial photoresist layer PR-I as a mask and dry-etching the first and second layers L1 and L2. The dry etching of the first etching process may be performed in an etching environment in which the etching selectivities of the first and second layers L1 and L2 are substantially the same as each other. Accordingly, the inner side surface of the first layer L1 and the inner side surface of the second layer L2 defining the preliminary first partition opening OP1-PI may be substantially aligned with each other.

Hereafter, as illustrated in FIG. 7C, the first etching process may include forming a first partition opening OP1-P from the preliminary first partition opening OP1-PI by using the initial photoresist layer PR-I as a mask and wet-etching the first and second layers L1 and L2. Through this, the conductive partition PW may be formed from the preliminary conductive partition layer PW-I in which the preliminary first partition opening OP1-PI is defined.

The wet etching process in the first etching process may be performed in an environment in which the etching selectivity between the first and second layers L1 and L2 is high. Accordingly, the inner side surface of the conductive partition PW defining the first partition opening OP1-P may have an undercut shape on a cross section. For example, as the etch rate of the first layer L1 with respect to an etching solution is greater than that of the second layer L2, the first layer L1 may be mainly etched. Accordingly, the first partition opening OP1-P may include the first region A1 and the second region A2, and the inner side surface of the first layer L1 defining the first region A1 of the first partition opening OP1-P may be formed to be recessed more inward than the inner side surface of the second layer L2 defining the second region A2 of the first partition opening OP1-P. The inner side surface of the second layer L2 defining the second region A2 of the first partition opening OP1-P may be closer to the center of the first anode AE1 than the inner side surface of the first layer L1 defining the first region A1 of the first partition opening OP1-P. A tip portion may be formed in the conductive partition PW by a portion of the second layer L2 protruding from the first layer L1.

Figure 7D:
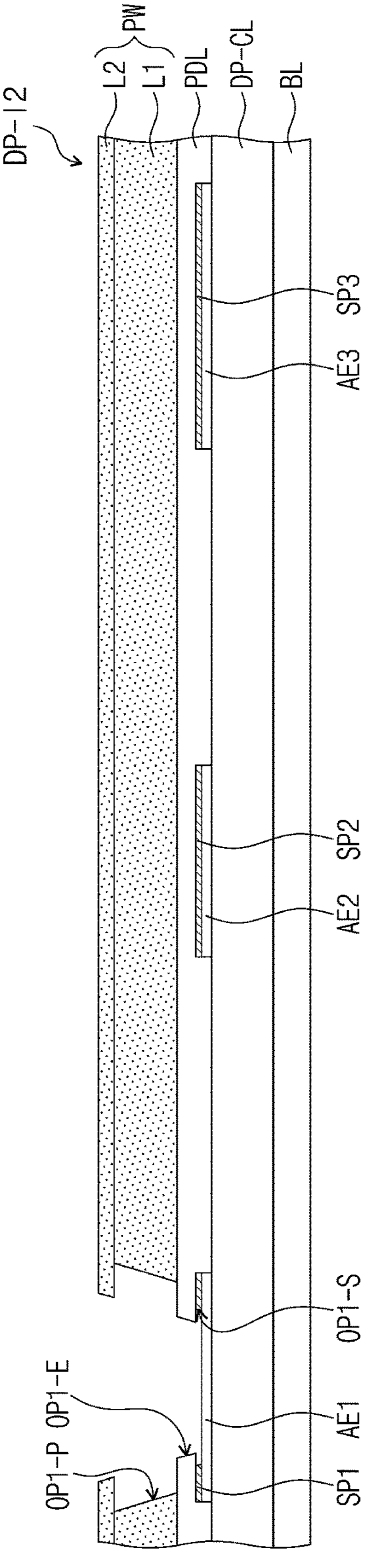

Referring to FIG. 7D, the first group process according to this embodiment may include forming a pixel defining layer PDL, in which the first light-emitting opening OP1-E is defined, by patterning the preliminary pixel defining layer PDL-I (see FIG. 7C) through a second etching process. The second etching process may be performed by a dry etching method and may be performed by using the initial photoresist layer PR-I (see FIG. 7C) and the conductive partition PW (for example, the second layer L2) as a mask.

The first group process according to this embodiment may include forming a first sacrificial opening OP1-S in the first sacrificial pattern SP1 so as to expose at least a portion of the first anode AE1 through a third etching process. The third etching process may be performed by a wet etching method and may be performed by using, as a mask, the initial photoresist layer PR-I (see FIG. 7C) and the pixel defining layer PDL in which the first light-emitting opening OP1-E is defined.

The inner side surface of the first sacrificial pattern SP1 defining the first sacrificial opening OP1-S may be formed to be recessed more inward than the inner side surface of the pixel defining layer PDL defining the light-emitting opening OP1-E. This is illustrated as an example, and the inner side surface of the first sacrificial pattern SP1 may be aligned with the inner side surface of the pixel defining layer PDL, but the disclosure is not limited to any one embodiment.

The third etching process may be performed in an environment in which the etching selectivity between the first sacrificial pattern SP1 and the first anode AE1 is high, and through this, it is possible to prevent the second anode AE1 from being etched together. For example, by disposing the first sacrificial pattern SP1, which has a higher etch rate than the first anode AE1, between the pixel defining layer PDL and the first anode AE1, it is possible to prevent the first anode AE1 from being etched together and damaged during an etching process.

The third etching process may be performed as an etching process separate from the second etching process or may be performed as the same etching process as the second etching process.

Hereafter, the first group process according to this embodiment may include removing the initial photoresist layer PR-I (see FIG. 7C). In this specification, it may be considered that a preliminary second display panel DP-I2 (preliminary display panel in claims) is provided after the removing of the initial photoresist layer PR-I (see FIG. 7C). For example, the preliminary second display panel DP-I2 may include a base layer BL, a circuit element layer DP-CL, first to third anodes AE1, AE2, and AE3, a first sacrificial pattern SP1 having a first sacrificial opening OP1-S defined therein, second and third sacrificial patterns SP2 and SP3, a pixel defining layer PDL having a first light-emitting opening OP1-E defined therein, and a conductive partition PW having a first partition opening OP1-P defined therein.

Figure 7E:
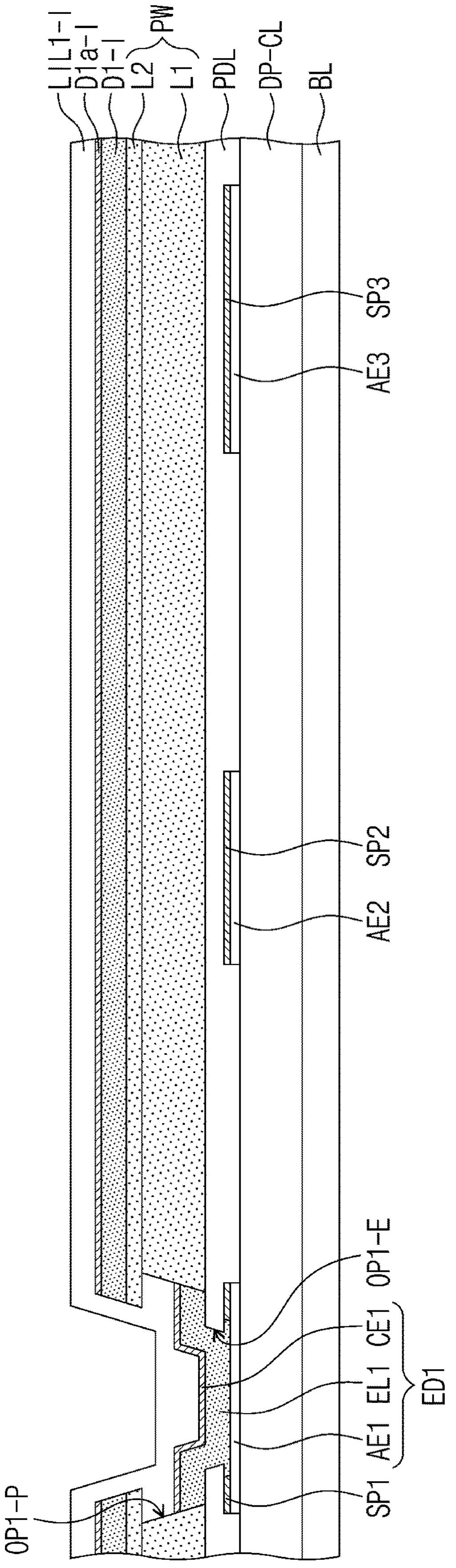

Referring to FIG. 7E, the first group process according to this embodiment may include depositing a first organic material so as to form a first light-emitting pattern EL1, depositing a first conductive material so as to form a first cathode CE1, and forming a preliminary first lower inorganic encapsulation layer LIL1-I.

In an embodiment, the depositing of the first organic material may be performed through a thermal evaporation process, and the depositing of the first conductive material may be performed through a sputtering process, but the embodiment is not limited thereto.

The first light-emitting pattern EL1 may be separated by the tip portion formed in the conductive partition PW, and at least a portion thereof may be disposed in the first light-emitting opening OP1-E and the first partition opening OP1-P. The first cathode CE1 may be separated by the tip portion formed in the conductive partition PW, and at least a portion thereof may be disposed in the first partition opening OP1-P. The first cathode CE1 may be provided at a higher incident angle than the first light-emitting pattern EL1 and may be formed to be in contact with the inner side surface of the first layer L1.

In the forming of the first light-emitting pattern EL1, a first dummy layer D1-I may be formed together on the conductive partition PW. In the forming of the first cathode CE1, an additional first dummy layer D1*a*-I may be formed on the conductive partition PW.

The preliminary first lower inorganic encapsulation layer LIL1-I may be formed through a chemical vapor deposition (CVD) process. The preliminary first lower inorganic encapsulation layer LIL1-I may be formed on the conductive partition PW and the first cathode CE1, and a portion of the preliminary first lower inorganic encapsulation layer LIL1-I may be formed inside the first partition opening OP1-P.

The method of manufacturing the display panel according to this embodiment may further include forming a capping pattern between the forming of the first cathode CE1 and the forming of the preliminary first lower inorganic encapsulation layer LIL1-I. The capping pattern may be formed through a deposition process, and the capping pattern may be separated by the tip portion formed in the conductive partition PW and disposed in the first partition opening OP1-P.

Figure 7F:
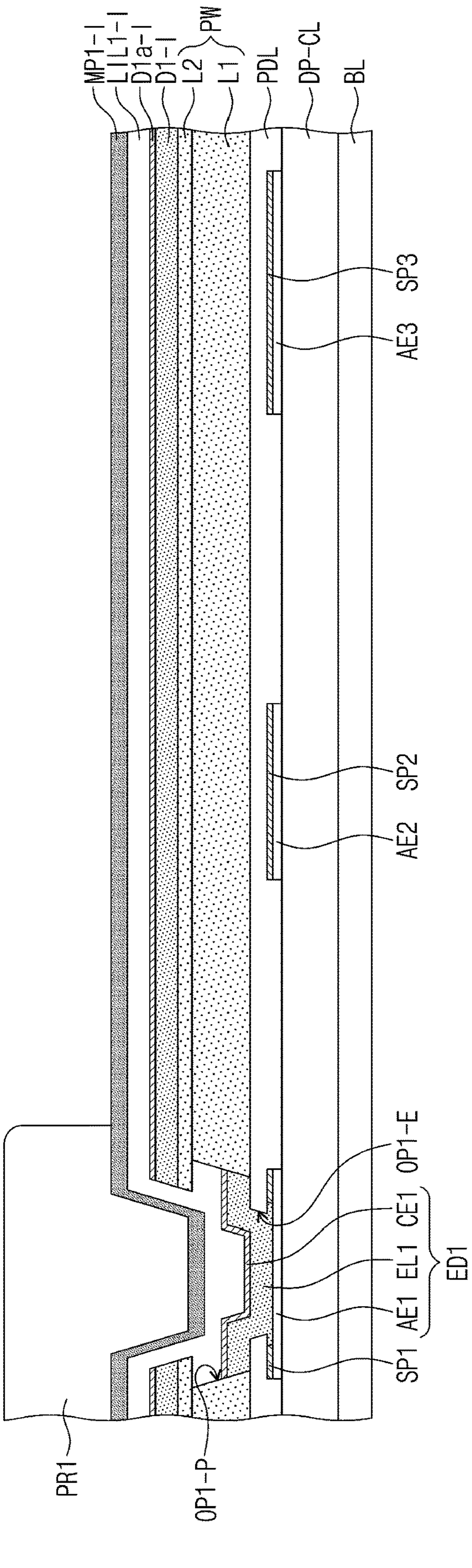
Figure 7G:
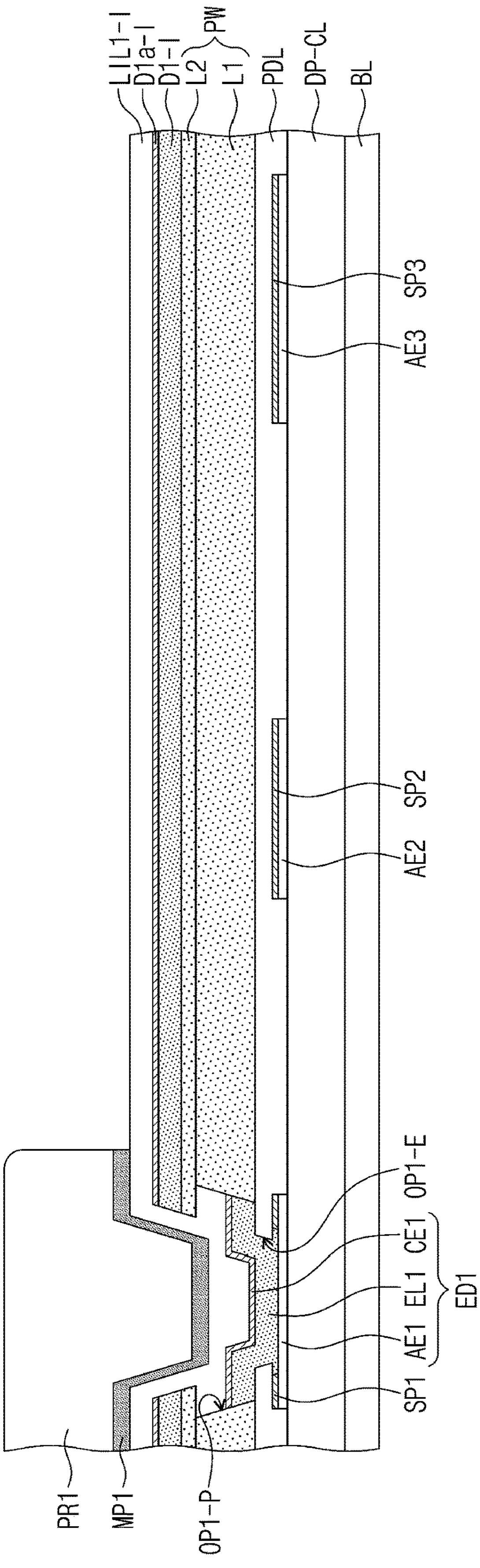

Referring to FIGS. 7F and 7G, the first group process according to this embodiment may include forming a first mask pattern MP1. The forming of the first mask pattern MP1 may include forming a preliminary first mask layer MP1-I on the preliminary first lower inorganic encapsulation layer LIL1-I, forming a first photoresist layer PR1 on the preliminary first mask layer MP1-I, and forming a first mask pattern MP1 from the preliminary first mask layer MP1-I.

First, as illustrated in FIG. 7F, the preliminary first mask layer MP1-I may be formed through a deposition process. For example, the preliminary first mask layer MP1-I may be formed through a sputtering process, but the embodiment is not limited thereto. The preliminary first mask layer MP1-I may contain a second conductive material. In an embodiment, the second conductive material may include a transparent conductive oxide. For example, the second conductive material may be an indium zinc oxide (IZO) or an indium tin oxide (ITO).

The first photoresist layer PR1 may be formed by forming a preliminary photoresist layer on the preliminary first mask layer MP1-I and patterning the preliminary photoresist layer by using a photo mask. Through the patterning process, the first photoresist layer PR1 may be formed in a pattern shape overlapping the first light-emitting opening OP1-E.

Hereafter, as illustrated in FIG. 7G, the first mask pattern MP1 may be formed from the preliminary first mask layer MP1-I through a fourth etching process.

The fourth etching process may remove a portion of the preliminary first mask layer MP1-I overlapping the second and third anodes AE2 and AE3 by using the first photoresist layer PR1 as a mask and wet-etching the preliminary first mask layer MP1-I. The first mask pattern MP1 overlapping the first light-emitting opening OP1-E may be formed from the preliminary first mask layer MP1-I, a portion of which is removed.

Figure 7H:
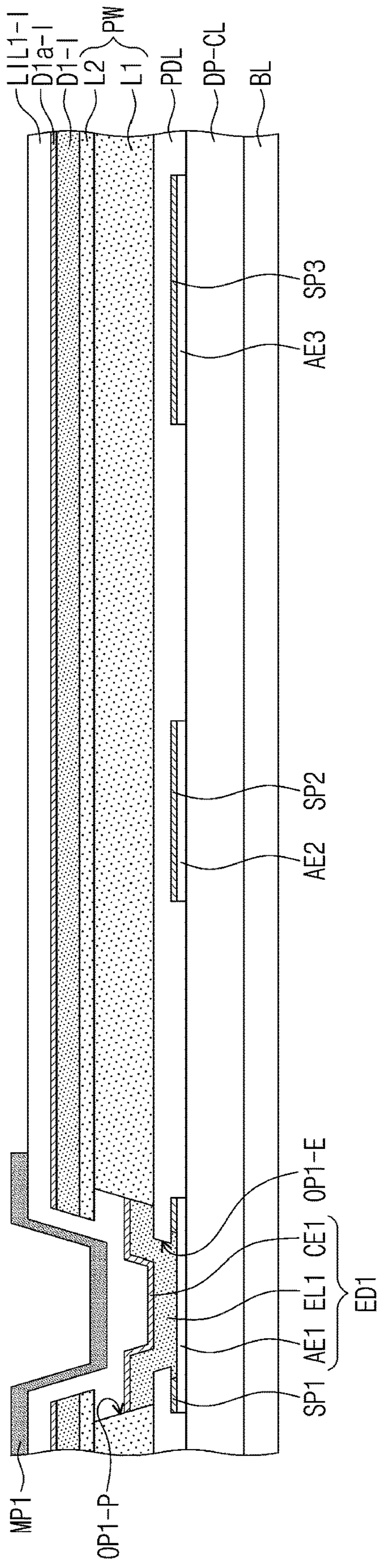
Figure 7I:
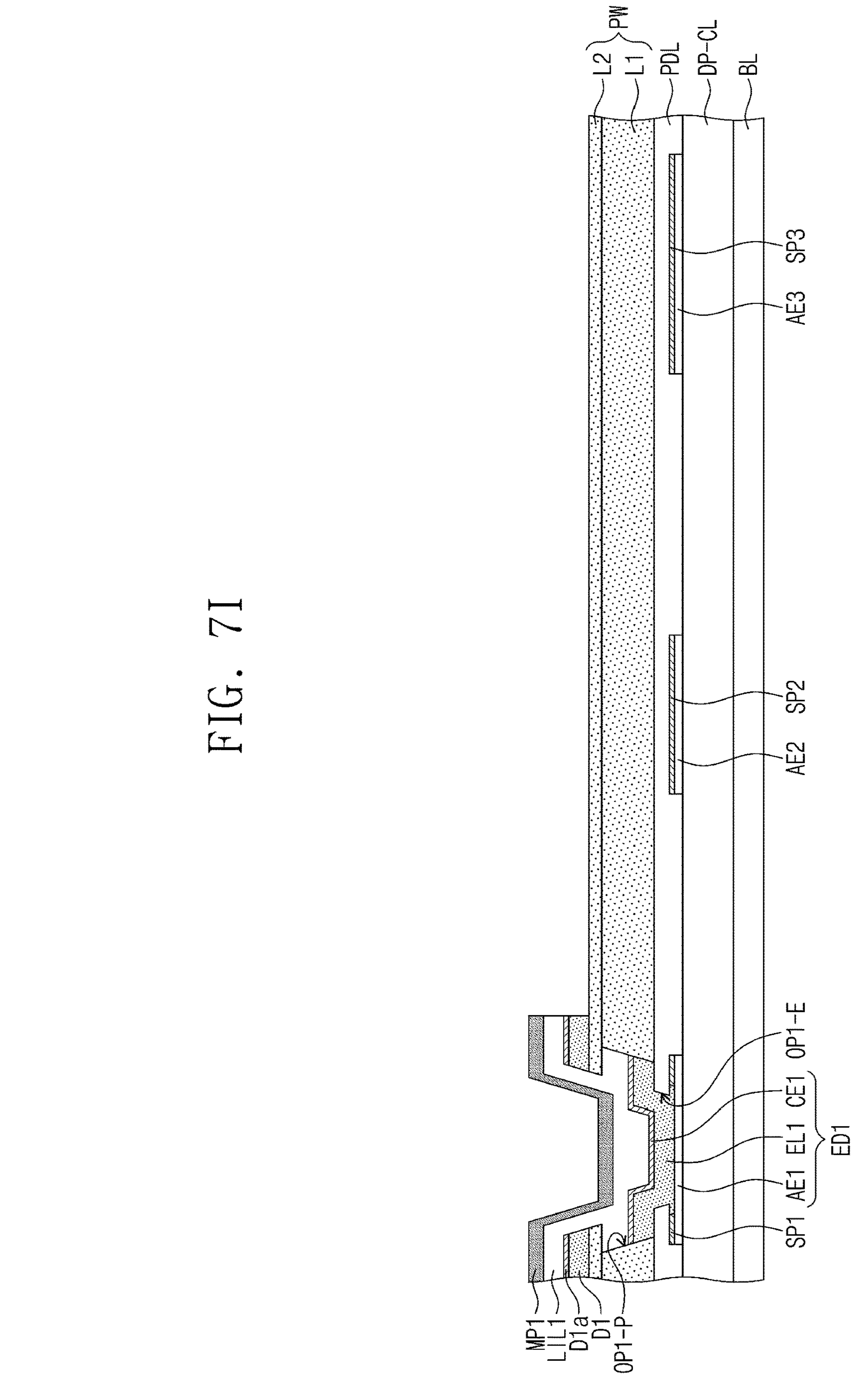

Referring to FIGS. 7H and 7I, the first group process according to this embodiment may include removing the first photoresist layer PR1 (see FIG. 7G), patterning the preliminary first lower inorganic encapsulation layer LIL1-I through a fifth etching process, and patterning the first dummy layer D1-I through a sixth etching process.

According to this embodiment, the process of removing the first photoresist layer PR1 (see FIG. 7G) may be performed prior to the patterning process of the preliminary first lower inorganic encapsulation layer LIL1-I and the patterning process of the first dummy layer D1-I.

According to the disclosure, as the first mask pattern MP1 is provided, the first mask pattern MP1 may be used as a mask in subsequent patterning processes. Accordingly, the first photoresist layer PR1 (see FIG. 7G) may be removed prior to the patterning process of the preliminary first lower inorganic encapsulation layer LIL1-I and the first dummy layer D1-I. For example, the first photoresist layer PR1 may be removed before the inside (for example, the outer side surface of the first dummy pattern D1) of the first dummy layer D1-I is exposed, and a portion of the first dummy pattern D1 may be prevented from being melted together and damaged by a material used to remove the photoresist layer. Through this, it is possible to prevent a lifting phenomenon between the first dummy pattern D1 and the first lower inorganic encapsulation pattern LIL1 and also prevent moisture and foreign substances from entering between the first dummy pattern D1 and the first lower inorganic encapsulation pattern LIL1, thus preventing the occurrence of defects in the first light-emitting element ED1. Accordingly, it is possible to provide the first light-emitting element ED1 having improved process reliability and the display panel DP (see FIG. 9J) including the same.

Through the fifth etching process, the first lower inorganic encapsulation pattern LIL1 may be formed from the preliminary first lower inorganic encapsulation layer LIL1-I, and through the sixth etching process, the first dummy pattern D1 may be formed from the first dummy layer D1-I.

In the fifth etching process, a portion of the preliminary first lower inorganic encapsulation layer LIL1-I overlapping the second and third anodes AE2 and AE3 may be patterned so as to be removed by using the first mask pattern MP1 as a mask and dry-etching the preliminary first lower inorganic encapsulation layer LIL1-I. The first lower inorganic encapsulation pattern LIL1 overlapping the first light-emitting opening OP1-E may be formed from the preliminary first lower inorganic encapsulation layer LIL1-I, a portion of which is removed. A portion of the first lower inorganic encapsulation pattern LIL1 may be disposed in the first partition opening OP1-P to cover the first light-emitting element ED1, and another portion of the first lower inorganic encapsulation pattern LIL1 may be disposed on the conductive partition PW.

In the sixth etching process, a portion of the first dummy layer D1-I overlapping the second and third anodes AE2, and AE3 may be patterned so as to be removed by using the first mask pattern MP1 as a mask and dry-etching the first dummy layer D1-I. On a plane, the first dummy pattern D1 having a closed-line shape surrounding the first light-emitting region PXA-R (see FIG. 5) may be formed from the first dummy layer D1-I, a portion of which is removed.

In the sixth etching process, a portion of the additional first dummy layer D1*a*-I overlapping the second and third anodes AE2 and AE3 may be patterned so as to be removed by dry-etching the additional first dummy layer D1*a*-I. On a plane, the first additional dummy pattern D1*a* having a closed-line shape surrounding the first light-emitting region PXA-R (see FIG. 5) may be formed from the additional first dummy layer D1*a*-I, a portion of which is removed. The embodiment is not limited thereto, and the dry etching of the additional first dummy layer D1*a*-I may be performed as a process separate from the dry etching process of the first dummy layer D1-I.

Figure 7J:
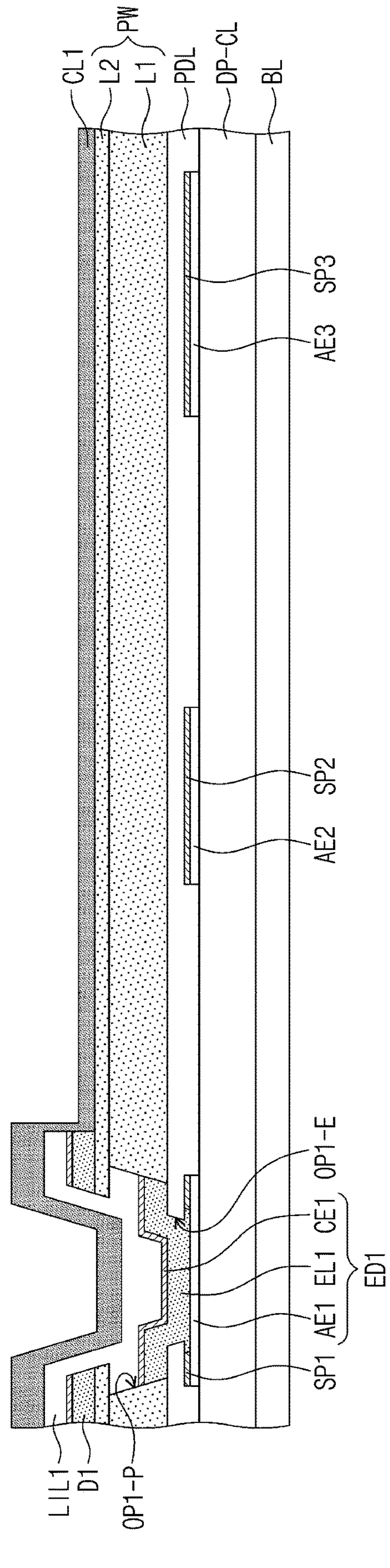

Referring to FIGS. 7I and 7J, the first group process according to this embodiment may include depositing a second conductive material so as to form a first conductive layer CL1 from the first mask pattern MP1. For example, the second conductive material may be deposited through a sputtering process, but the embodiment is not limited thereto.

In this embodiment, since the same material as that of the first mask pattern MP1 is deposited on the first mask pattern MP1, the first mask pattern MP1 and the newly deposited second conductive material may form the first conductive layer CL1. The first conductive layer CL1 may overlap all of the first to third anodes AE1, AE2, and AE3.

According to this embodiment, the outer side surface of the first dummy pattern D1 is exposed through the sixth etching process, but as the depositing of the second conductive material is included after the sixth etching process, the exposed outer side surface of the first dummy pattern D1 may be covered by the first conductive layer CL1. Accordingly, damage to the first dummy pattern D1 may be prevented in a subsequent step of removing a photoresist layer.

After the first group process, a second group process may be performed. In this embodiment, a second light-emitting element ED2 (see FIG. 8J) and a second lower inorganic encapsulation pattern LIL2 (see FIG. 8J) covering the second light-emitting element ED2 (see FIG. 8J) may be formed through the second group process. Hereinafter, the second group process will be described with reference to FIGS. 8A to 8J.

Figure 8A:
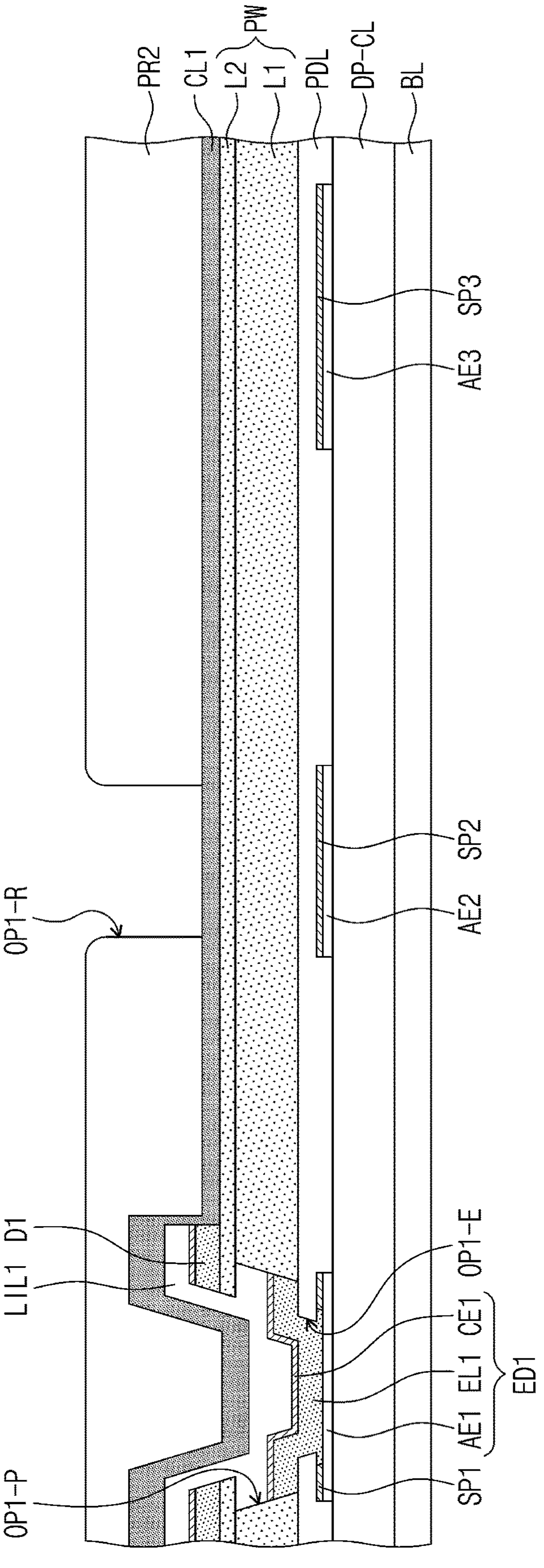
FIGS. 8A to 8J are schematic cross-sectional views illustrating steps of the method of manufacturing the display panel according to an embodiment.

Referring to FIG. 8A, the second group process according to this embodiment may include forming a second photoresist layer PR2 on the first conductive layer CL1. A first photo opening OP1-R overlapping the second anode AE2 may be defined in the second photoresist layer PR2.

Figure 8B:
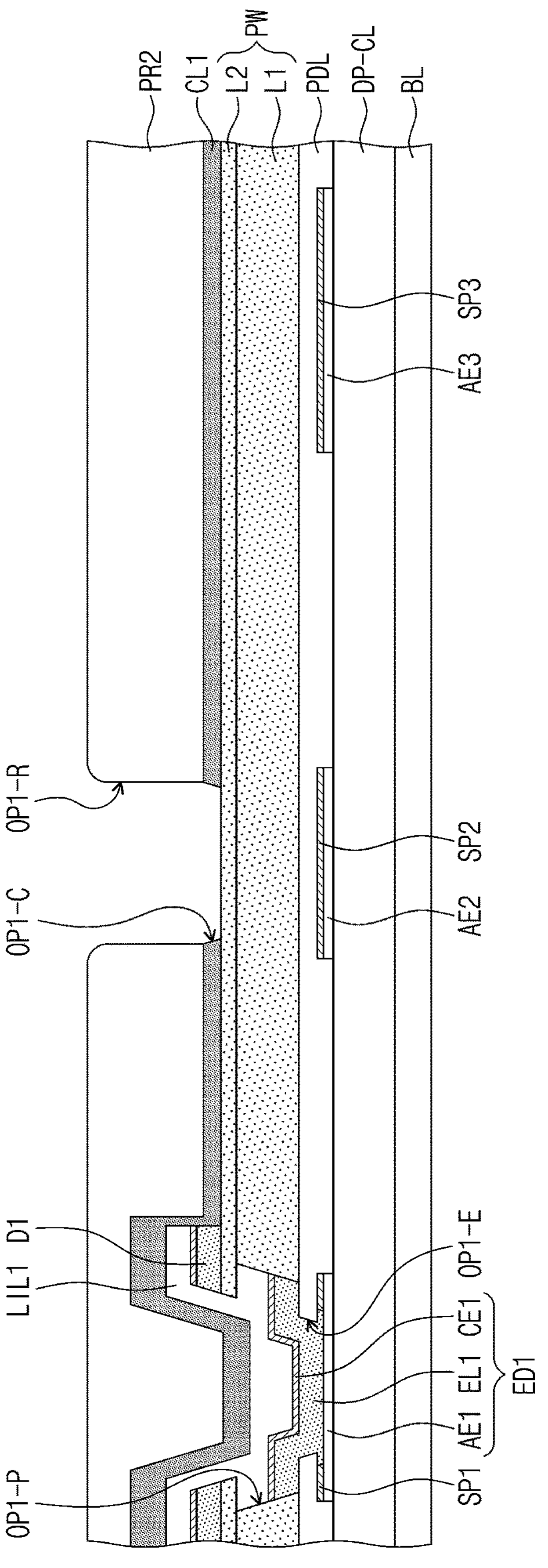

Referring to FIG. 8B, the second group process according to this embodiment may include forming a first conductive opening OP1-C in the first conductive layer CL1 through a first etching process. In the first etching process, the first conductive opening OP1-C in the first conductive layer CL1 may be formed by using the second photoresist layer PR2 as a mask and dry-etching the first conductive layer CL1. The first conductive opening OP1-C may correspond to the first photo opening OP1-R and overlap the second anode AE2.

Figure 8C:
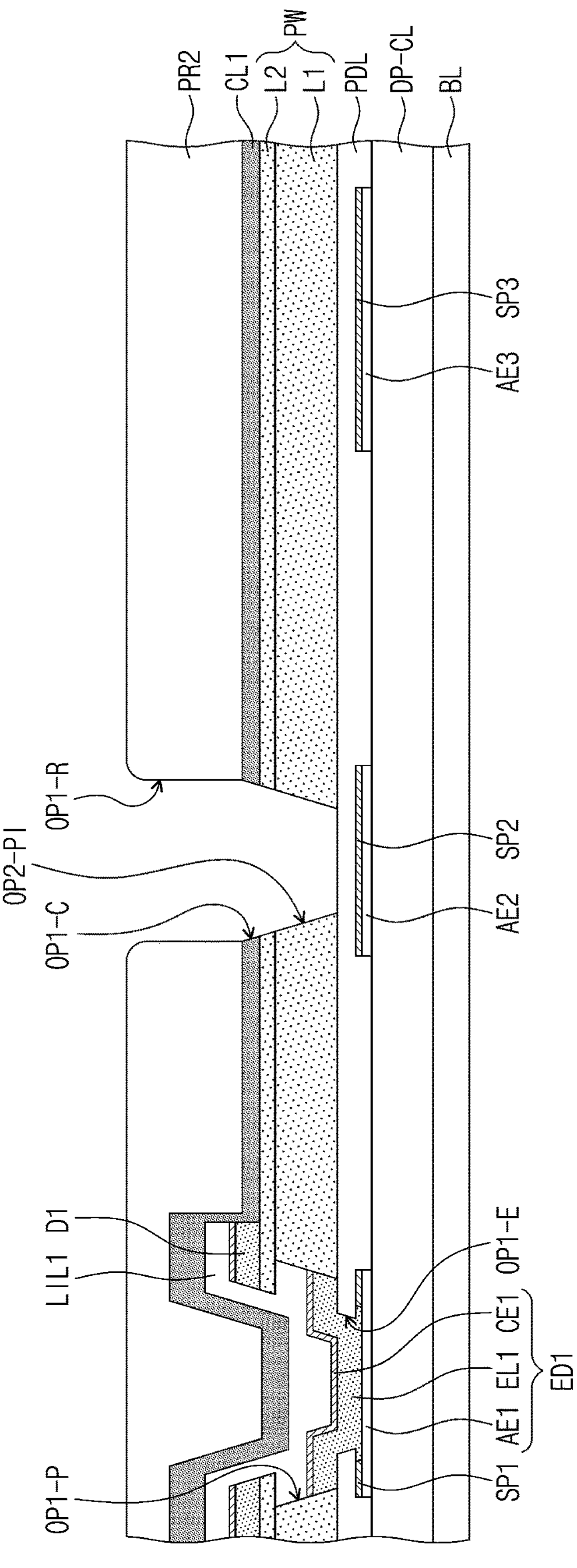
Figure 8D:
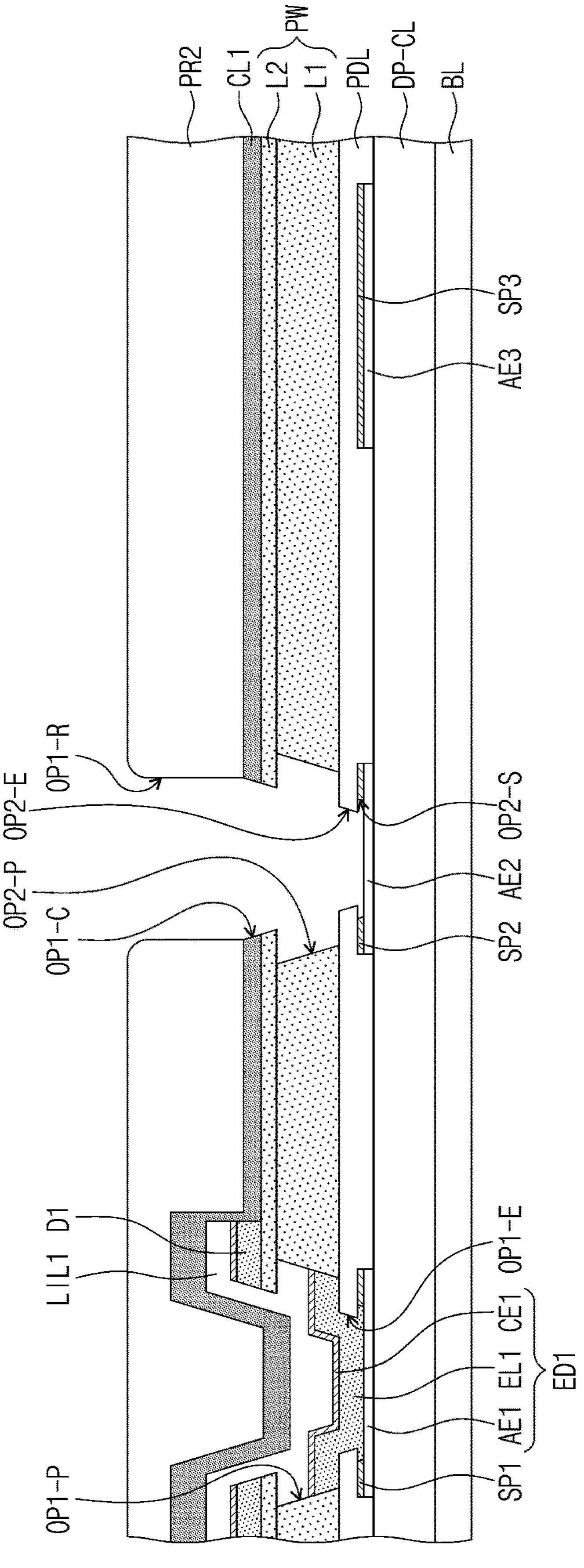

Referring to FIGS. 8C and 8D, the second group process according to this embodiment may include forming a second partition opening OP2-P in the conductive partition PW through a second etching process.

First, as illustrated in FIG. 8C, the second etching process may include forming a preliminary second partition opening OP2-PI in the conductive partition PW by using the second photoresist layer PR2 as a mask and dry-etching the first and second layers L1 and L2.

Hereafter, as illustrated in FIG. 8D, the second etching process may include forming the second partition opening OP2-P from the preliminary second partition opening OP2-PI by using the second photoresist layer PR2 as a mask and wet-etching the first and second layers L1 and L2. Regarding the dry etching and wet etching of the first and second layers L1 and L2, the aforementioned description thereof will be similarly applied. The inner side surface of the conductive partition PW defining the second partition opening OP2-P may have an undercut shape on a cross section.

Referring to FIG. 8D, the second group process according to this embodiment may include forming a second light-emitting opening OP2-E in the pixel defining layer PDL through a third etching process and forming the second sacrificial opening OP2-S in the second sacrificial pattern SP2 through a fourth etching process. At least a portion of the second anode AE2 may be exposed by the second light-emitting opening OP2-E and the second sacrificial opening OP2-S.

Each of the second light-emitting opening OP2-E and the second sacrificial opening OP2-S may be formed in a manner similar to the forming of the first light-emitting opening OP1-E (see FIG. 7D) and the first sacrificial opening OP1-S (see FIG. 7D) in the first group process. In the second group process, the third etching process may be performed by using the second photoresist layer PR2 and the conductive partition PW (for example, the second layer L2) as a mask, and the fourth etching process may be performed by using, as a mask, the pixel defining layer PDL in which the second light-emitting opening OP2-E is defined.

Figure 8E:
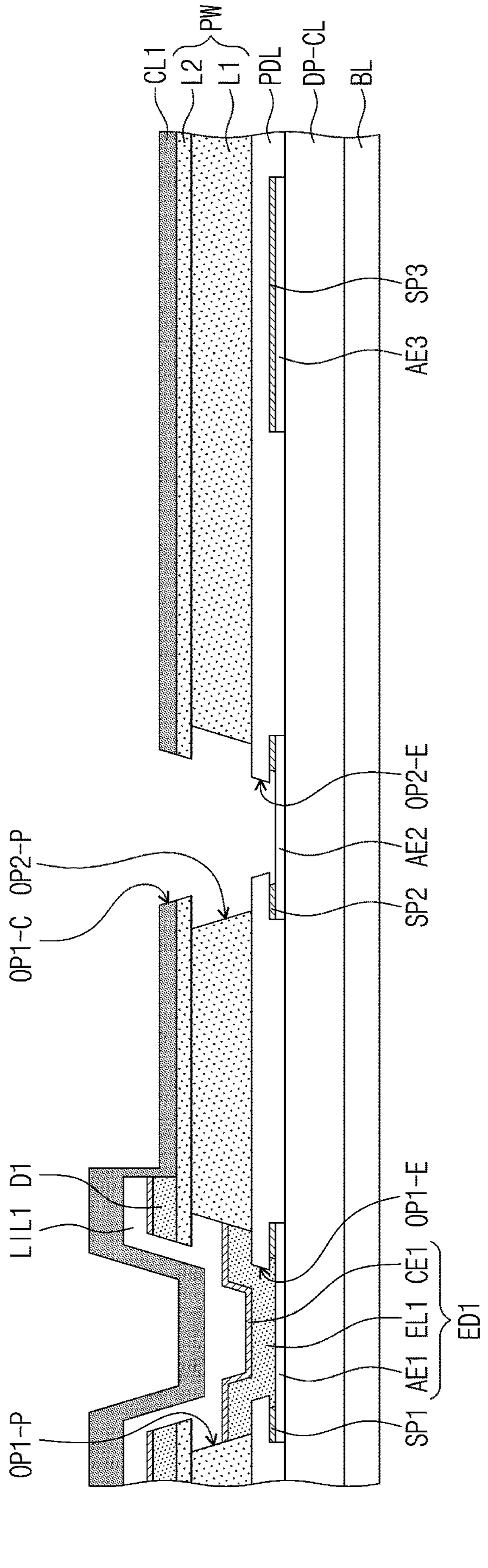

Referring to FIG. 8E, the second group process according to this embodiment may include removing the second photoresist layer PR2 (see FIG. 8D). In this embodiment, the outer side surface of the first dummy pattern D1 may be provided in a state of being covered by the first conductive layer CL1, and therefore, it is possible to prevent the first dummy pattern D1 from being damaged by a material injected to remove the second photoresist layer PR2 (see FIG. 8D). Accordingly, the lifting phenomenon of the first lower inorganic encapsulation pattern LIL1 may be prevented so that damage to the first light-emitting element ED1 may be prevented.

Figure 8F:
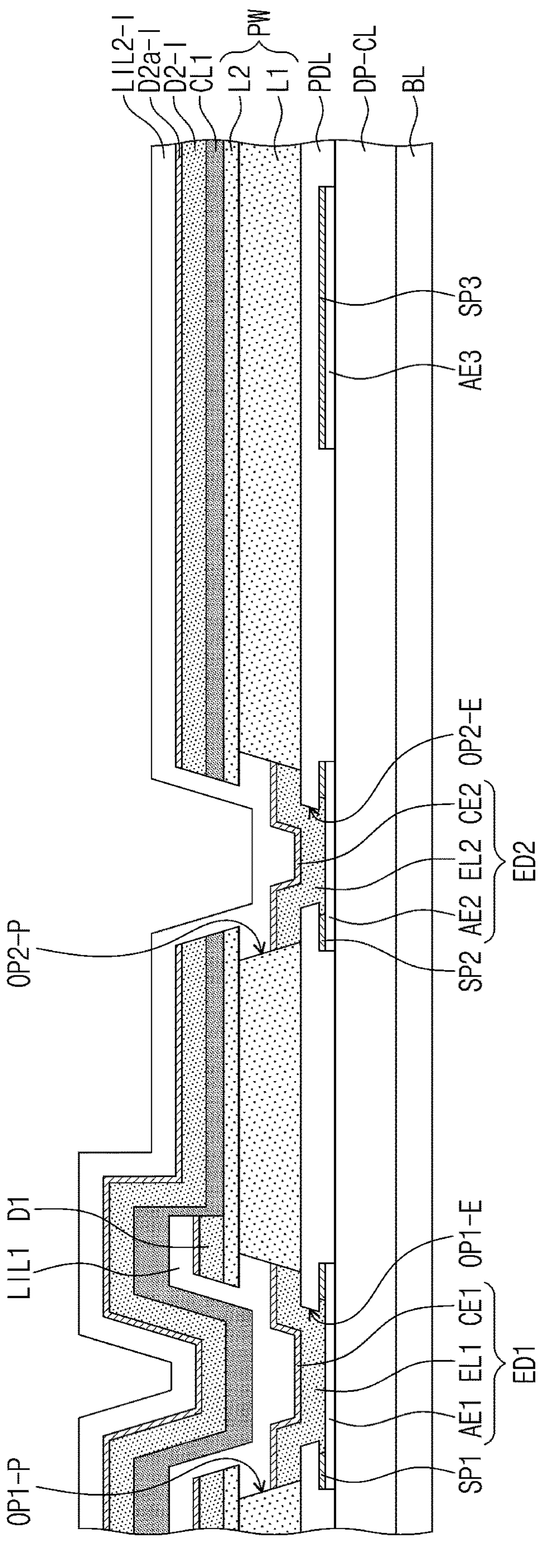

Referring to FIG. 8F, the second group process according to this embodiment may include depositing a second organic material so as to form a second light-emitting pattern EL2, depositing a first conductive material so as to form a second cathode CE2, and forming a preliminary second lower inorganic encapsulation layer LIL2-I.

The depositing of the second organic material may be performed in a manner similar to the depositing of the first organic material so as to form the first light-emitting pattern EL1 (see FIG. 7E) in the first group process. The depositing of the first conductive material so as to form the second cathode CE2 may be performed in a manner similar to the depositing of the first conductive material so as to form the first cathode CE1 (see FIG. 7E) in the first group process. The preliminary second lower inorganic encapsulation layer LIL2-I may be formed in a manner similar to the forming of the preliminary first lower inorganic encapsulation layer LIL1-I (see FIG. 7E) in the first group process.

In the depositing of the second organic material, a second dummy layer D2-I spaced apart from the second light-emitting pattern EL2 may be formed together. In the depositing of the first conductive material, an additional second dummy layer D2a-I spaced apart from the second cathode CE2 may be formed together. The second dummy layer D2-I and the additional second dummy layer D2a-I may be disposed on the first conductive layer CL1.

Figure 8G:
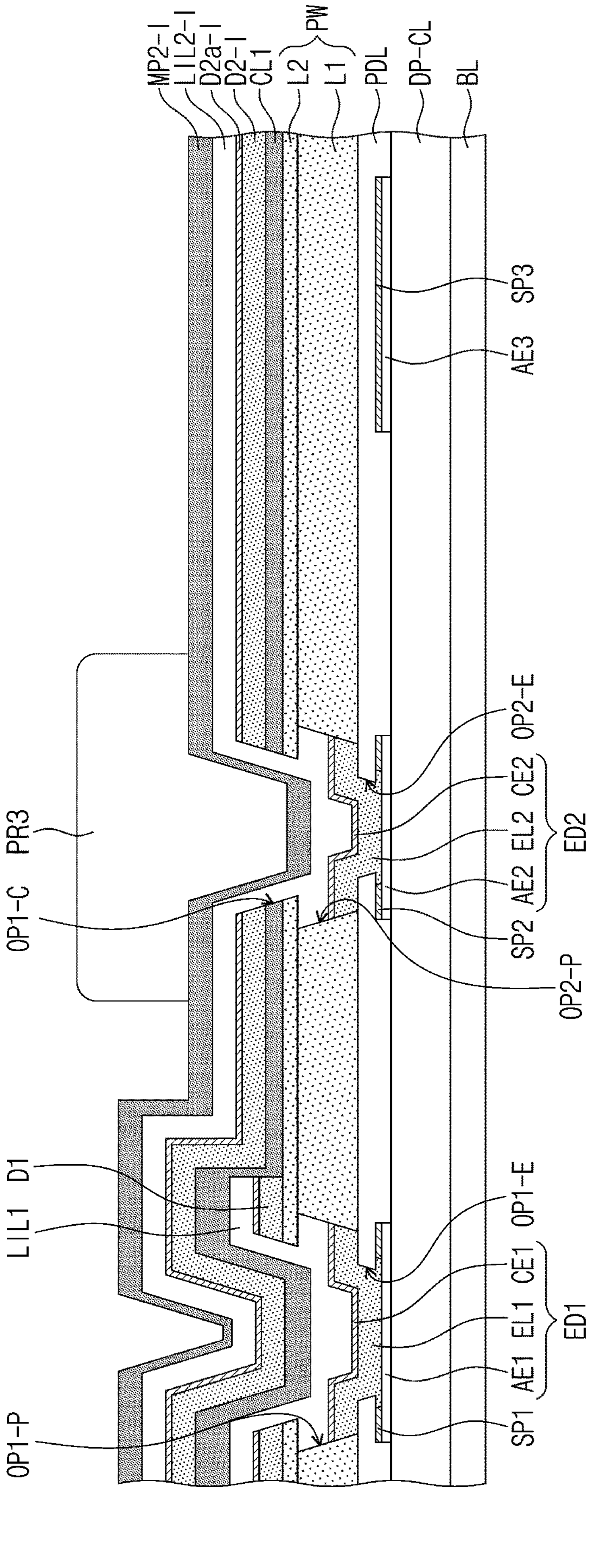
Figure 8H:
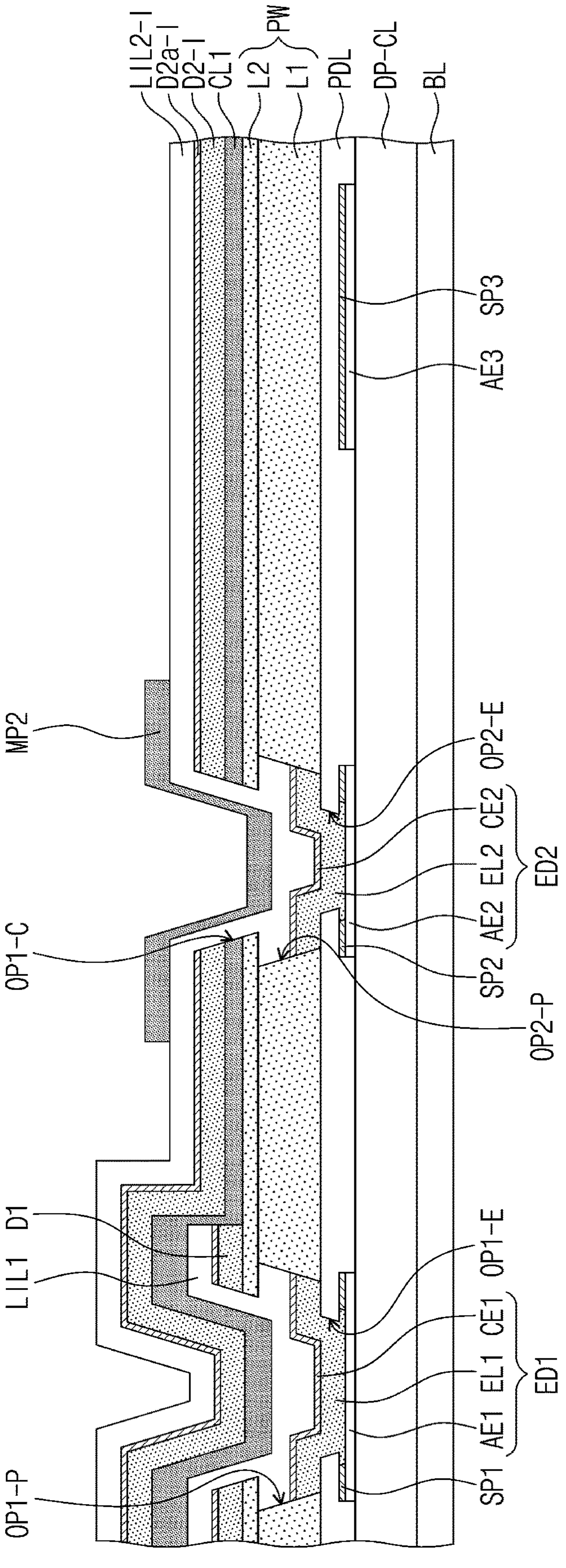

Referring to FIGS. 8G and 8H, the second group process according to this embodiment may include forming a second mask pattern MP2. The forming of the second mask pattern MP2 may include forming a preliminary second mask layer MP2-I on the preliminary second lower inorganic encapsulation layer LIL2-I, forming a third photoresist layer PR3 on the preliminary second mask layer MP2-I, forming a second mask pattern MP2 from the preliminary second mask layer MP2-I, and removing the third photoresist layer PR3.

First, as illustrated in FIG. 8G, the preliminary second mask layer MP2-I may contain a second conductive material and be formed in a manner similar to the forming of the preliminary first mask layer MP1-I (see FIG. 7F) in the first group process.

The third photoresist layer PR3 may be formed as a pattern overlapping the second light-emitting opening OP2-E in a manner similar to the forming of the first photoresist layer PR1 (see FIG. 7F) in the first group process.

Hereafter, as illustrated in FIG. 8H, a second mask pattern MP2 may be formed from the preliminary second mask layer MP2-I through a fifth etching process. The forming of the second mask pattern MP2 may be performed in a manner similar to the forming of the first mask pattern MP1 (see FIG. 7G) in the first group process. A portion of the preliminary second mask layer MP2-I overlapping the first and third anodes AE1 and AE3 is removed, and the second mask pattern MP2 may be formed as a pattern overlapping the second light-emitting opening OP2-E. Hereafter, the third photoresist layer PR3 may be removed.

Figure 8I:
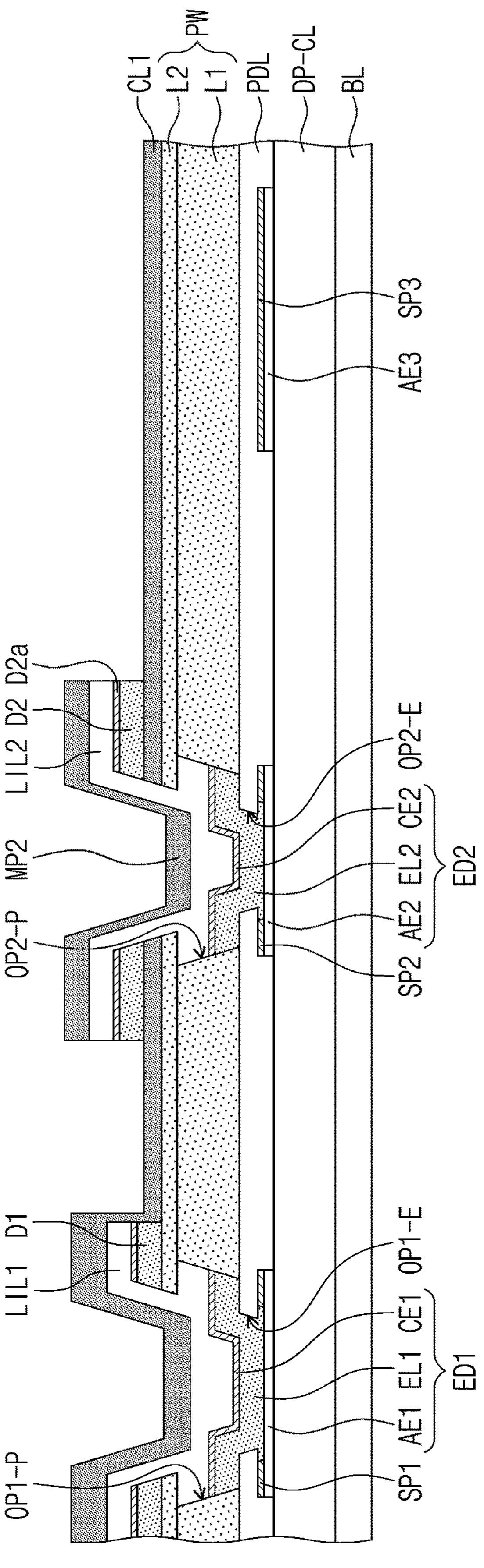

Referring to FIGS. 8H and 8I, the second group process according to this embodiment may include patterning the preliminary second lower inorganic encapsulation layer LIL2-I through a sixth etching process and patterning the second dummy layer D2-I through a seventh etching process. Through the sixth etching process, the second lower inorganic encapsulation pattern LIL2 may be formed from the preliminary second lower inorganic encapsulation layer LIL2-I, and through the seventh etching process, the second dummy pattern D2 may be formed from the second dummy layer D2-I.

The patterning of the preliminary second lower inorganic encapsulation layer LIL2-I may be performed in a manner similar to the patterning of the preliminary first lower inorganic encapsulation layer LIL1-I (see FIG. 7H) in the first group process. The patterning of the second dummy layer D2-I may be performed in a manner similar to the patterning of the first dummy layer D1-I (see FIG. 7H) in the first group process. In the sixth etching process and the seventh etching process, the second mask pattern MP2 may be used as a mask.

The second lower inorganic encapsulation pattern LIL2 may be disposed to overlap the second light-emitting opening OP2-E. A portion of the second lower inorganic encapsulation pattern LIL2 may be disposed in the second partition opening OP2-P to cover the second light-emitting element ED2, and another portion of the second lower inorganic encapsulation pattern LIL2 may be disposed on the conductive partition PW and the first conductive layer CL1. On a plane, the second dummy pattern D2 may have a closed-line shape surrounding the second light-emitting region PXA-G (see FIG. 5).

In the seventh etching process, as the additional second dummy layer D2a-I is dry-etched together, a second additional dummy pattern D2a having a closed-line shape surrounding the second light-emitting region PXA-G (see FIG. 5) on a plane may be formed.

Figure 8J:
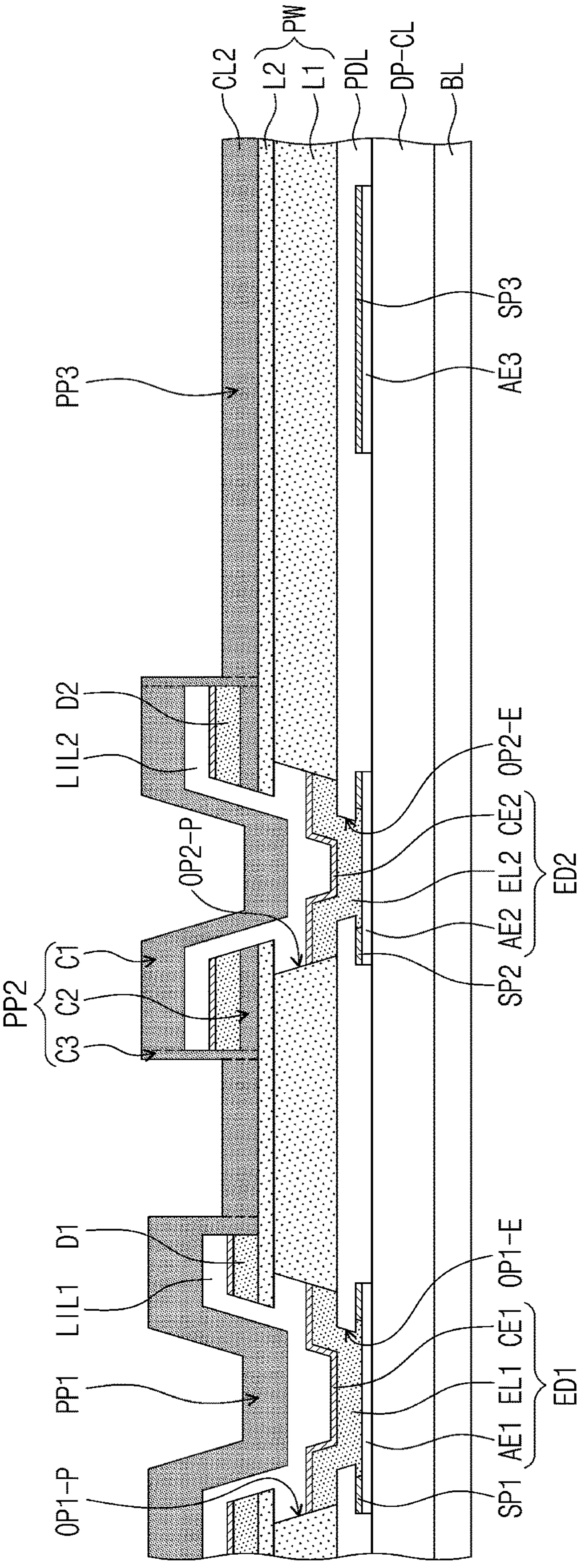

Referring to FIGS. 8I and 8J, the second group process according to this embodiment may include depositing a second conductive material so as to form a second conductive layer CL2 from the first conductive layer CL1 and the second mask pattern MP2. For example, the second conductive material may be deposited through a sputtering process, but the embodiment is not limited thereto.

In this embodiment, as the same material as that of the first conductive layer CL1 and the second mask pattern MP2 is deposited, the first conductive layer CL1, the second mask pattern MP2, and the newly deposited second conductive material may form the second conductive layer CL2. The second conductive layer CL2 may overlap all of the first to third anodes AE1, AE2, and AE3.

According to this embodiment, the outer side surface of the second dummy pattern D2 is exposed through the seventh etching process, but as the depositing of the second conductive material is included after the seventh etching process, the exposed outer side surface of the second dummy pattern D2 may be covered by the second conductive layer CL2. Accordingly, it is possible to prevent damage to the second dummy pattern D2 in a subsequent step of removing a photoresist layer.

In this embodiment, the second conductive layer CL2 may include a first cover portion PP1 covering the first dummy pattern D1 and the first lower inorganic encapsulation pattern LIL1, a second cover portion PP2 covering the second dummy pattern D2 and the second lower inorganic encapsulation pattern LIL2, and a third cover portion PP3 covering an upper surface of the conductive partition PW which is the remaining portion thereof excluding the first and second cover portions PP1 and PP2.

The first cover portion PP1 may include a first portion disposed on the first lower inorganic encapsulation pattern LIL1 and a second portion covering the outer side surface of the first dummy pattern D1. Damage to the first dummy pattern D1 may be prevented by the second portion of the first cover portion PP1. In this embodiment, the first cover portion PP1 may not be disposed between the conductive partition PW and the first dummy pattern D1. For example, the first dummy pattern D1 may be disposed to be in contact with the upper surface of the conductive partition PW.

The second cover portion PP2 may include a first portion C1 disposed on the second lower inorganic encapsulation pattern LIL2, a second portion C2 disposed between the conductive partition PW and the second dummy pattern D2, and a third portion C3 connecting the first portion C1 and the second portion C2 to each other and covering the outer side surface of the second dummy pattern D2. Damage to the second dummy pattern D2 may be prevented by the third portion C3 of the second cover portion PP2. In this embodiment, the second portion C2 may be disposed to be in contact with the upper surface of the conductive partition PW and the lower surface of the second dummy pattern D2.

After the second group process, a third group process may be performed. In this embodiment, a third light-emitting element ED3 (see FIG. 9H) and a third lower inorganic encapsulation pattern LIL3 (see FIG. 9H) covering the third light-emitting element ED3 (see FIG. 9H) may be formed through the third group process. Hereinafter, the third group process will be described with reference to FIGS. 9A to 9H.

Figure 9A:
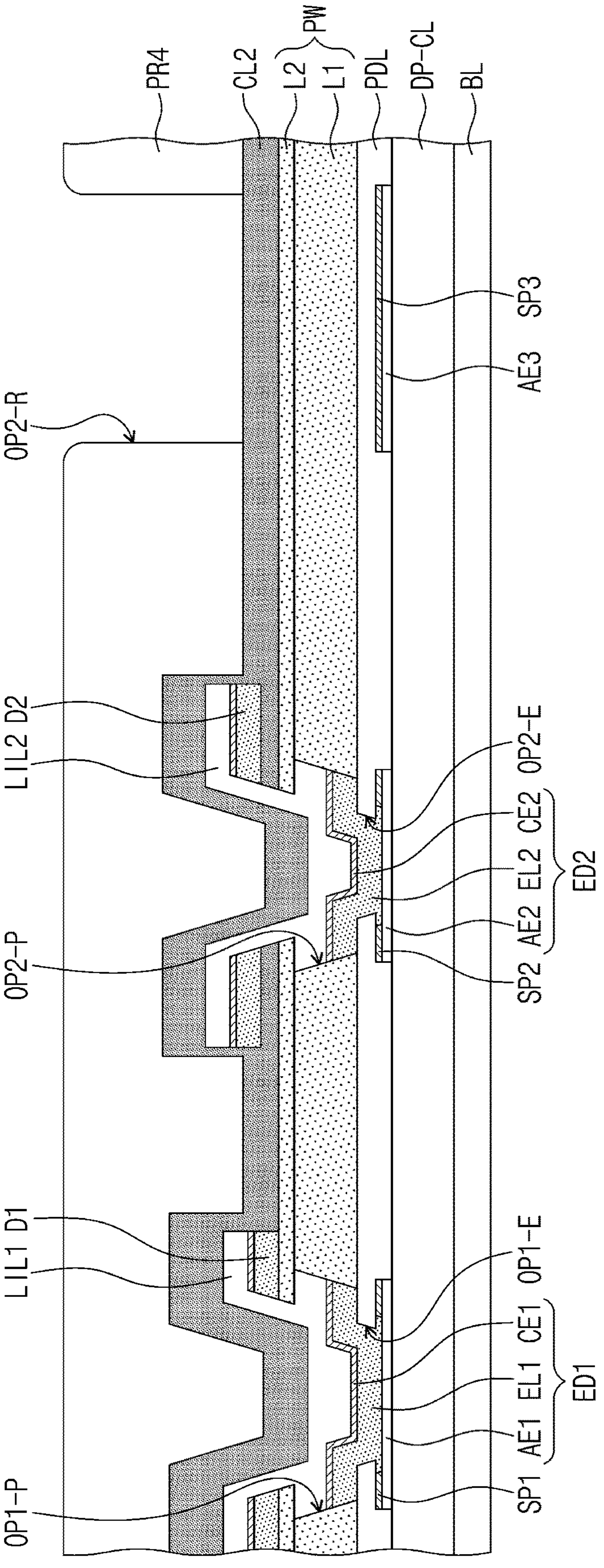
FIGS. 9A to 9J are schematic cross-sectional views illustrating steps of the method of manufacturing the display panel according to an embodiment.

Referring to FIG. 9A, the third group process according to this embodiment may include forming a fourth photoresist layer PR4 on the second conductive layer CL2. A second photo opening OP2-R overlapping the third anode AE3 may be defined in the fourth photoresist layer PR4.

Figure 9B:
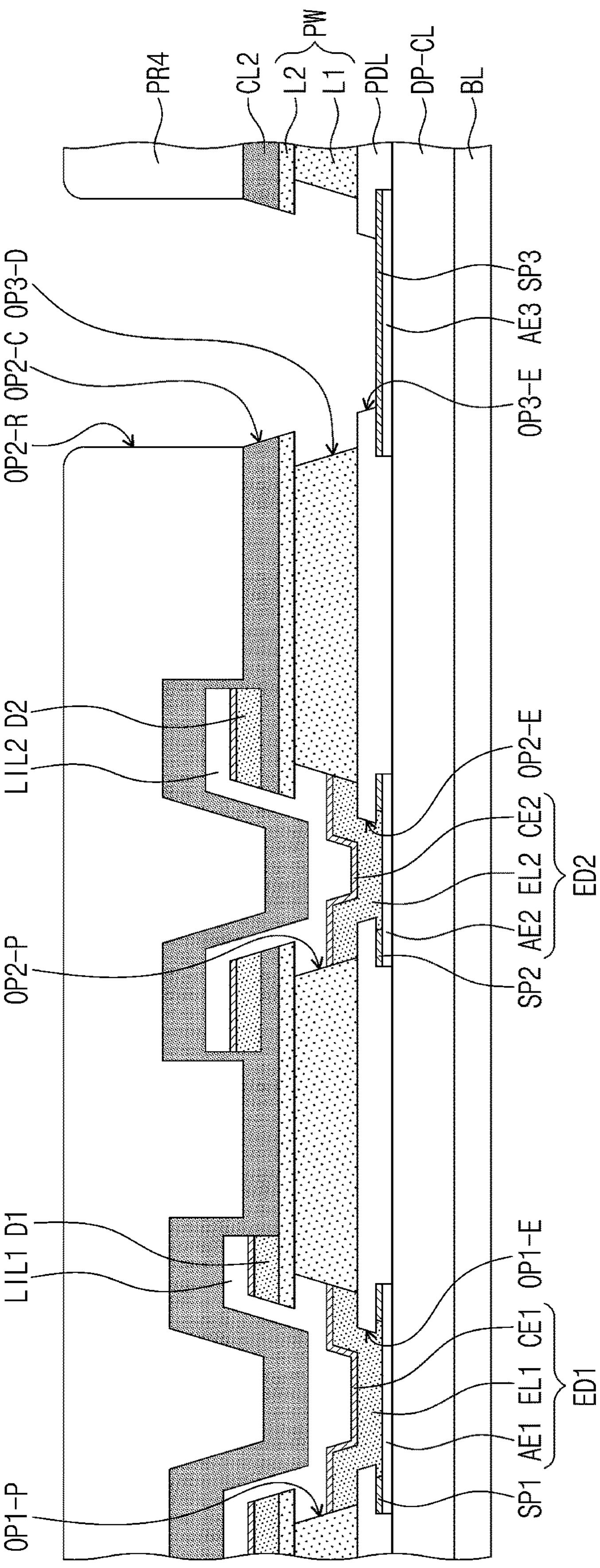

Referring to FIG. 9B, the third group process according to this embodiment may include forming a second conductive opening OP2-C in the second conductive layer CL2 through a first etching process. The forming of the second conductive opening OP2-C may be performed in a manner similar to the forming of the first conductive opening OP1-C (see FIG. 8B) in the second group process. The first etching process may use the fourth photoresist layer PR4 as a mask, and the second conductive opening OP2-C may correspond to the second photo opening OP2-R and overlap the third anode AE3.

Hereafter, the third group process according to this embodiment may include forming a third partition opening OP3-P in the conductive partition layer PW through a second etching process and forming a third light-emitting opening OP3-E in the pixel defining layer PDL through a third etching process.

The forming of the third partition opening OP3-P may be performed in a manner similar to the forming of the second partition opening OP2-P (see FIG. 8D) in the second group process. In this embodiment, the second etching process may include: forming a preliminary third partition opening in the conductive partition PW by using the fourth photoresist layer PR4 as a mask and dry-etching the first and second layers L1 and L2; and forming a third partition opening OP3-P from the preliminary third partition opening by using the fourth photoresist layer PR4 as a mask and wet-etching the first and second layers L1 and L2. The inner side surface of the conductive partition PW defining the third partition opening OP3-P may have an undercut shape on a cross section.

The forming of the third light-emitting opening OP3-E may be performed in a manner similar to the forming of the second light-emitting opening OP2-E (see FIG. 8D) in the second group process. The third etching process may be performed by using the fourth photoresist layer PR4 and the conductive partition PW (for example, the second layer L2) as a mask.

Figure 9C:
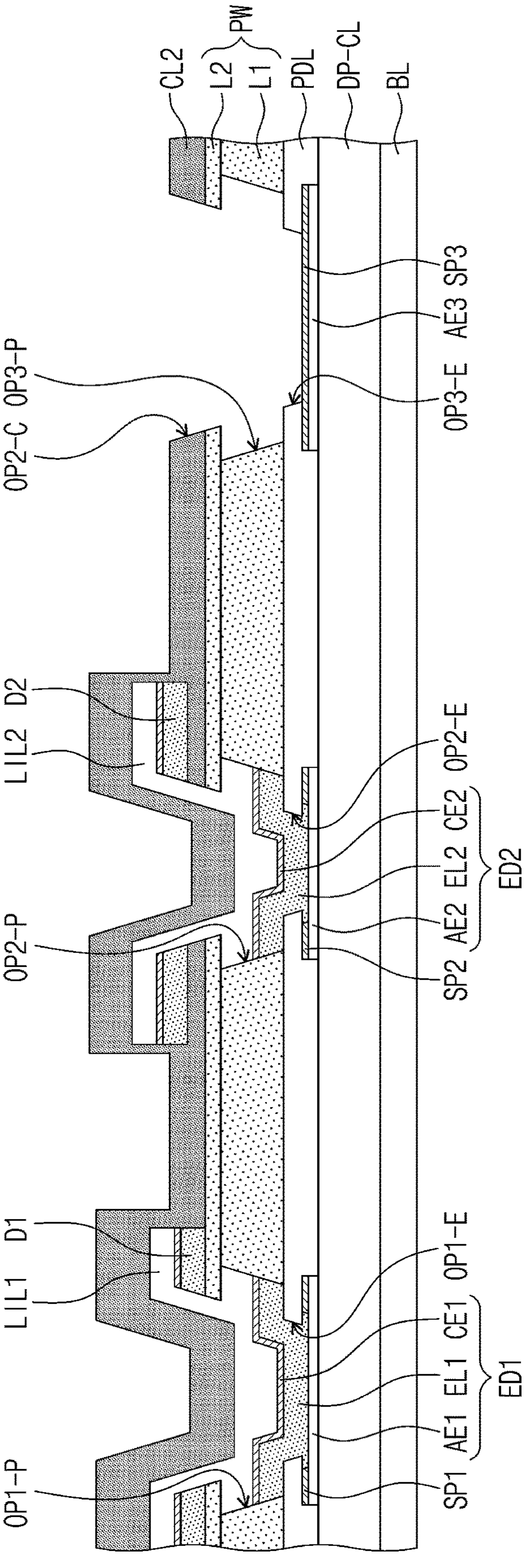

Referring to FIG. 9C, the third group process according to this embodiment may include removing the fourth photoresist layer PR4. In this embodiment, each of the outer side surface of the first dummy pattern D1 and the outer side surface of the second dummy pattern D2 may be provided in a state of being covered by the second conductive layer CL2, and therefore, the first and second dummy patterns D1 and D2 may be prevented from being damaged by a material injected to remove the fourth photoresist layer PR4. Accordingly, the lifting phenomenon of the first and second lower inorganic encapsulation patterns LIL1 and LIL2 may be prevented, and therefore, damage to the first and second light-emitting elements ED1 and ED2 may be prevented.

Figure 9D:
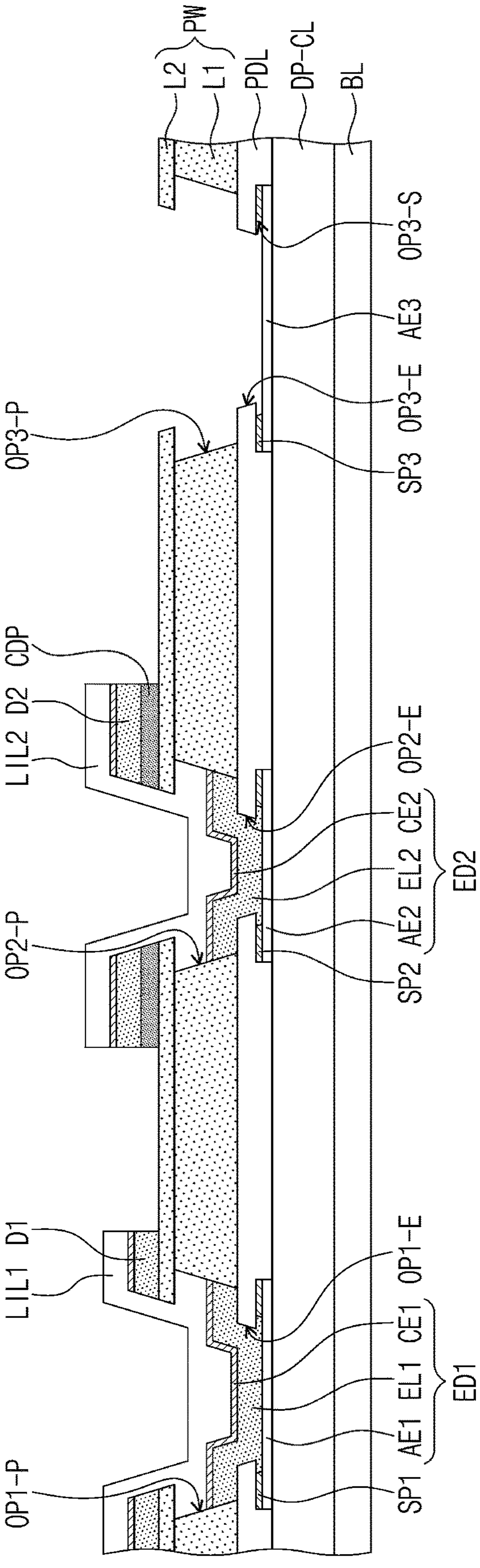

Referring to FIGS. 9C and 9D, the third group process according to this embodiment may include removing at least a portion of the second conductive layer CL2 through a fourth etching process. The fourth etching process may be performed by a wet etching method.

Referring to FIGS. 9C, 9D, and 8J together, in this embodiment, the first cover portion PP1, the first and third portions C1 and C3 of the second cover portion PP2, and the third cover portion PP3 among the second conductive layer CL2 may be removed. For example, the second portion C2 of the second cover portion PP2 among the second conductive layer CL2 may not be removed because it is covered by the second dummy pattern D2 and the second lower inorganic encapsulation pattern LIL2. The second portion C2 remaining after the fourth etching process may form a conductive pattern CDP.

In this embodiment, the patterning of a third sacrificial pattern SP3 may be performed together through the fourth etching process. A third sacrificial opening OP3-S may be formed in the third sacrificial pattern SP3 so as to expose at least a portion of the third anode AE3. The etching process of the third sacrificial pattern SP3 may use the conductive partition PW (for example, the second layer L2) as a mask.

Compared to the second group process, the third group process may include removing the second conductive layer CL2 after the forming of the third light-emitting opening OP3-E in order to minimize the residue of the second conductive material remaining in a final product.

As the third sacrificial pattern SP3 including a transparent conductive oxide may be etched simultaneously with the second conductive material, the forming of the third sacrificial opening OP3-S may be performed simultaneously with the removing of the second conductive layer CL2 so that the process may be relatively simplified.

Figure 9E:
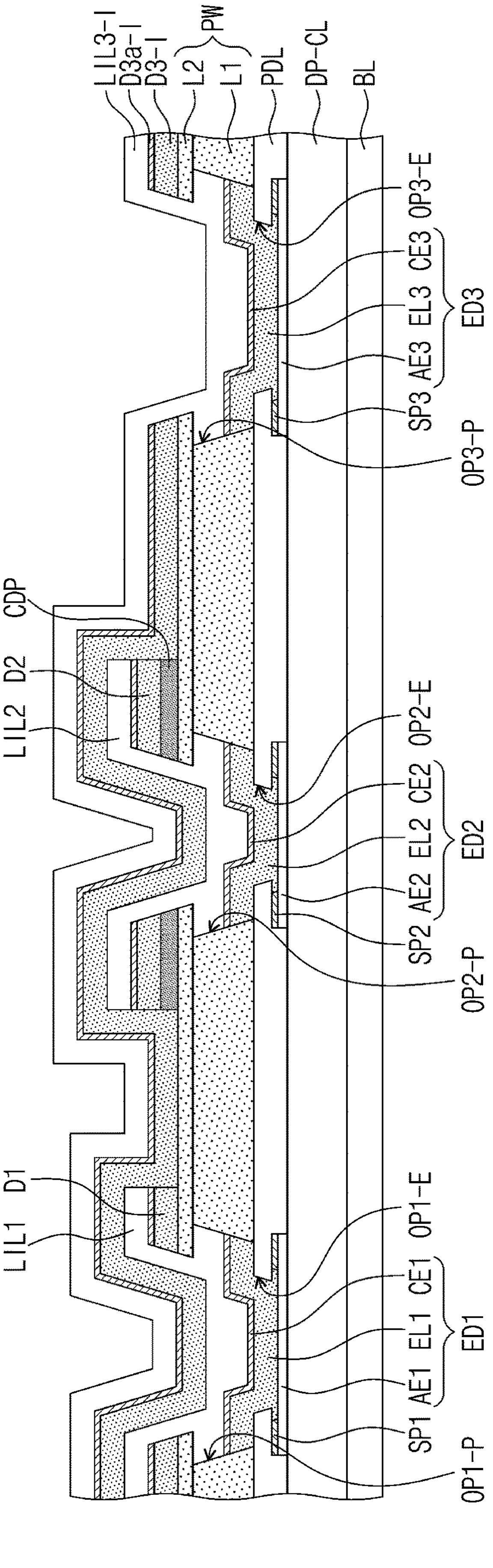

Referring to FIG. 9E, the third group process according to this embodiment may include depositing a third organic material so as to form a third light-emitting pattern EL3, depositing a first conductive material so as to form a third cathode CE3, and forming a preliminary third lower inorganic encapsulation layer LIL3-I.

The depositing of the third organic material may be performed in a manner similar to the depositing of the first organic material so as to form the first light-emitting pattern EL1 (see FIG. 7E) in the first group process. The depositing of the first conductive material so as to form the third cathode CE3 may be performed in a manner similar to the depositing of the first conductive material so as to form the first cathode CE1 (see FIG. 7E) in the first group process. The preliminary third lower inorganic encapsulation layer LIL3-I may be formed in a manner similar to the forming of the preliminary first lower inorganic encapsulation layer LIL1-I (see FIG. 7E) in the first group process.

In the depositing of the third organic material, a third dummy layer D3-I spaced apart from the third light-emitting pattern EL3 may be formed together. In the depositing of the first conductive material, an additional third dummy layer D3*a*-I spaced apart from the third cathode CE3 may be formed together. In the third group process, the third dummy layer D3-I and the additional third dummy layer D3*a*-I may be disposed on the conductive partition PW and cover the first dummy pattern D1, the first lower inorganic encapsulation pattern LIL1, the second dummy pattern D2, and the second lower inorganic encapsulation pattern LIL2.

Figure 9F:
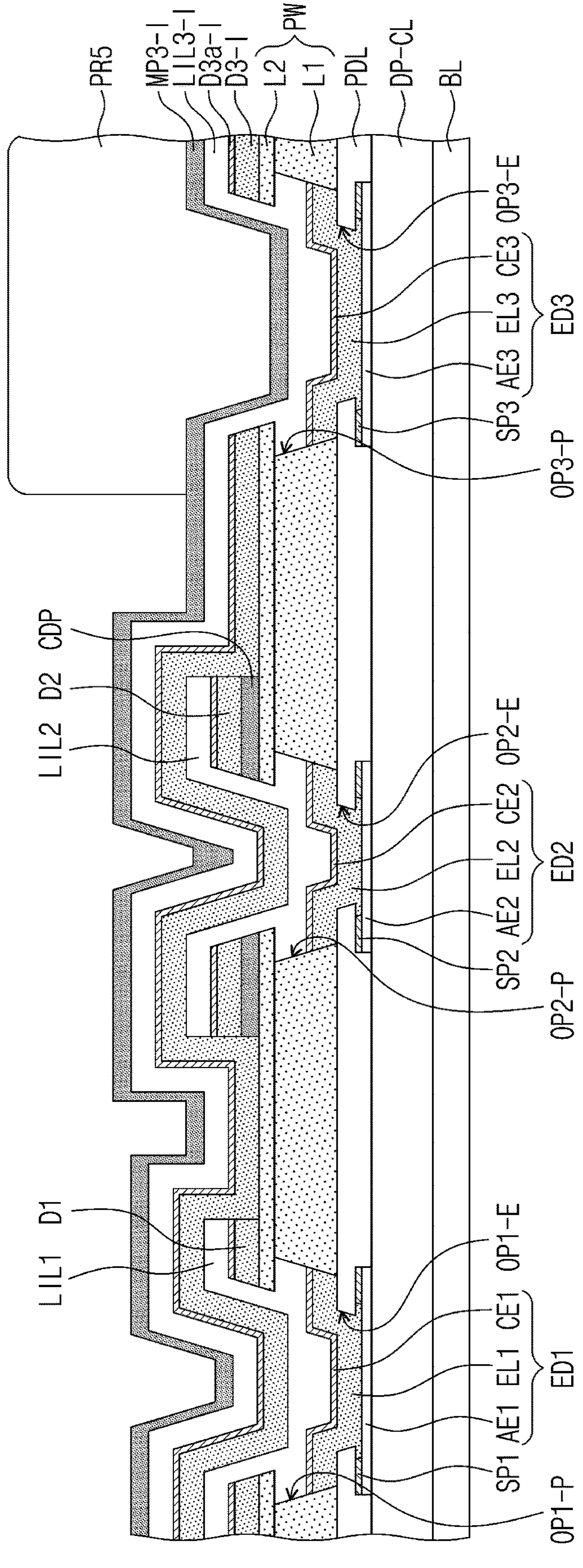
Figure 9G:
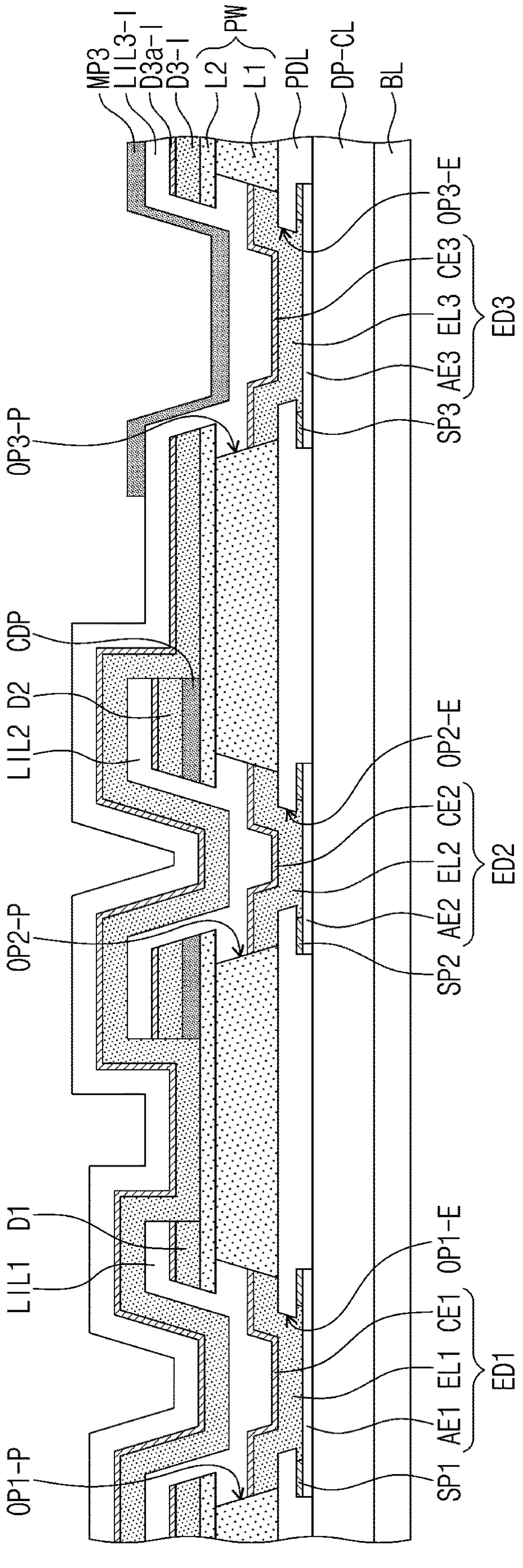

Referring to FIGS. 9F and 9G, the third group process according to this embodiment may include forming a third mask pattern MP3. The forming of the third mask pattern MP3 may include forming a preliminary third mask layer MP3-I on the preliminary third lower inorganic encapsulation layer LIL3-I, forming a fifth photoresist layer PR5 on the preliminary third mask layer MP3-I, forming a third mask pattern MP3 from the preliminary third mask layer MP3-I, and removing the fifth photoresist layer PR5.

First, as illustrated in FIG. 9F, the preliminary third mask layer MP3-I may include a second conductive material and be formed in a manner similar to the forming of the preliminary first mask layer MP1-I (see FIG. 7F) in the first group process.

The fifth photoresist layer PR5 may be formed as a pattern overlapping the third light-emitting opening OP3-E in a manner similar to the forming of the first photoresist layer PR1 (see FIG. 7F) in the first group process.

Hereafter, as illustrated in FIG. 9G, a third mask pattern MP3 may be formed from the preliminary third mask layer MP3-I through a fifth etching process. The forming of the third mask pattern MP3 may be performed in a manner similar to the forming of the first mask pattern MP1 (see FIG. 7G) in the first group process. As a portion of the preliminary third mask layer MP3-I overlapping the first and second anodes AE1 and AE2 is removed, the third mask pattern MP3 may be formed as a pattern overlapping the third light-emitting opening OP3-E. Hereafter, the fifth photoresist layer PR5 may be removed.

Figure 9H:
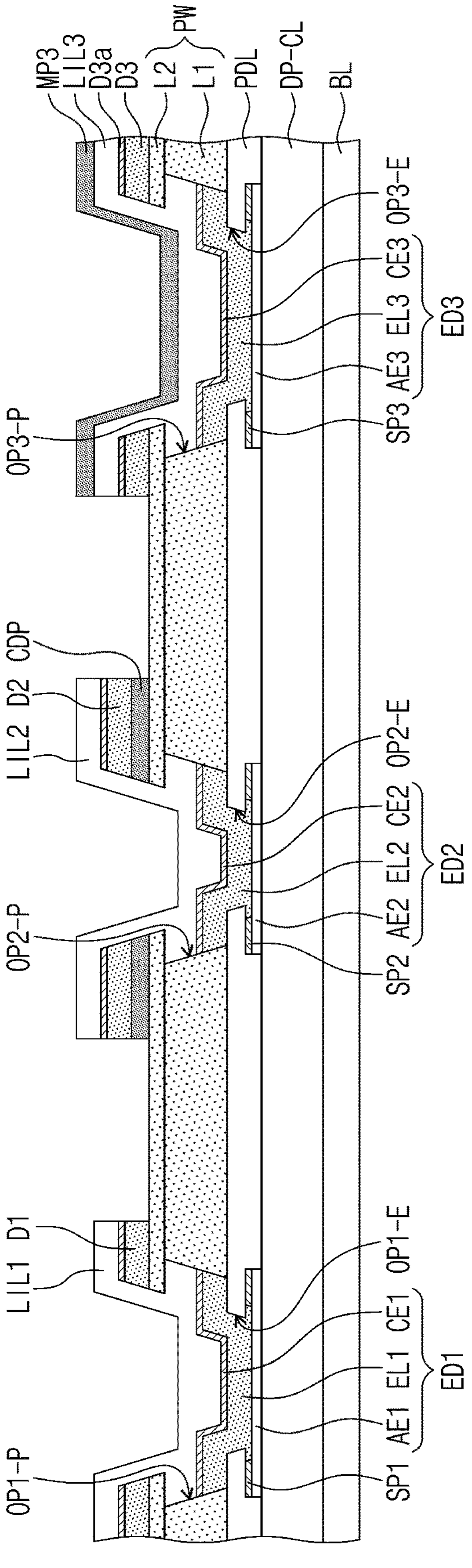

Referring to FIGS. 9G and 9H, the third group process according to this embodiment may include patterning the preliminary third lower inorganic encapsulation layer LIL3-I through a sixth etching process and patterning the third dummy layer D3-I through a seventh etching process. Through the sixth etching process, the third lower inorganic encapsulation pattern LIL3 may be formed from the preliminary third lower inorganic encapsulation layer LIL3-I, and through the seventh etching process, the third dummy pattern D3 may be formed from the third dummy layer D3-I.

The patterning of the preliminary third lower inorganic encapsulation layer LIL3-I may be formed in a manner similar to the patterning of the preliminary first lower inorganic encapsulation layer LIL1-I (see FIG. 7H) in the first group process. The patterning of the third dummy layer D3-I may be performed in a manner similar to the patterning of the first dummy layer D1-I (see FIG. 7H) in the first group process. In the sixth etching process and the seventh etching process, the third mask pattern MP3 may be used as a mask.

The third lower inorganic encapsulation pattern LIL3 may be disposed to overlap the third light-emitting opening OP3-E. A portion of the third lower inorganic encapsulation pattern LIL3 may be disposed in the third partition opening OP3-P to cover the third light-emitting element ED3, and another portion of the third lower inorganic encapsulation pattern LIL3 may be disposed on the conductive partition PW. On a plane, the third dummy pattern D3 may have a closed-line shape surrounding the third light-emitting region PXA-B (see FIG. 5).

In the seventh etching process, as the additional third dummy layer D3*a*-I is dry-etched together, a third additional dummy pattern having a closed-line shape surrounding the third light-emitting region PXA-B (see FIG. 5) on a plane (D3*a*) may be formed.

Figure 9I:
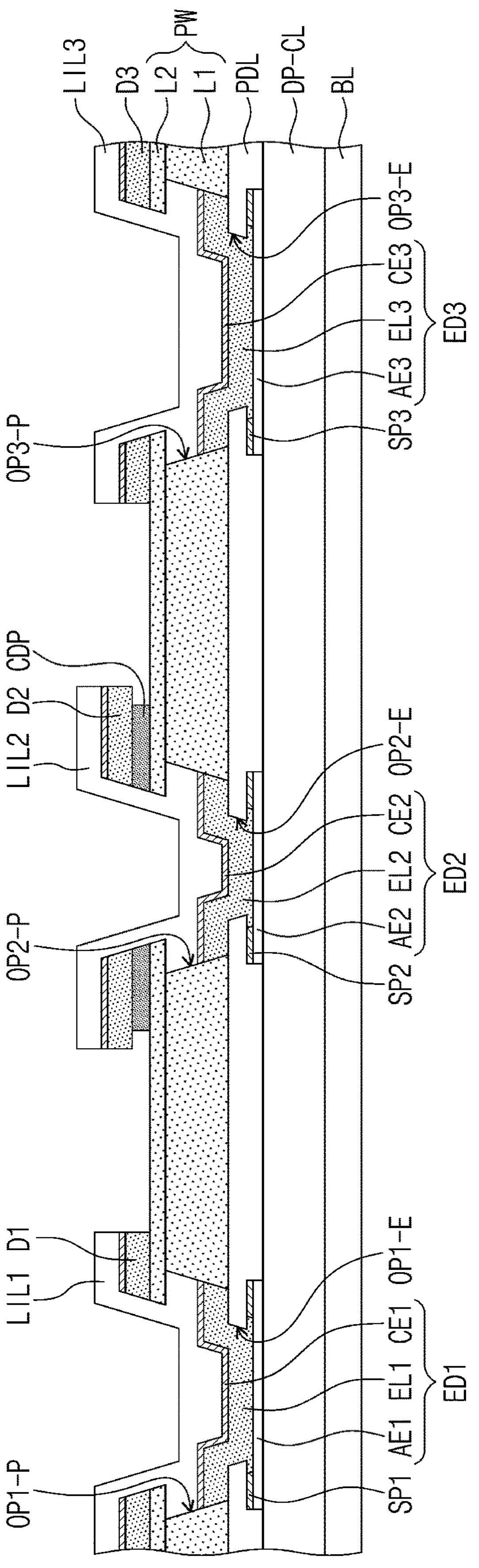

Referring to FIGS. 9H and 9I, the third group process according to this embodiment may include removing the third mask pattern MP3 through an eighth etching process. The eighth etching process may be performed by a wet etching method.

In an embodiment, since the conductive pattern CDP may include the same material as the third mask pattern MP3, a portion of the conductive pattern CDP may be removed together with the third mask pattern MP3 during the eighth etching process. For example, as the outer side portion of the conductive pattern CDP is exposed from the second dummy pattern D2, the outer side portion of the conductive pattern CDP may be partially removed. Accordingly, the outer side surface of the conductive pattern CDP may be disposed closer to the center of the second anode AE2 than the outer side surface of the second dummy pattern D2. The embodiment is not limited thereto, and the conductive pattern CDP may not be removed during the eighth etching process.

Through the first to third group processes, the first to third light-emitting elements ED1, ED2, and ED3 and the first to third lower inorganic encapsulation patterns LIL1, LIL2, and LIL3 may be formed. Hereafter, a fourth group process may be performed, and the display panel DP (see FIG. 9J) including a thin film encapsulation layer TFE (see FIG. 9J) may be completed through the fourth group process.

Figure 9J:
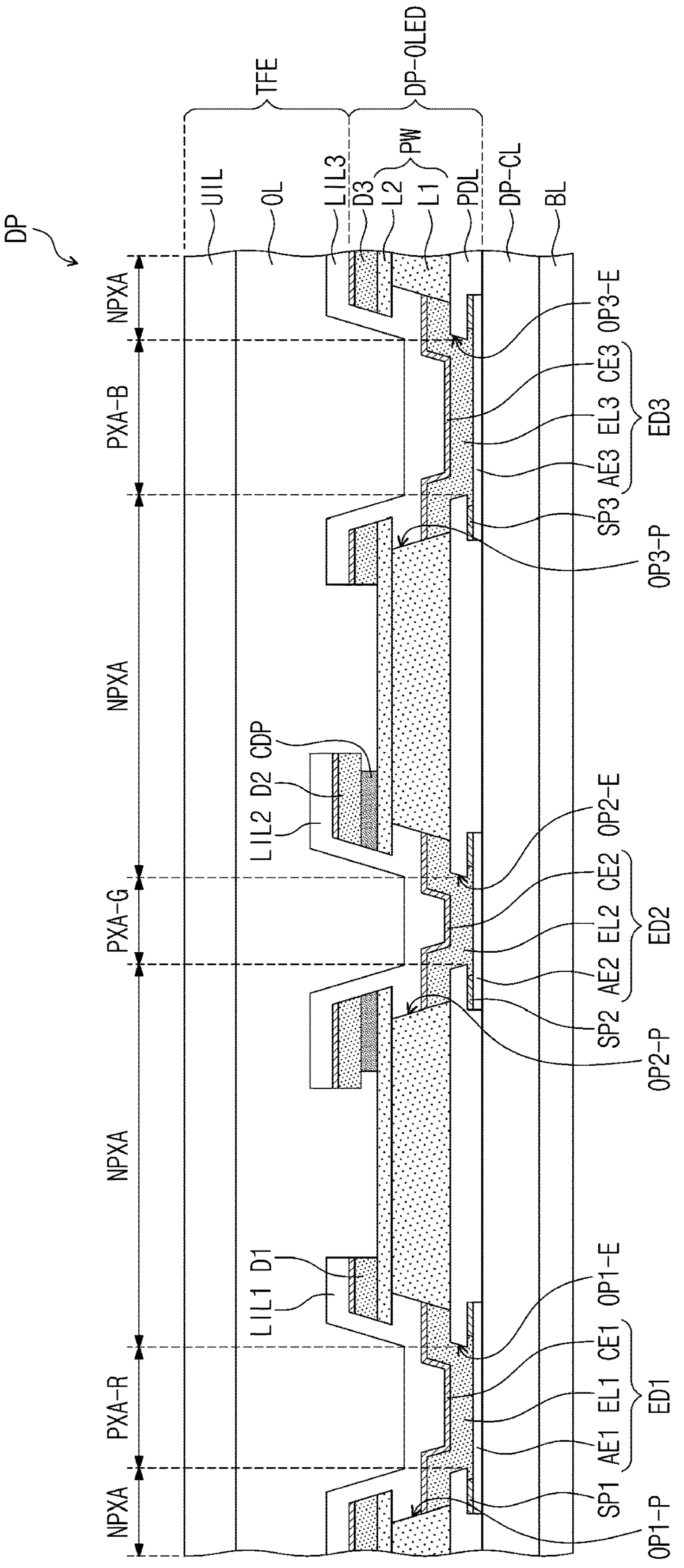

Referring to FIG. 9J, the fourth group process according to this embodiment may include forming an organic encapsulation layer OL on the conductive partition PW and the first to third lower inorganic encapsulation patterns LIL1, LIL2, and LIL3 and forming an upper inorganic encapsulation layer UIL on the organic encapsulation layer OL. Through this, the display panel DP including a base layer BL, a circuit element layer DP-CL, a display element layer DP-OLED, and a thin film encapsulation layer TFE may be formed.

FIGS. 10A to 10I are schematic cross-sectional views illustrating steps of the method of manufacturing the display panel according to an embodiment. According to the method of manufacturing the display panel according to this embodiment, no residue of the second conductive material used during the manufacturing process may be left. Hereinafter, a detailed description will be given with reference to FIGS. 10A to 10I. Same/similar reference numerals will be used for the same/similar elements as those described in FIGS. 7A to 9J, duplicate descriptions may be omitted, and differences will be described.

Figure 10A:
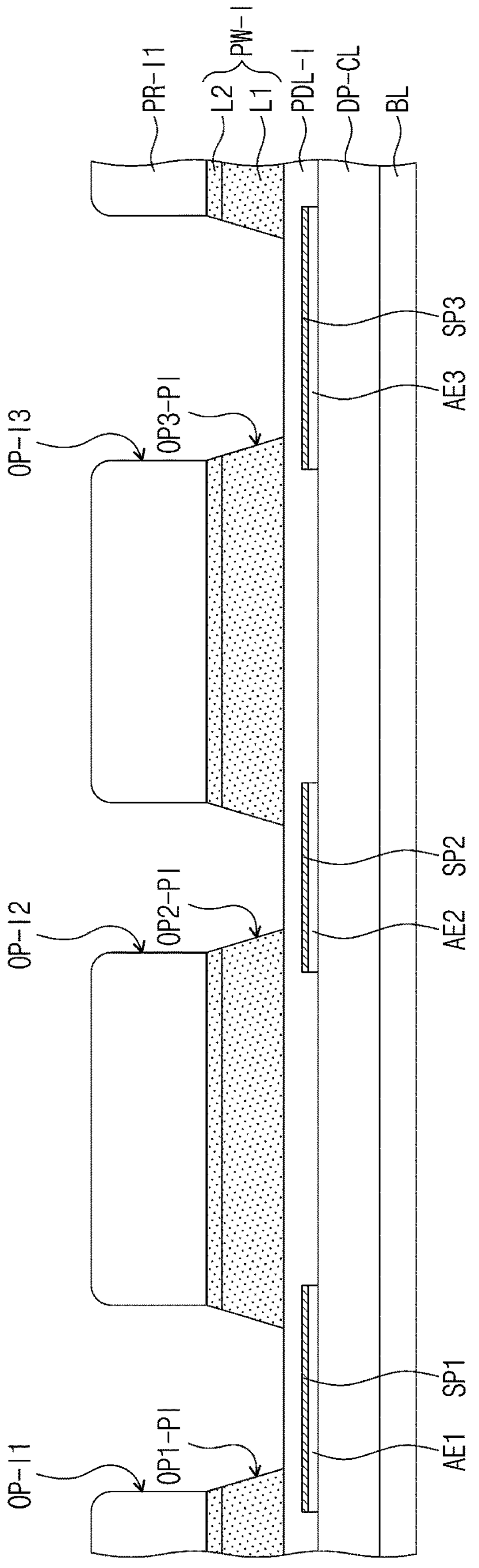
FIGS. 10A to 10I are schematic cross-sectional views illustrating steps of the method of manufacturing the display panel according to an embodiment.
Figure 10B:
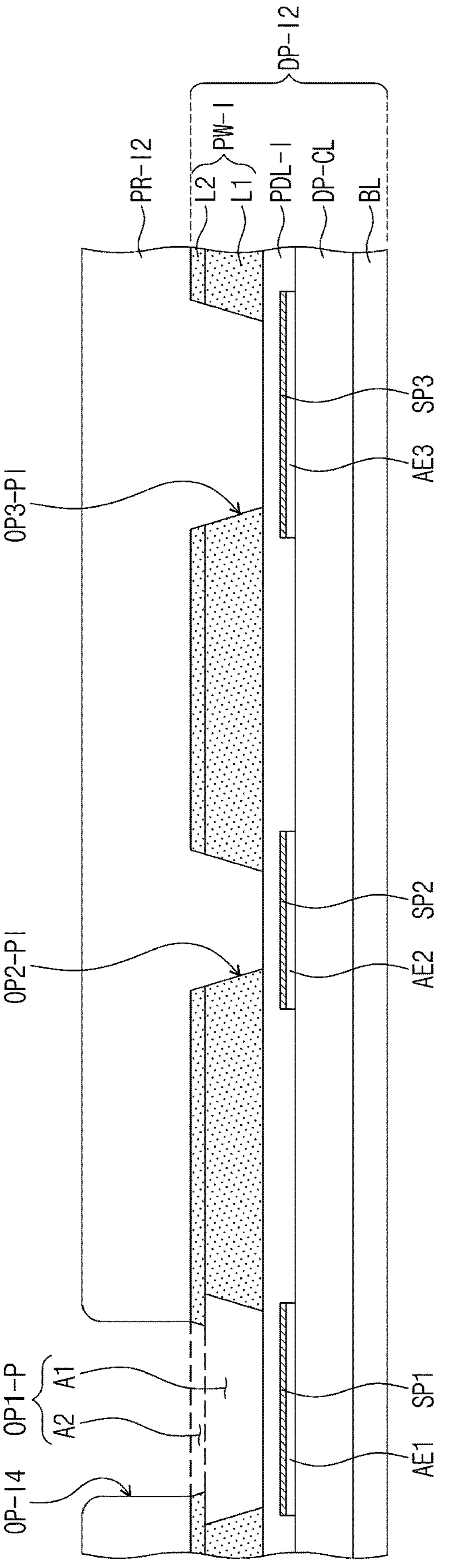

Referring to FIGS. 10A and 10B, differences in the first group process compared to the embodiment described above in FIGS. 7A to 7J will be described.

First, referring to FIG. 10A, the first group process according to this embodiment may include forming a first initial photoresist layer PR-I1 on the preliminary first display panel DP-I1 (see FIG. 7A). In the first initial photoresist layer PR-I1, first to third initial openings OP-I1, OP-I2, and OP-I3 respectively overlapping the first to third anodes AE1, AE2, and AE3 may be defined.

Hereafter, the first group process according to this embodiment may include forming preliminary first to third partition openings OP1-PI, OP2-PI, and OP3-PI on the preliminary conductive partition layer PW-I.

A 1-1st etching process may be performed by a dry etching method by using the first initial photoresist layer PR-I1 as a mask. The dry etching of the 1-1st etching process may be performed in an etching environment in which the etching selectivities of the first layer L1 and the second layer L2 are substantially the same as each other. Accordingly, the inner side surface of the first layer L1 and the inner side surface of the second layer L2 respectively defining the preliminary first to third partition openings OP1-PI, OP2-PI, and OP3-PI may be substantially aligned with each other.

Referring to FIGS. 10A and 10B, the first group process according to this embodiment may include removing the first initial photoresist layer PR-I1 and forming a second initial photoresist layer PR-I2. A fourth initial opening OP-I4 corresponding to the preliminary first partition opening OP1-PI may be defined in the second initial photoresist layer PR-I2.

The first group process according to this embodiment may include forming a first partition opening OP1-P from the preliminary first partition opening OP1-PI through a 1-2nd etching process.

The 1-2nd etching process may be performed by a wet etching method by using the second initial photoresist layer PR-I2 as a mask. The wet etching of the 1-2nd etching process may be performed in an environment in which the etching selectivity between the first layer L1 and the second layer L2 is high. Accordingly, the inner side surface of the first layer L1 defining the first region A1 of the first partition opening OP1-P may be formed to be recessed more inward than the inner side surface of the second layer L2 defining the second region A2 of the first partition opening OP1-P, and a tip portion may be formed in the conductive partition PW.

According to this embodiment, the preliminary first to third partition openings OP1-PI, OP2-PI, and OP3-PI may be simultaneously formed by using one photoresist layer. Accordingly, the preliminary second display panel DP-I2 according to this embodiment may include a base layer BL, a circuit element layer DP-CL, first to third anodes AE1, AE2, and AE3, a pixel defining layer PDL having a first light-emitting opening OP1-E defined therein, and a conductive partition PW having a first partition opening OP1-P and preliminary second and third partition openings OP2-PI and OP3-PI defined therein.

Referring to FIGS. 10C to 10G, differences in the second group process compared to the embodiment described above in FIGS. 8A to 8J will be described.

Figure 10C:
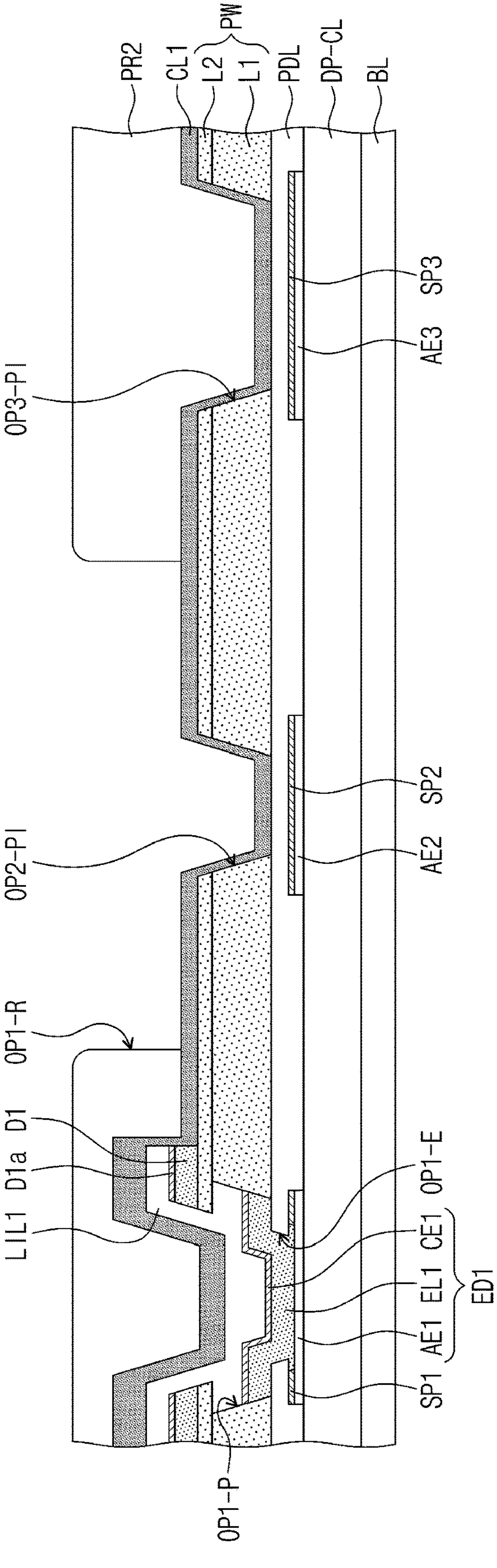

FIG. 10C illustrates forming a second photoresist layer PR2 on the first conductive layer CL1 during the second group process. A first photo opening OP1-R overlapping the second anode AE2 may be defined in the second photoresist layer PR2.

In this embodiment, the second photoresist layer PR2 may expose a portion of the first conductive layer CL1 disposed on the upper surface of the conductive partition PW through the first photo opening OP1-R.

Figure 10D:
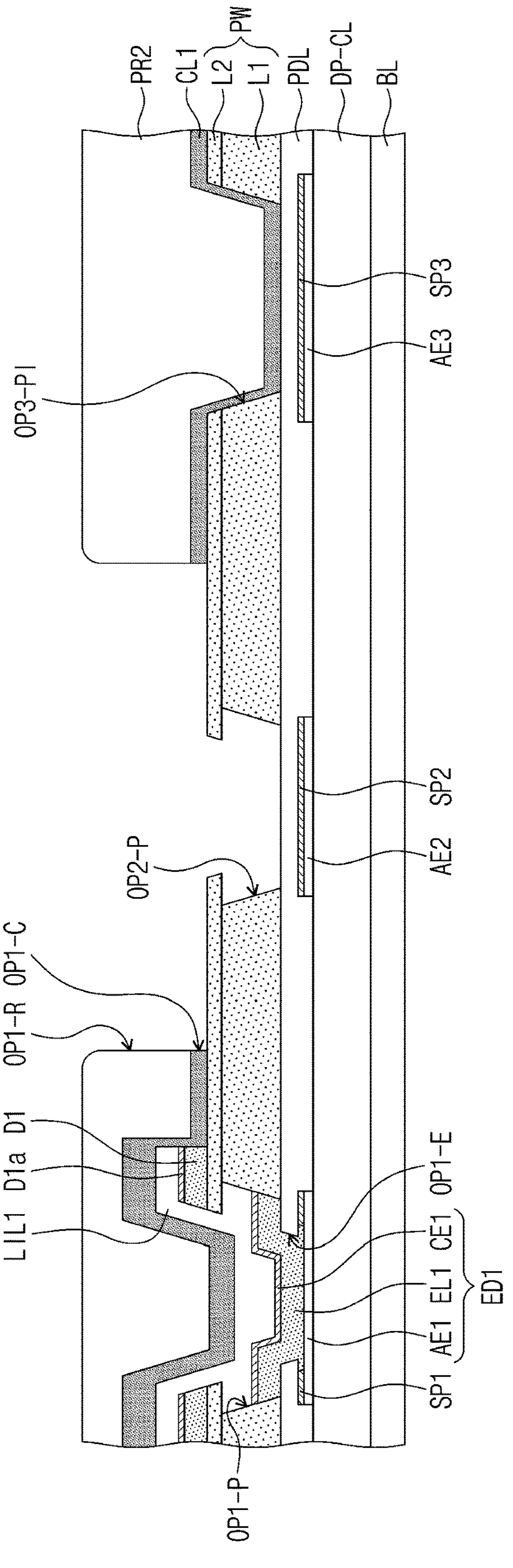

In the second group process, FIG. 10D illustrates forming a first conductive opening OP1-C in the first conductive layer CL1 through the first etching process and forming a second partition opening OP2-P in the conductive partition PW through the second etching process.

In this embodiment, a portion of the upper surface of the conductive partition PW may be exposed from the first conductive layer CL1 through the first conductive opening OP1-C.

According to this embodiment, in the forming of the second partition opening OP2-P in the conductive partition PW, as the preliminary second partition opening OP2-PI is provided to the conductive partition PW in a state in which the preliminary second partition opening OP2-PI has been formed in the conductive partition PW, the second etching process may be performed only through a wet etching process of the conductive partition PW. The second partition opening OP2-P may be formed from the preliminary second partition opening OP2-PI through the wet etching process of the conductive partition PW.

Figure 10E:
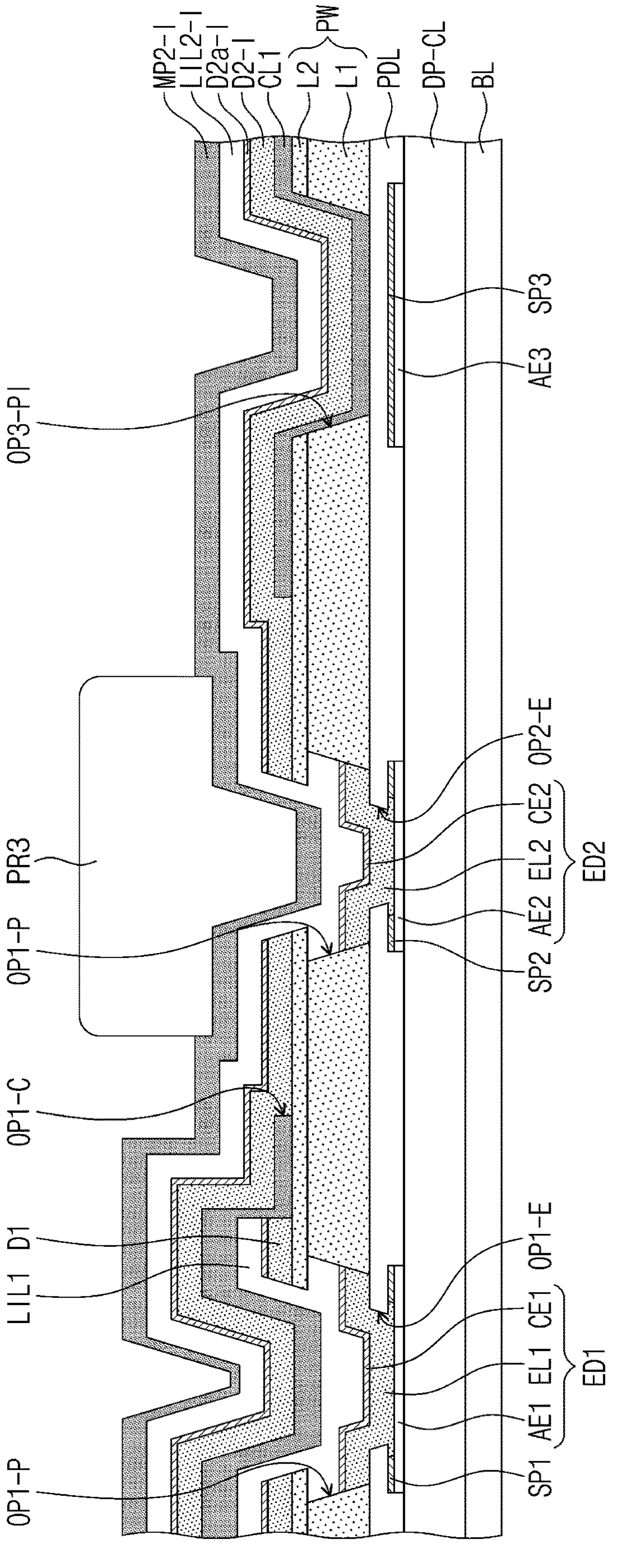
Figure 10F:
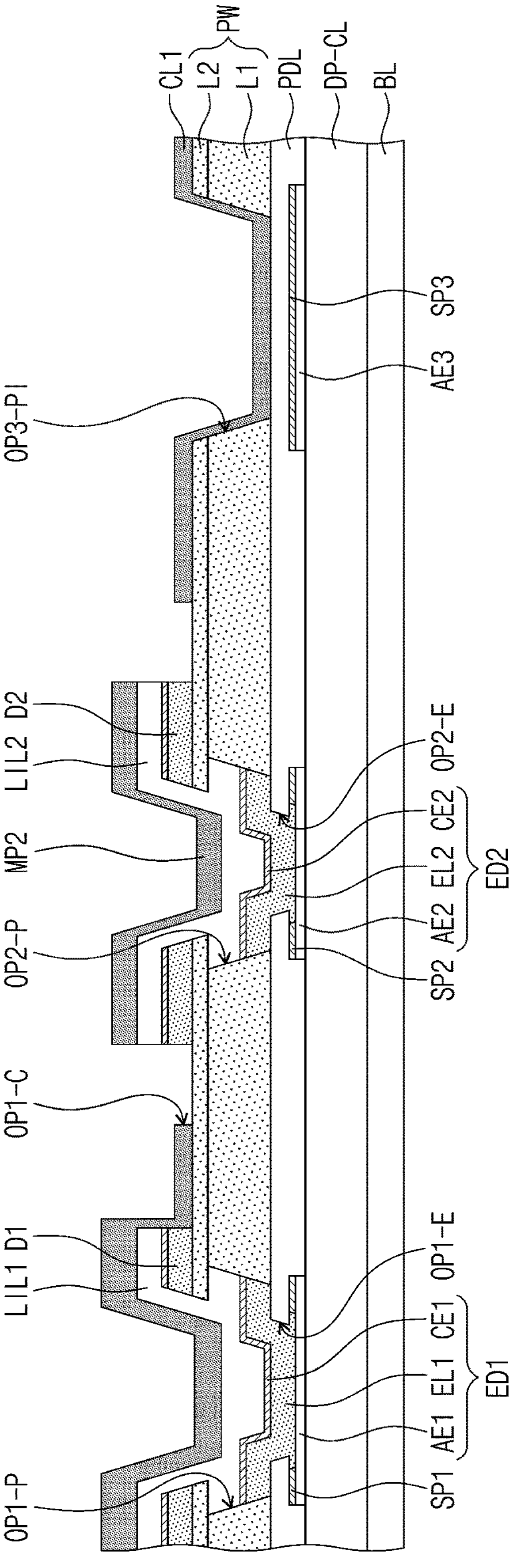

FIGS. 10E and 10F illustrate forming a second mask pattern MP2, patterning a preliminary second lower inorganic encapsulation layer LIL2-I, and patterning a second dummy layer D2-I in the second group process.

The forming of the second mask pattern MP2 may include forming a preliminary second mask layer MP2-I, forming a third photoresist layer PR3, forming a second mask pattern MP2 from the preliminary second mask layer MP2-I, and removing the third photoresist layer PR3.

As illustrated in FIG. 10E, in this embodiment, the third photoresist layer PR3 may entirely overlap the first conductive opening OP1-C. For example, the third photoresist layer PR3 may be formed to non-overlap the first conductive layer CL1 on a plane. Accordingly, as illustrated in FIG. 10F, the second mask pattern MP2 according to this embodiment may be formed to non-overlap the first conductive layer CL1 on a plane.

In the patterning of the second dummy layer D2-I, a second dummy pattern D2 may be formed from the second dummy layer D2-I, the first conductive layer CL1 may not be disposed below the second dummy pattern D2, and the second dummy pattern D2 may be entirely in contact with the upper surface of the conductive partition PW.

Figure 10G:
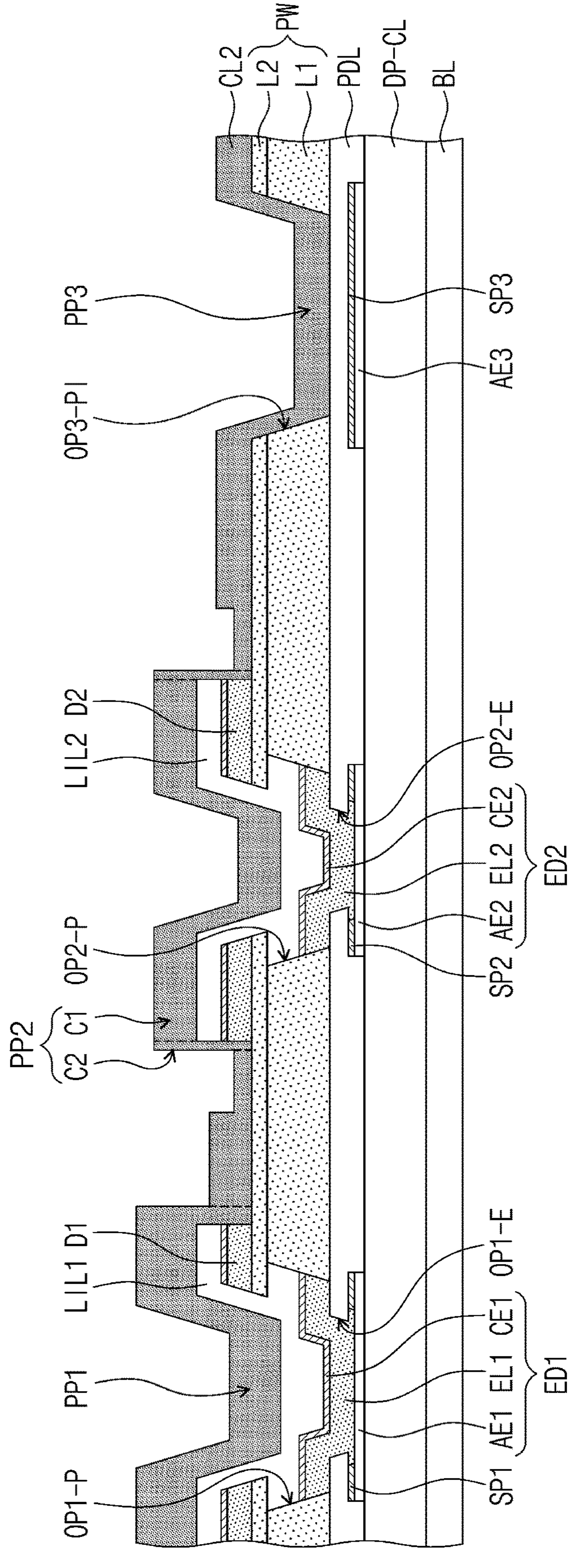

FIGS. 10F and 10G illustrate depositing a second conductive material in the second group process so as to form a second conductive layer CL2 from the second mask pattern MP2.

The second conductive layer CL2 may include: a first cover portion PP1 covering the first dummy pattern D1 and the first lower inorganic encapsulation pattern LIL1; a second cover portion PP2 covering the second dummy pattern D2 and the second lower inorganic encapsulation pattern LIL2; and a third cover portion PP3 covering the upper surface of the conductive partition PW, the inner side surface thereof defining the preliminary third partition opening OP3-PI, and the upper surface of the pixel defining layer PDL exposed through the preliminary third partition opening OP3-PI, which are the remaining portions thereof excluding the first and second cover portions PP1 and PP2.

In this embodiment, the second cover portion PP2 may include a first portion C1 disposed on the second lower inorganic encapsulation pattern LIL2 and a second portion C2 covering the outer side surface of the second dummy pattern D2. The second cover portion PP2 of FIG. 10G may not include a third portion C3 (see FIG. 8J) in case that compared to the second cover portion PP2 of FIG. 8J. For example, the second cover portion PP2 may not be disposed below the second dummy pattern D2.

Figure 10H:
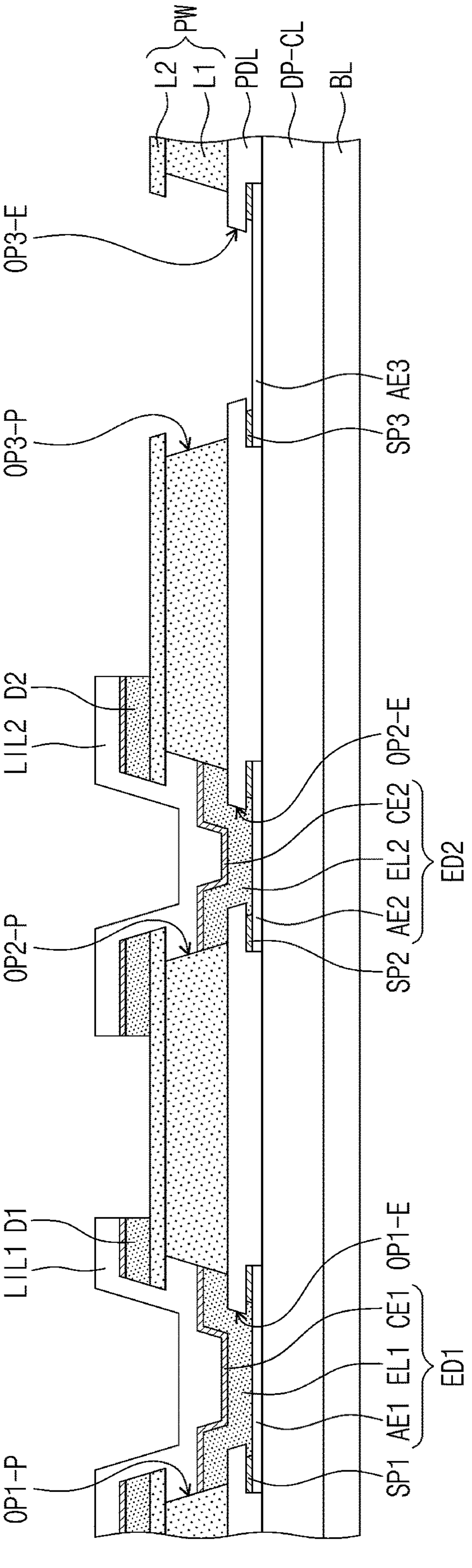

Referring to FIG. 10H, differences in the third group process compared to the embodiment described above in FIGS. 9A to 9I will be described. FIG. 10H illustrates removing at least a portion of the second conductive layer CL2 (see FIG. 10G) through the fourth etching process in third group process. In this embodiment, as the second conductive layer CL2 (see FIG. 10G) may not be disposed below the second dummy pattern D2, the second conductive layer CL2 (see FIG. 10G) may be entirely removed.

Figure 10I:
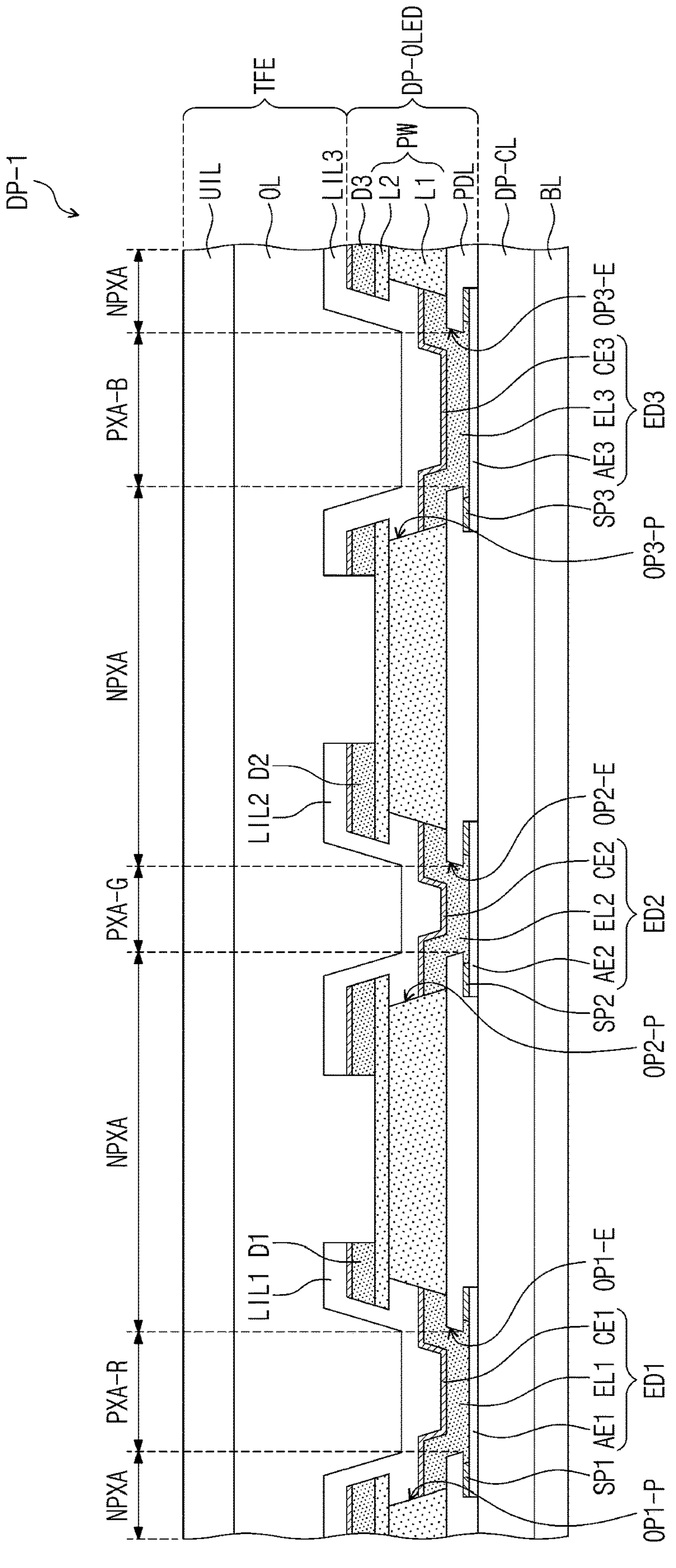

FIG. 10I illustrates a display panel DP-1 completed through the fourth group process. As illustrated in FIG. 10I, according to this embodiment, the second conductive material may not remain in the display panel DP-1 that has been manufactured.

Also in this embodiment, as the outer side surfaces of the first to third dummy patterns D1, D2, and D3 may not be exposed during the process of removing the photoresist layer, it is possible to prevent the first to third dummy patterns D1, D2, and D3 from being damaged during the process. Accordingly, the lifting phenomenon of the first to third lower inorganic encapsulation patterns LIL1, LIL2, and LIL3 may be prevented, and therefore, it is possible to provide the display panel DP-1 including the first to third light-emitting elements ED1, ED2, and ED3 with improved process reliability.

In an embodiment, the descriptions given above with reference to FIGS. 7A to 7J may be applied to the first process group, and the descriptions given above with reference to FIGS. 10C to 10I may be applied to the second to fourth process groups. By way of example, the descriptions given above with reference to FIGS. 10A and 10B may be applied to the first process group, and the descriptions given above with reference to FIGS. 8A to 9J may be applied to the second to fourth process groups.

According to the disclosure, since a light-emitting layer may be patterned without a metal mask, the display panel having improved process reliability and capable of readily implementing high resolution may be provided.

According to the disclosure, the lifting phenomenon of an inorganic encapsulation pattern may be prevented by preventing damage to an organic pattern disposed below the inorganic encapsulation pattern. Through this, it is possible to prevent the inflow of foreign matter such as moisture and to provide light-emitting elements with improved process reliability and reduced defects and a display panel including the same.

According to the disclosure, it is possible to provide a method for manufacturing the display panel including light-emitting elements which may readily implement high resolution and have improved process reliability.

Although the above has been described with reference to embodiments, those skilled in the art or those having ordinary knowledge in the art will appreciate the spirit and technical scope of the disclosure and as described in the claims to be described later. It will be understood that the disclosure can be variously modified and changed within the scope of the disclosure. Therefore, the technical scope of the disclosure is not limited to the contents described in the detailed description of the specification, but should also be determined by the claims.

What is claimed is:

1. A method for manufacturing a display panel, the method comprising:

providing a preliminary display panel comprising a base layer, a first anode disposed above the base layer, a pixel defining layer disposed above the base layer and including a first light-emitting opening and exposing a portion of the first anode, and a conductive partition disposed on the pixel defining layer and including a first partition opening and corresponding to the first light-emitting opening;

depositing a first organic material to form a first light-emitting pattern at least partially disposed in the first light-emitting opening and the first partition opening and a first dummy layer spaced apart from the first light-emitting pattern and disposed on the conductive partition;

depositing a first conductive material to form a first cathode at least partially disposed in the first partition opening;

forming a first mask pattern overlapping the first light-emitting opening in a plan view and comprising a second conductive material, on the conductive partition;

patterning the first dummy layer by the first mask pattern to form a first dummy pattern from the first dummy layer; and depositing the second conductive material to form a first conductive layer from the first mask pattern, wherein in the depositing of the second conductive material, the first conductive layer covers an outer side surface of the first dummy pattern.

2. The method of claim 1, further comprises:

forming a first photoresist layer overlapping the first light-emitting opening in a plan view after the depositing of the first conductive material to form the first cathode and before the forming of the first mask pattern; and removing the first photoresist layer after the forming of the first mask pattern and before the etching of the first dummy layer, wherein the forming of the first mask pattern is performed through etching of the first photoresist layer.

3. The method of claim 1, further comprising:

forming a preliminary first lower inorganic encapsulation layer on the first cathode and the conductive partition after the depositing of the first conductive material and before the forming of the first mask pattern; and patterning the preliminary first lower inorganic encapsulation layer by the first mask pattern to form a first lower inorganic encapsulation pattern, which overlaps the first light-emitting opening in a plan view, from the preliminary first lower inorganic encapsulation layer after the forming of the first mask pattern and before the etching of the first dummy layer.

4. The method of claim 1, further comprising:

after the depositing of the second conductive material to form the first conductive layer:

forming a first conductive opening in the first conductive layer;

forming a second partition opening corresponding to the first conductive opening in the conductive partition;

forming a second light-emitting opening corresponding to the second partition opening in the pixel defining layer;

depositing a second organic material to form a second light-emitting pattern at least partially disposed in the second light-emitting opening and the second partition opening and a second dummy layer spaced apart from the second light-emitting pattern and disposed on the conductive partition;

depositing the first conductive material to form a second cathode at least partially disposed in the second partition opening;

forming a second mask pattern, overlapping the second light-emitting opening in a plan view and comprises the second conductive material, on the conductive partition;

patterning the second dummy layer by the second mask pattern to form a second dummy pattern from the second dummy layer; and depositing the second conductive material to form a second conductive layer from the first conductive layer and the second mask pattern, wherein in the providing of the preliminary display panel, the preliminary display panel further comprises a second anode spaced apart from the first anode, in the forming of the first conductive opening, the first conductive opening overlaps the second anode in a plan view, and in the depositing of the second conductive material to form the second conductive layer, the second conductive layer covers an outer side surface of the second dummy pattern.

5. The method of claim 4, wherein the forming of the second partition opening in the conductive partition comprises:

etching the conductive partition by dry etching to form a preliminary second partition opening overlapping the second anode in a plan view; and etching the conductive partition by wet etching to form the second partition opening from the preliminary second partition opening.

6. The method of claim 4, wherein in the providing of the preliminary display panel, a preliminary second partition opening overlapping the second anode in a plan view is further defined in the preliminary conductive partition; and in the forming of the second partition opening in the conductive partition, the conductive partition is etched by wet etching.

7. The method of claim 4, wherein the second mask pattern overlaps the first conductive layer in a plan view.

8. The method of claim 7, wherein the second conductive layer comprises:

a first portion disposed on the second dummy pattern;

a second portion disposed between the conductive partition and the second dummy pattern; and a third portion connecting the first portion and the second portion to each other and covering the outer side surface of the second dummy pattern.

9. The method of claim 4, wherein the second mask pattern does not overlap the first conductive layer in a plan view, and the second dummy pattern entirely contacts an upper surface of the conductive partition.

10. The method of claim 4, wherein in the providing of the preliminary display panel, the preliminary display panel further comprises a first sacrificial pattern disposed on the first anode and including a first sacrificial opening and a second sacrificial pattern disposed on the second anode, and the method further comprises:

forming a second photoresist layer including a first photoresist opening and overlapping the second anode in a plan view, on the first conductive layer after the depositing of the second conductive material to form the first conductive layer and before the forming of the first conductive opening in the first conductive layer;

forming a second sacrificial opening corresponding to the second light-emitting opening in the second sacrificial pattern after the forming of the second light-emitting opening in the pixel defining layer and before the depositing of the second organic material; and removing the second photoresist layer after the forming of the second sacrificial opening and before the depositing of the second organic material.

11. The method of claim 4, further comprising:

forming a third photoresist layer overlapping the second light-emitting opening in a plan view after the depositing of the first conductive material to form the second cathode and before the forming of the second mask pattern; and removing the third photoresist layer after the forming of the second mask pattern and before the patterning of the second dummy layer, wherein the forming of the second mask pattern is performed through etching using the third photoresist layer.

12. The method of claim 4, further comprising:

after the depositing of the second conductive material to form the second conductive layer:

forming a second conductive opening in the second conductive layer;

forming a third partition opening corresponding to the second conductive opening in the conductive partition;

forming a third light-emitting opening corresponding to the third partition opening in the pixel defining layer;

etching the second conductive layer;

depositing a third organic material to form a third light-emitting pattern at least partially disposed in the third light-emitting opening and the third partition opening and a third dummy layer spaced apart from the third light-emitting pattern and disposed on the conductive partition;

depositing the first conductive material to form a third cathode at least partially disposed in the third partition opening;

forming a third mask pattern, which overlaps the third light-emitting opening in a plan view and comprises the second conductive material, on the conductive partition;

patterning the third dummy layer by using the third mask pattern to form a third dummy pattern from the third dummy layer; and removing the third mask pattern, wherein in the providing of the preliminary display panel, the preliminary display panel further comprises a third anode spaced apart from the first anode and the second anode, and in the forming of the second conductive opening, the second conductive opening overlaps the third anode in a plan view.

13. The method of claim 12, wherein in the depositing of the second conductive material to form the second conductive layer, the second conductive layer comprises a first portion disposed on the second dummy pattern, a second portion disposed between the conductive partition and the second dummy pattern, and a third portion connecting the first portion to the second portion and covering the outer side surface of the second dummy pattern, and in the etching of the second conductive layer, the second portion and the third portion are removed, and a conductive pattern is formed from a remaining first portion.

14. The method of claim 13, wherein the conductive pattern surrounds the second light-emitting opening and has a substantially closed-line shape in a plan view.

15. The method of claim 13, wherein, a portion of the conductive pattern is removed together in the removing of the third mask pattern, the outer side surface of the conductive pattern is disposed closer to a center of the second anode than an outer side surface of the second dummy pattern.

16. The method of claim 12, wherein, in the etching of the second conductive layer, the second conductive layer is entirely removed.

17. The method of claim 12, wherein in the providing of the preliminary display panel, the preliminary display panel further comprises a third sacrificial pattern disposed on the third anode, and in the etching of the second conductive layer, a third sacrificial opening corresponding to the third light-emitting opening is formed in the third sacrificial pattern.

18. The method of claim 12, further comprising:

forming a fourth photoresist layer including a second photoresist opening and overlapping the third anode in a plan view after the depositing of the second conductive material and before the forming of a second conductive opening in the second conductive layer; and removing the fourth photoresist layer after the forming of the third light-emitting opening in the pixel defining layer and before the etching of the second conductive layer.

19. The method of claim 12, further comprising:

forming a fifth photoresist layer overlapping the third light-emitting opening in a plan view after the depositing of the first conductive material to form the third cathode and before the forming of the third mask pattern; and removing the fifth photoresist layer after the forming of the third mask pattern and before the etching of the third dummy layer, wherein the forming of the third mask pattern is performed through etching using the fifth photoresist layer.

20. The method of claim 1, further comprising:

prior to the providing of the preliminary display panel:

forming a preliminary first partition opening in the preliminary conductive partition layer by dry-etching a preliminary conductive partition layer comprising sequentially stacked a first layer and a second layer; and forming the first partition opening from the preliminary first partition opening by wet-etching the first layer and the second layer to form the conductive partition from the preliminary conductive partition layer, wherein an inner side surface of the second layer defining the second region of the first partition opening is closer to the center of the first anode than an inner side surface of the first layer defining the first region of the first partition opening.

21. The method of claim 20, wherein the preliminary display panel further comprises a second anode disposed above the base layer, and in the forming of the preliminary first partition opening in the preliminary conductive partition layer, a preliminary second partition opening overlapping the second anode in a plan view is formed together in the preliminary conductive partition layer.

22. The method of claim 1, wherein the second conductive material comprises a transparent conductive oxide.

* * * * *